United States Patent
Bauder et al.

(10) Patent No.: US 9,042,275 B2
(45) Date of Patent: May 26, 2015

(54) TUNABLE DUPLEXER ARCHITECTURE

(71) Applicant: RF Micro Devices, Inc., Greensboro, NC (US)

(72) Inventors: Ruediger Bauder, Feldkirchen-Westerham (DE); Marcus Granger-Jones, Scotts Valley, CA (US); Nadim Khlat, Miki-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 19 days.

(21) Appl. No.: 13/760,159

(22) Filed: Feb. 6, 2013

(65) Prior Publication Data
US 2013/0201880 A1     Aug. 8, 2013

Related U.S. Application Data

(60) Provisional application No. 61/595,795, filed on Feb. 7, 2012.

(51) Int. Cl.
| | |
|---|---|
| *H04L 5/14* | (2006.01) |
| *H03H 7/48* | (2006.01) |
| *H04L 25/03* | (2006.01) |

(52) U.S. Cl.
CPC .. *H04L 5/14* (2013.01); *H03H 7/48* (2013.01); *H04L 25/03878* (2013.01); *H04B 1/525* (2013.01)

(58) Field of Classification Search
CPC ........... H03H 7/48; H03H 7/09; H04B 1/525; H04B 10/25753; H04B 10/2575; H04B 10/25754; H04B 10/25756
See application file for complete search history.

(56) References Cited

U.S. PATENT DOCUMENTS

| | | | |
|---|---|---|---|
| 3,593,208 A | 7/1971 | Smith | |
| 4,216,446 A | 8/1980 | Iwer | |
| 5,180,999 A | 1/1993 | Edwards | |
| 6,484,012 B1 | 11/2002 | Nche et al. | |
| 6,924,715 B2 | 8/2005 | Beaudin et al. | |
| 7,394,333 B2 | 7/2008 | Ezzeddine et al. | |
| 7,741,929 B2 | 6/2010 | Hash | |
| 7,821,355 B2 | 10/2010 | Engel | |
| 7,863,998 B2 | 1/2011 | Rofougaran | |
| 8,243,855 B2 | 8/2012 | Zarei | |

(Continued)

OTHER PUBLICATIONS

Non-Final Office Action for U.S. Appl. No. 13/633,459, mailed Jun. 26, 2014, 28 pages.

(Continued)

*Primary Examiner* — Fan Ng
(74) *Attorney, Agent, or Firm* — Withrow & Terranova, P.L.L.C.

(57) ABSTRACT

A tunable radio frequency (RF) duplexer is disclosed. The tunable RF duplexer includes a first hybrid coupler, a second hybrid coupler, and an RF filter circuit. The first hybrid coupler is operable to split an RF receive input signal into first and second RF quadrature hybrid receive signals (QHRSs). The first hybrid coupler is also operable to split an RF transmission input signal into first and second RF quadrature hybrid transmission signals (QHTSs). The RF filter circuit is operable to pass the first and second RF QHRSs to the second hybrid coupler and to reflect the first and second RF QHTSs back to the first hybrid coupler. Additionally, the second hybrid coupler is configured to combine the first and second RF QHRSs into an RF receive output signal, while the first hybrid coupler is configured to combine the first and second RF QHTSs into an RF transmission output signal.

25 Claims, 30 Drawing Sheets

(56) References Cited

U.S. PATENT DOCUMENTS

| | | | |
|---|---|---|---|
| 8,718,582 | B2 | 5/2014 | See et al. |
| 2002/0136193 | A1* | 9/2002 | Chang et al. ............ 370/347 |
| 2004/0008082 | A1 | 1/2004 | Dow |
| 2004/0127172 | A1 | 7/2004 | Gierkink et al. |
| 2006/0071714 | A1 | 4/2006 | Ramaswamy et al. |
| 2007/0207748 | A1 | 9/2007 | Toncich |
| 2008/0219389 | A1 | 9/2008 | Nisbet |
| 2008/0290947 | A1 | 11/2008 | Dawe |
| 2009/0221259 | A1 | 9/2009 | Shiramizu et al. |
| 2009/0251618 | A1 | 10/2009 | Gao et al. |
| 2009/0279642 | A1 | 11/2009 | Zarei |
| 2011/0008042 | A1* | 1/2011 | Stewart ..................... 398/42 |
| 2011/0043270 | A1 | 2/2011 | Kusuda |
| 2012/0119842 | A1 | 5/2012 | Gu et al. |
| 2012/0235735 | A1 | 9/2012 | Spits et al. |
| 2013/0028360 | A1 | 1/2013 | Rofougaran et al. |
| 2013/0083703 | A1* | 4/2013 | Granger-Jones et al. ..... 370/277 |
| 2013/0115998 | A1* | 5/2013 | Lamm et al. ............ 455/522 |
| 2013/0165067 | A1 | 6/2013 | DeVries et al. |
| 2013/0201882 | A1* | 8/2013 | Bauder et al. ............ 370/277 |
| 2013/0273860 | A1 | 10/2013 | Pehlke |
| 2014/0192727 | A1* | 7/2014 | Liu et al. ................. 370/329 |
| 2014/0288723 | A1* | 9/2014 | Persson .................... 700/297 |

OTHER PUBLICATIONS

Non-Final Office Action for U.S. Appl. No. 13/760,201, mailed Aug. 28, 2014, 9 pages.

Non-Final Office Action for U.S. Appl. No. 13/760,240, mailed Aug. 27, 2014, 13 pages.

Andrews, David, "Chapter 5: Practical Design," Lumped Element Quadrature Hybrids, Copyright: 2006, pp. 129-135, Artech House, Inc., Norwood, Massachusetts.

Fisher, R.E., "Broad-Band Twisted-Wire Quadrature Hybrids," IEEE Transactions on Microwave Theory and Techniques, vol. 21, Issue 5, May 1973, pp. 355-357.

Monteath, G.D., "Coupled Transmission Lines as Symmetrical Directional Couplers," Proceedings of the IEE—Part B: Radio and Electronic Engineering, vol. 102, Issue 3, May 1955, pp. 383-392.

Vizmuller, Peter, "Chapter 2: Circuit Examples," RF Design Guide: Systems, Circuits, and Equations, Copyright: 1995, pp. 95-98, Artech House, Inc., Norwood, Massachusetts.

Zybura, Michael F. et al., "Combined Balun Transformer and Harmonic Filter," U.S. Appl. No. 61/555,311, filed Nov. 3, 2011, 9 pages.

Rizzi, Peter A., "Chapter 9: Some Filter and Resonator Applications," Microwave Engineering: Passive Circuits, Copyright: 1988, pp. 504-507, Prentice-Hall, Englewood Cliffs, New Jersey.

Wen, Jiguo et al., "Suppression of Reflection Coefficients of Surface Acoustic Wave Filters Using Quadrature Hybrids," IEEE Transactions on Ultrasonics, Ferroelectrics, and Frequency Control, vol. 53, No. 10, Oct. 2006, pp. 1912-1917.

Young, Leo et al., "A High Power Diplexing Filter," IRE Transactions on Microwave Theory and Techniques, Jul. 1959, pp. 384-387.

Andrews, David, "Chapter 4: Passive Synthesis," Lumped Element Quadrature Hybrids, Copyright: 2006, pp. 79-81, Artech House, Inc., Norwood, Massachusetts.

Notice of Allowance for U.S. Appl. No. 13/633,459, mailed Jan. 13, 2015, 11 pages.

Non-Final Office Action for U.S. Appl. No. 13/925,891, mailed Jan. 16, 2015, 10 pages.

Notice of Allowance for U.S. Appl. No. 13/760,201, mailed Feb. 27, 2015, 8 pages.

Notice of Allowance for U.S. Appl. No. 13/760,240, mailed Mar. 4, 2015, 8 pages.

Final Office Action for U.S. Appl. No. 13/633,459, mailed Oct. 17, 2014, 23 pages.

* cited by examiner

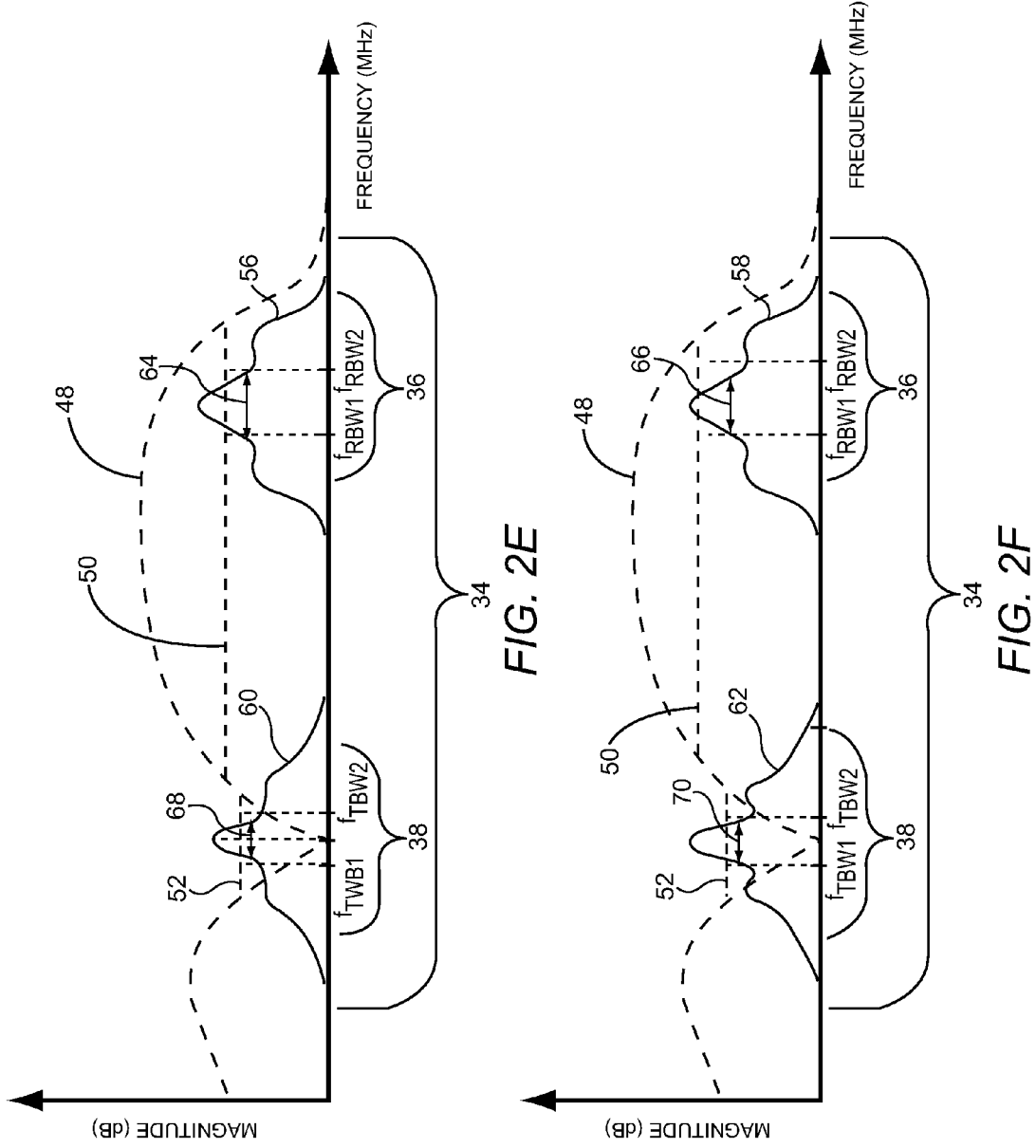

TUNABLE DUPLEXER ARCHITECTURE

RELATED APPLICATIONS

This application claims the benefit of U.S. Provisional Patent Application Ser. No. 61/595,795, filed on Feb. 7, 2012 and entitled "TUNABLE DUPLEXER," the disclosure of which is hereby incorporated herein by reference in its entirety.

The application is also related to U.S. patent application Ser. No. 13/633,459, filed on Oct. 2, 2012 and entitled "TUNABLE DUPLEXER ARCHITECTURE," which claims the benefit of U.S. provisional patent application No. 61/542,939, filed on Oct. 4, 2011 and entitled "TUNABLE DUPLEXER ARCHITECTURE," the disclosures of which are hereby incorporated herein by reference in their entireties.

FIELD OF THE DISCLOSURE

This disclosure relates generally to radio frequency (RF) duplexers and duplexing methods related to RF front-end modules.

BACKGROUND

A duplexer is a device that facilitates bi-directional communication (i.e., simultaneous reception and emission) by a common antenna. In order to facilitate simultaneous reception and emission of signals over the antenna, the duplexer needs to be designed for operation at both receive and transmission bands while providing adequate isolation between receive and transmission signals. To provide multi-mode and multi-band operation, radio frequency (RF) duplexers often use multiple parallel duplexer components selected using an ever-growing number of switches. As such, this type of RF duplexer solution presents ever-increasing demands with regard to cost and size.

Accordingly, more adaptable RF duplexers are needed to provide multi-band/multi-mode operations that do not require increases in cost and size.

SUMMARY

Embodiments of a tunable radio frequency (RF) duplexer and methods of duplexing receive and transmission signals are disclosed. In one embodiment, an RF receive input signal may be intercepted by an antenna. The RF receive input signal is split into a first RF quadrature hybrid receive signal (QHRS) and a second RF QHRS. The first RF QHRS and the second RF QHRS are filtered to pass the first RF QHRS and the second RF QHRS within a passband. The first RF QHRS and the second RF QHRS within the passband are then combined into an RF receive output signal. In this manner, the RF receive output signal may be provided to a downstream receive chain by the tunable RF duplexer while the tunable RF duplexer simultaneously receives an RF transmission input signal from the antenna.

With regard to the RF transmission input signal from the upstream transmission chain, the RF transmission input signal is split into a first RF quadrature hybrid transmission signal (QHTS) and a second RF QHTS. The first RF QHTS and the second RF QHTS are filtered to reflect the first RF QHRS and the second RF QHRS within a stopband. The first RF QHTS and the second RF QHTS are combined within the stopband into an RF transmission output signal. In this manner, the RF transmission output signal may be provided to the same antenna for emission.

In one embodiment of the tunable RF duplexer, the tunable RF duplexer includes a first hybrid coupler, a second hybrid coupler, and an RF filter circuit. The first hybrid coupler is operable to split the RF receive input signal intercepted by the antenna into the first RF QHRS and the second RF QHRS. The RF filter circuit is operable to pass the first RF QHRS and the second RF QHRS to the second hybrid coupler and to reflect the first RF QHTS and the second RF QHTS back to the first hybrid coupler. The second hybrid coupler is configured to combine the first RF QHRS and the second RF QHRS into the RF receive output signal, which may then be transmitted to the downstream receive chain. The first hybrid coupler is configured to combine the first RF QHTS and the second RF QHTS into the RF transmission output signal for emission by the antenna.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 2E is a frequency domain representation of one embodiment of a first RF quadrature hybrid receive signal (QHRS) provided by splitting the RF receive input signal, and a first RF quadrature hybrid transmission signal (QHTS) provided by splitting the RF transmission input signal.

FIG. 2F is a frequency domain representation of one embodiment of a second RF QHRS provided by splitting the RF receive input signal and a second RF QHTS provided by splitting the RF transmission input signal.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
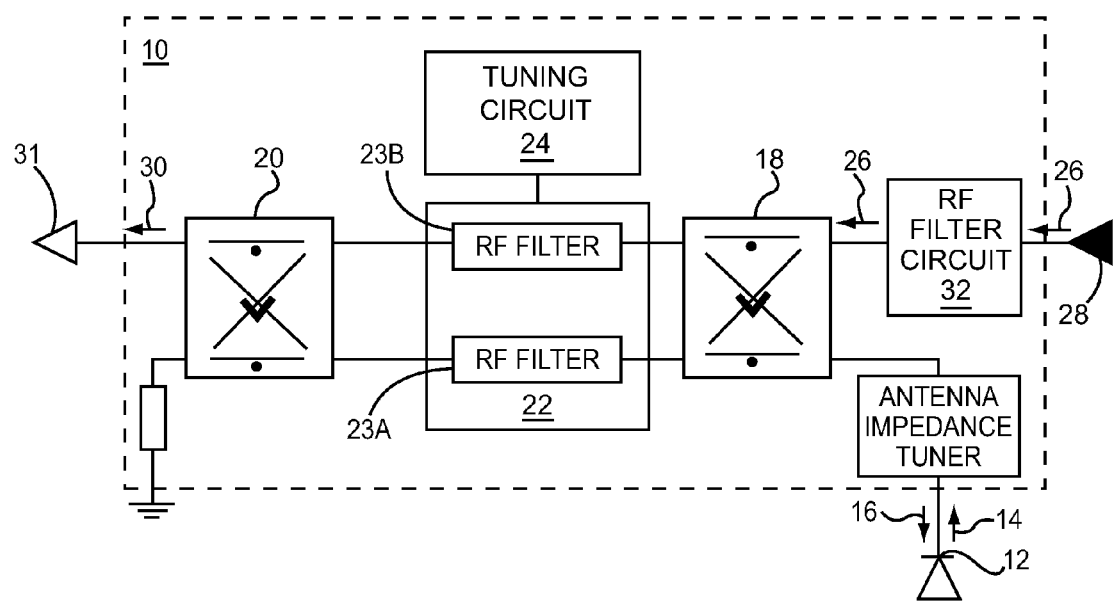
FIG. 1 illustrates one embodiment of a tunable radio frequency (RF) duplexer.

FIG. 1 illustrates an embodiment of a tunable radio frequency (RF) duplexer 10. An antenna 12 is operably associated with the tunable RF duplexer 10 and is capable of radiating RF receive signals and absorbing radiated RF transmission signals. In order to prevent out-of-band noise and spurious emissions from distorting RF transmission and receive signals, the tunable RF duplexer 10 provides isolation between RF receive signals and RF transmission signals, as well as out-of-band filtering. Accordingly, the tunable RF duplexer 10 allows for an RF receive input signal 14 to be intercepted by the antenna 12 while simultaneously emitting an RF transmission output signal 16 from the antenna 12.

In this embodiment, the tunable RF duplexer 10 includes a first hybrid coupler 18, a second hybrid coupler 20, an RF filter circuit 22, and a tuning circuit 24. The RF filter circuit 22 includes an RF filter 23A across its bottom ports and an RF filter 23B across its top ports. Thus, the RF filter circuit 22 is a four-port network. However, the RF filter 23A and the RF filter 23B are independent of one another and each of the RF filters 23A, 23B operates as a two-port network. Also, the RF filter 23A and the RF filter 23B may be identical, and thus may each have the same individual frequency response.

The first hybrid coupler 18 is operable to receive an RF transmission input signal 26 from upstream RF circuitry. For example, the RF transmission input signal 26 is received from a power amplifier 28 upstream from the tunable RF duplexer 10. The RF transmission output signal 16 is provided by the first hybrid coupler 18 at the antenna 12. An RF receive output signal 30 is transmitted by the second hybrid coupler 20 to a low noise amplifier (LNA) 31. Prior to the first hybrid coupler 18 receiving the RF transmission input signal 26, the RF transmission input signal 26 is filtered by a second RF filter circuit 32 to remove spurious emissions. As explained in further detail below, the first hybrid coupler 18, the RF filter circuit 22, and the second hybrid coupler 20 provide the appropriate isolation between transmission and receive.

Figure 2:
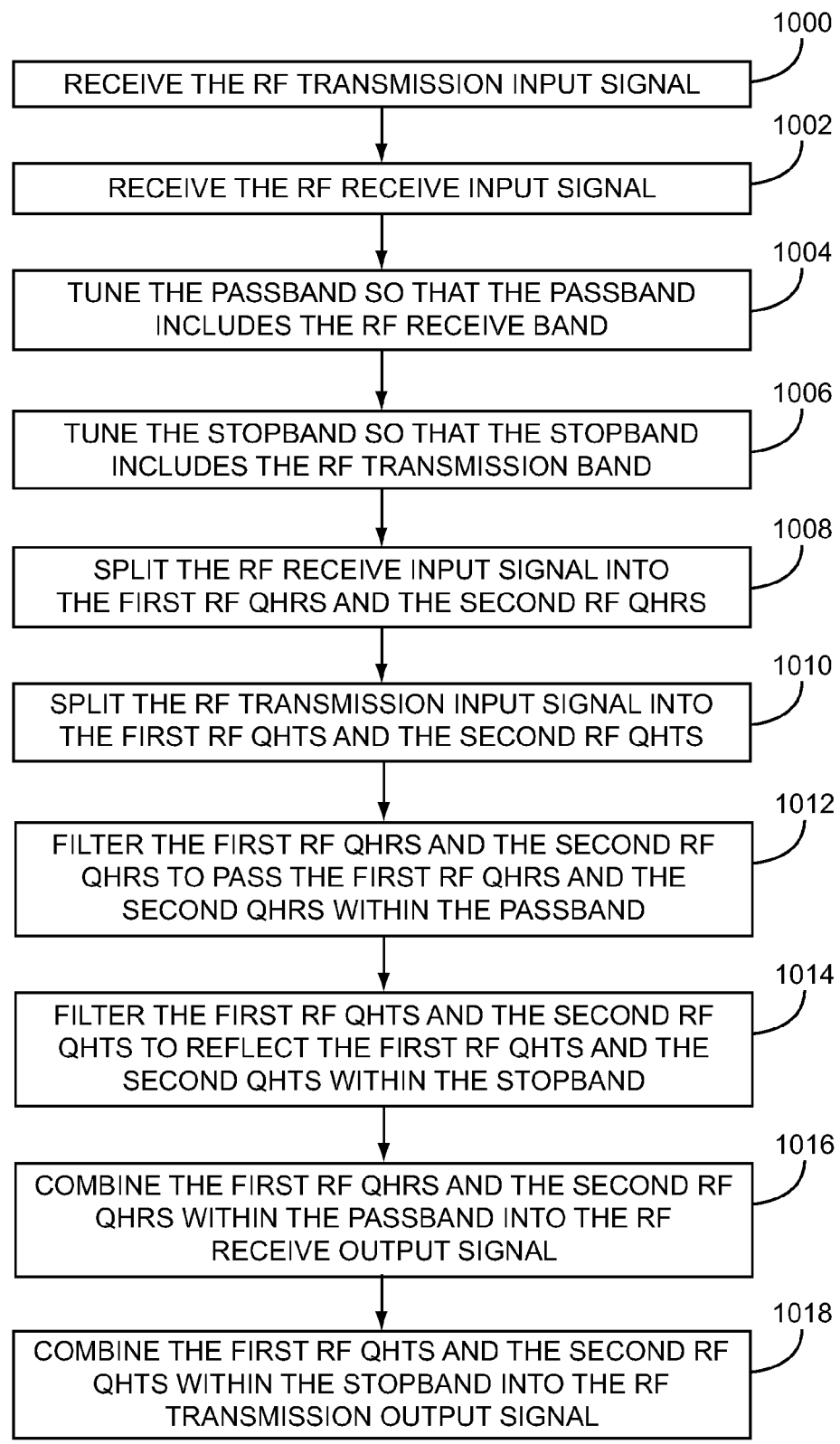
FIG. 2 illustrates exemplary procedures that may be implemented by the tunable RF duplexer shown in FIG. 1 so that the tunable RF duplexer may simultaneously receive an RF receive input signal from an upstream receive chain while transmitting an RF transmission output signal to an antenna, and may receive an RF transmission input signal from a downstream transmission chain while providing an RF transmission output signal to the same antenna.

FIG. 2 illustrates exemplary procedures that may be implemented to provide RF duplexing. As explained in further detail below, the procedures described in FIG. 2 are implemented by the tunable RF duplexer 10 shown in FIG. 1. Different embodiments of these exemplary procedures may be implemented depending on a particular component structure of a tunable RF duplexer 10. Furthermore, the order in which the procedures are presented is not intended to imply a required sequence for the procedures. Rather, the procedures may be implemented in a different sequence and/or some or all of the procedures may be implemented simultaneously.

As shown in FIG. 2, the tunable RF duplexer 10 receives the RF transmission input signal 26 from an upstream transceiver chain (procedure 1000). For example, the RF transmission input signal 26 is received by the tunable RF duplexer 10 from the power amplifier 28. The power amplifier 28 transfers power into the RF transmission input signal 26 so that the RF transmission output signal 16 has a sufficiently high spectral density for external propagation from the antenna 12. Additionally, the tunable RF duplexer 10 receives the RF receive input signal 14 (procedure 1002). The RF receive input signal 14 was initially intercepted by the antenna 12.

Figure 2A:
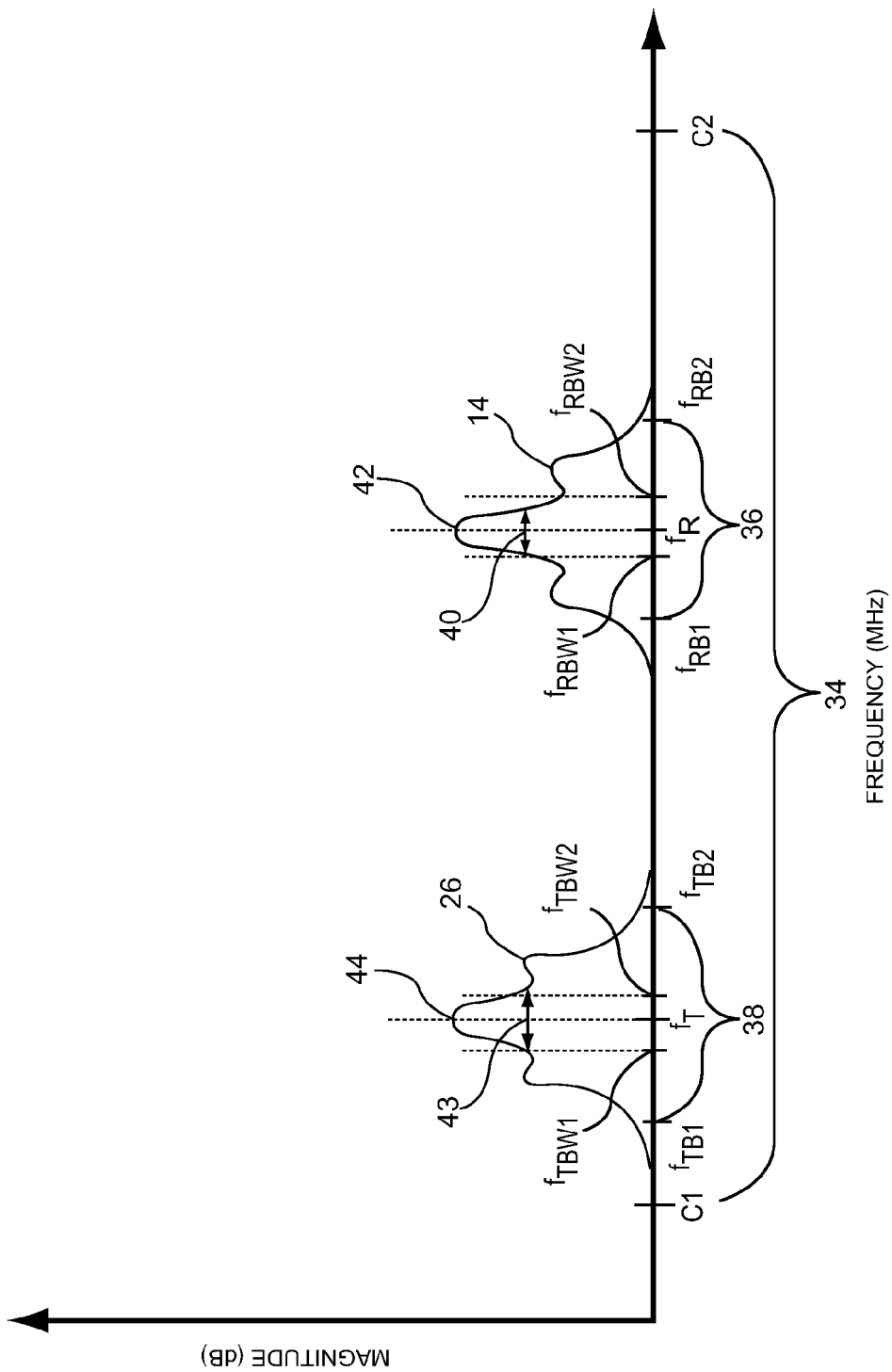
FIG. 2A is a frequency domain representation of one embodiment of an RF transmission input signal that operates within an RF transmission band and an RF receive output signal that operates within an RF receive band.

FIG. 2A illustrates a graph of one embodiment of the RF receive input signal 14 and the RF transmission input signal 26 in the frequency domain. Both the RF receive input signal 14 and the RF transmission input signal 26 operate in an RF communication band 34. In this embodiment, the RF communication band 34 is the set of frequencies between a cutoff frequency C1 and a cutoff frequency C2. Additionally, an RF receive band 36 and an RF transmission band 38 are defined within the RF communication band 34. The RF transmission band 38 is defined as the set of frequencies between a cutoff frequency $f_{TB1}$ and a cutoff frequency $f_{TB2}$. Similarly, the RF receive band 36 is defined as the set of frequencies between a cutoff frequency $f_{RB1}$ and a cutoff frequency $f_{RB2}$. The RF receive input signal 14 operates in the RF receive band 36 of the RF communication band 34.

In this example, a signal bandwidth 40 of the RF receive input signal 14 is the set of frequencies that correspond to the portion of the RF receive input signal 14 within 3 dB of a maximum magnitude 42. The RF receive input signal 14 shown in FIG. 2A operates at a frequency $f_R$. This frequency $f_R$ corresponds to the maximum magnitude 42 of the RF receive input signal 14. For example, the frequency $f_R$ may be a carrier frequency of the RF receive input signal 14. The signal bandwidth 40 reaches a cutoff frequency $f_{RBW1}$, since the frequency $f_{RBW1}$ corresponds to a value of the RF receive input signal 14 that is 3 dB from the maximum magnitude 42. The signal bandwidth 40 also reaches a cutoff frequency $f_{RBW2}$, because the cutoff frequency $f_{RBW2}$ corresponds to a value of the RF receive input signal 14 that is 3 dB from the maximum magnitude 42.

With regard to the RF transmission input signal 26, the RF transmission input signal 26 operates in the RF transmission band 38. More specifically, a signal bandwidth 43 of the RF transmission input signal 26 is within the RF transmission band 38. A maximum magnitude 44 of the RF transmission input signal 26 is placed at the frequency $f_T$. A cutoff frequency $f_{RBW1}$ of the signal bandwidth 43 corresponds to a value of the RF transmission input signal 26 at 3 dB from the maximum magnitude 44. Similarly, a cutoff frequency $f_{TBW2}$ corresponds to a value of the RF transmission input signal 26 that is 3 dB from the maximum magnitude 44. The RF transmission input signal 26 may be said to operate at the frequency $f_T$ since the frequency $f_T$ is a carrier or a center frequency.

Portions of the RF receive input signal 14 and the RF transmission input signal 26 outside of their respective signal bandwidths 40, 43 may be considered spurious emissions. In other words, the portions of the RF receive input signal 14 and the RF transmission input signal 26 may be reduced or eliminated without affecting the corresponding information or data in the RF transmission input signal 26 and the RF receive input signal 14. Spurious emissions include parasitic emissions, intermodulation, interference, harmonic emissions, and frequency conversion products. The signal bandwidth 40 and the signal bandwidth 43 are defined as 3 dB bandwidths for pragmatic purposes. Generally speaking, at least for the types of signals being shown in FIG. 2A, the signal bandwidths 40, 43 are measured by finding 3 dB magnitudes from the maximum magnitudes 42, 44, as explained above. However, more accurately, a necessary signal bandwidth is an exact amount of signal bandwidth required to carry the information or data of a signal. Anything outside of this necessary bandwidth would be considered spurious emissions. Thus, the signal bandwidth 40 and the signal bandwidth 43 may or may not include a small portion of the spurious emissions. The necessary signal bandwidths may be slightly smaller or slightly greater than the signal bandwidths 40 and 43.

Finally, it should be noted that the RF receive input signal 14 and the RF transmission input signal 26 shown in FIG. 2A are each narrow-band signals. Accordingly, the RF receive input signal 14 and the RF transmission input signal 26 may represent time division multiplexing (TDM) signals, frequency division multiplexing (FDM) signals, space division multiplexing (SDM) signals, and/or the like. Accordingly, these narrow-band signals may be said to operate at a particular frequency, which for the RF receive input signal 14 is the frequency $f_R$ and for the RF transmission input signal 26 is the frequency $f_T$. The RF receive band 36 is thus an RF receive channel within the RF communication band 34, while the RF transmission band 38 is an RF transmission channel within the RF communication band 34.

However, this disclosure is not limited to narrow-band signals and the examples given in FIG. 2A and throughout this disclosure are not intended to be limited in this manner. Rather, embodiments of the tunable RF duplexer 10 and the method shown in FIG. 2 may be provided for wide-band signals, and also for both wide-band and narrow-band signals. With wide-band signals, such as orthogonal frequency division multiple access (OFDMA) signals or code division multiple access (CDMA) signals, information or data is coded and spread across a larger portion of the spectrum. Thus, there would be no signal with a single carrier frequency that has all of the information or data, but rather there may be various carriers carrying different coded portions of the information. As such, the RF transmission band 38 for this type of RF transmission input signal 26 may include various RF transmission channels. Similarly, the RF receive band 36 may include various RF receive channels. With CDMA signals and other wide-band spectrum signals, it is more practical to define the bandwidths by simply using the necessary bandwidth, as is known in the art.

Figure 2B:
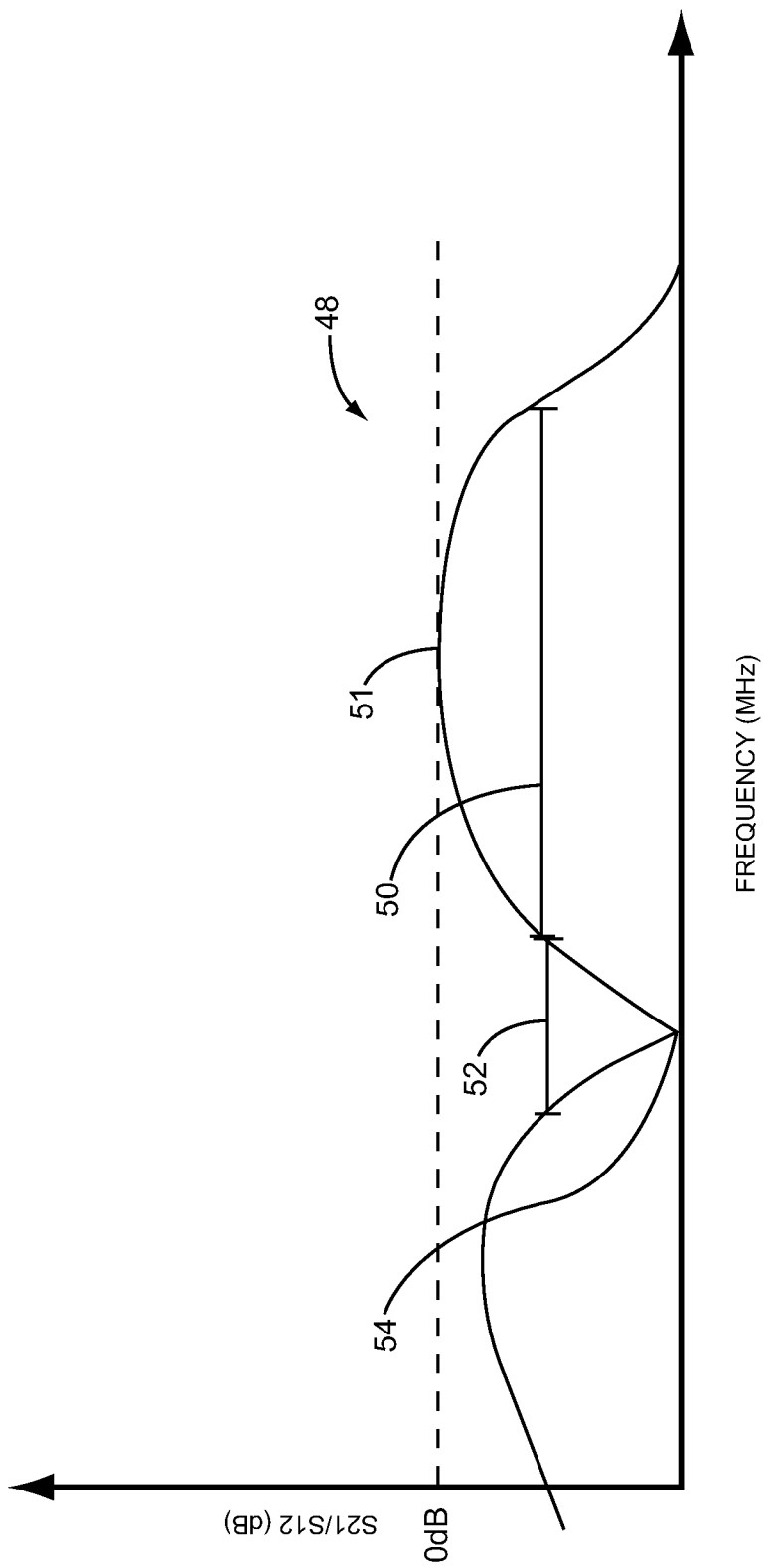
FIG. 2B is a frequency domain representation of a frequency response as S21 and S12 parameters provided by an RF filter circuit in the tunable RF duplexer shown in FIG. 1, wherein the frequency response defines a passband and a stopband.

FIG. 2B illustrates one embodiment of a frequency response 48 provided by the RF filter circuit 22. In FIG. 2B, the frequency response 48 represents S21 and S12 parameters of each of the RF filters 23A, 23B (shown in FIG. 1) individually, as a function of frequency. Thus, the two-port S21 and S12 parameter of the RF filter 23A is represented by the frequency response 48 in FIG. 2B. Since the RF filter 23B is identical to the RF filter 23A, the two-port S21 and S12 parameter of the RF filter 23B is also represented by the frequency response 48 in FIG. 2B. The two-port S21 and S12 parameter represents the forward and reverse transmission of the RF filters 23A, 23B, as a function of frequency. A passband 50 corresponds to S21/S12 values in the frequency response 48 that are within 3 dB of a maxima 51. A stopband 52 is determined relative to a minima 54. The maxima 51 and the minima 54 are set by the poles and zeros of the frequency response 48. The stopband 52 is a set of frequencies that correspond to S21/S12 values within 3 dB of the minima 54. In this embodiment, the frequency response 48 defines the stopband 52 as a notch. As explained in further detail below, the RF filter circuit 22 is tunable so as to shift the passband 50 and the stopband 52. Thus, by tuning the RF filter circuit 22, the frequency response 48 may be transposed, so that the passband 50 and the stopband 52 are provided at the desired frequency bands.

Figure 2C:
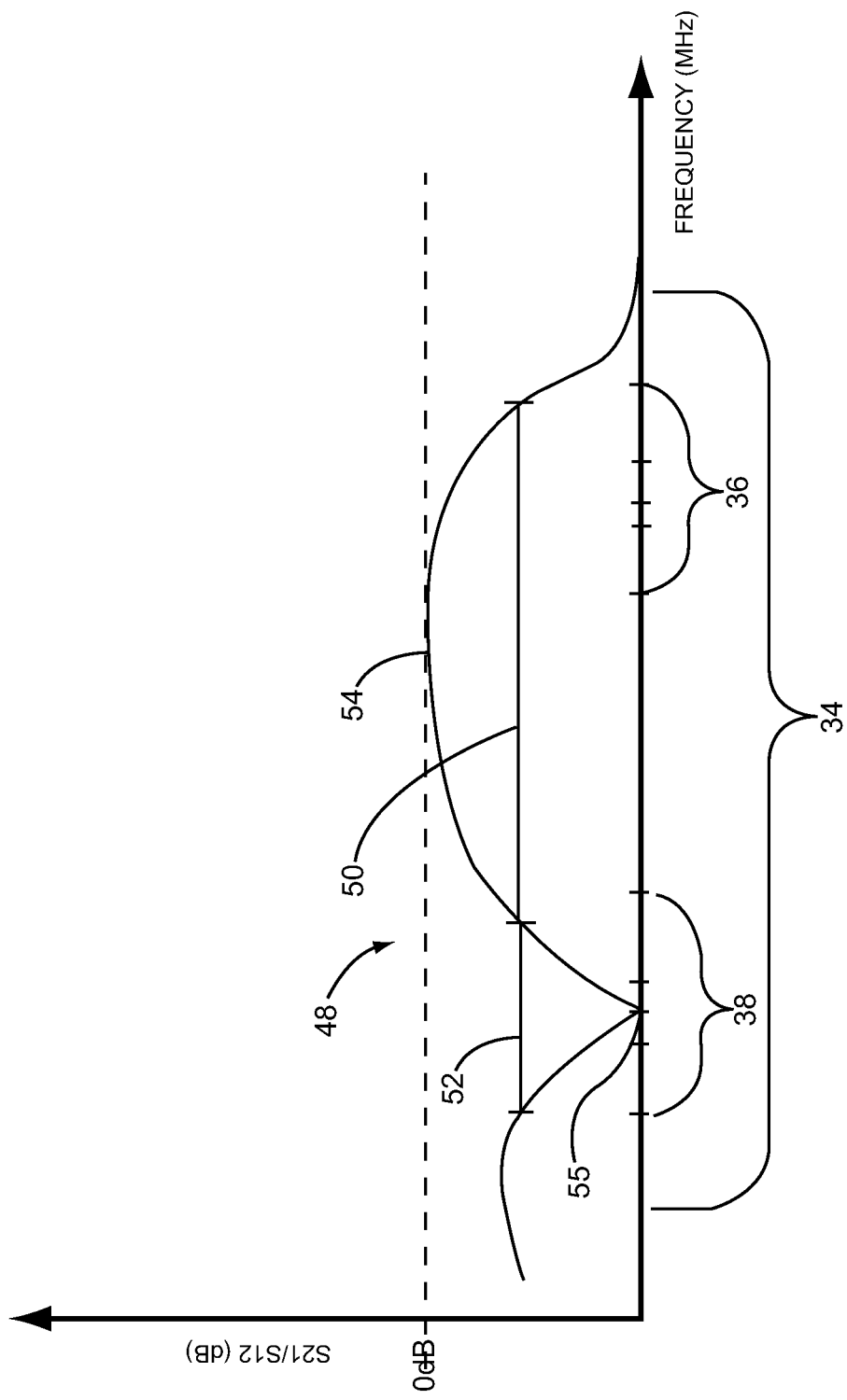
FIG. 2C illustrates the frequency response shown in FIG. 2B after the passband has been shifted to include the RF receive band shown in FIG. 2A and the stopband has been shifted to include the RF transmission band shown in FIG. 2A.

FIG. 2C illustrates the frequency response 48 once the passband 50 is shifted to include the RF receive band 36, and once the stopband 52 is shifted to include the RF transmission band 38. As shown in FIG. 2C, the tuning circuit 24 tunes the passband 50 so that the passband 50 includes the RF receive band 36 (procedure 1004). The tuning circuit 24 may also tune the stopband 52 so that the stopband 52 includes the RF transmission band 38 (procedure 1006). In this manner, signals that operate in the RF receive band 36 are passed by the RF filter circuit 22, while signals that operate in the RF transmission band 38 are blocked by the RF filter circuit 22.

Figure 2D:
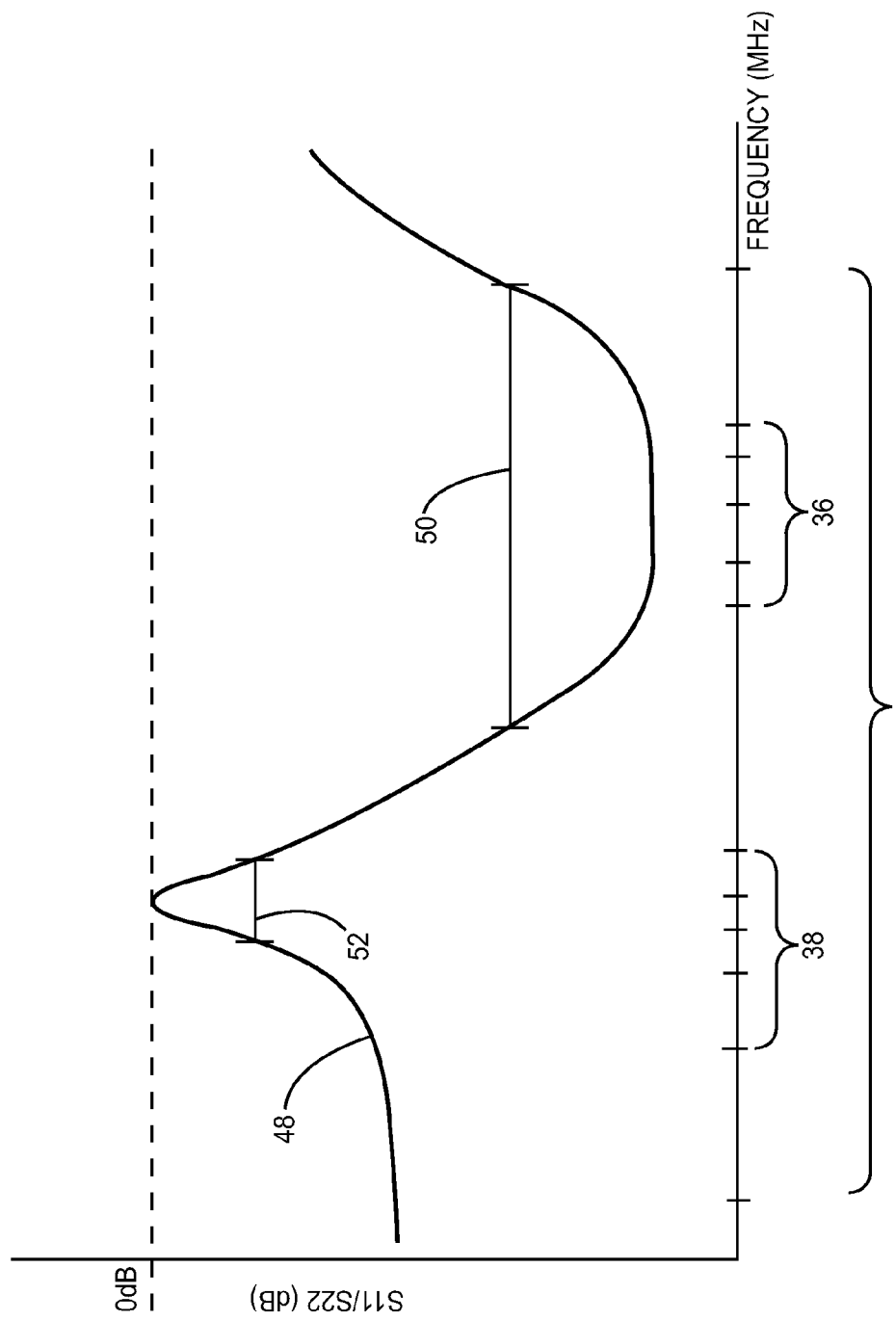
FIG. 2D illustrates the frequency response of the RF filter circuit as S11 and S22 parameters.

FIG. 2D illustrates the frequency response 48 once the passband 50 is shifted to include the RF receive band 36, and once the stopband 52 is shifted to include the RF transmission band 38. However, in FIG. 2D, the frequency response 48 represents S11 and S22 parameters of each of the RF filters 23A, 23B (shown in FIG. 1) individually, as a function of frequency. Thus, the two-port S11 and S22 parameter of the RF filter 23A is represented by the frequency response 48 in FIG. 2D. Since the RF filter 23B is identical to the RF filter 23A, the two-port S11 and S22 parameter of the RF filter 23B is also represented by the frequency response 48 in FIG. 2D. The two-port S11 and S22 parameter represents the forward and reverse return loss of the RF filters 23A, 23B, as a function of frequency. Note that in this embodiment, the S11/S22 values of the stopband 52 are at or near zero (0) dB in the RF transmission band 38. By placing the stopband 52 at or near zero (0) dB, reflections in the stopband 52 are maximized, while insertion losses within the RF transmission band 38 are minimized. Filtering thus removes noise outside of the RF transmission band 38 while minimizing losses of reflected signals.

Referring now to FIGS. 2E and 2F, the RF receive input signal 14 is split into a first RF quadrature hybrid receive signal (QHRS) 56 and a second RF QHRS 58 (procedure 1008). As such, the first RF QHRS 56 is 90 degrees or $\pi/2$ radians out of phase with the second RF QHRS 58. Also, the RF transmission input signal 26 is also split into a first RF quadrature hybrid transmission signal (QHTS) 60 and a second RF QHTS 62 (procedure 1010). FIGS. 2E and 2F illustrate the first RF QHRS 56 and the second RF QHRS 58. The first RF QHRS 56 and the second RF QHRS 58 have substantially identical magnitude characteristics as the RF receive input signal 14. However, both the first RF QHRS 56 and the second RF QHRS 58 have a power spectral density that is at a power ratio with respect to the power spectral density of the RF receive input signal 14. In this example, the power ratio is 3 dB, and thus the first RF QHRS 56 and the second RF QHRS 58 have approximately one half of the power of the RF receive input signal 14. The first RF QHRS 56 and the second RF QHRS 58 are quadrature hybrids, since there is approximately a 90-degree or $\pi/2$ radians phase difference between the signals. As explained in further detail below, the first hybrid coupler 18 (FIG. 1) splits the RF receive input signal 14 into the first RF QHRS 56 and the second RF QHRS 58.

Of course, non-ideal characteristics of the tunable RF duplexer 10, such as parasitic impedances, may result in the first RF QHRS 56 and the second RF QHRS 58 to be slightly unbalanced with respect to one another, or to have slightly less than half the power of the RF receive input signal 14. Also, non-ideal characteristics can result in the phase difference between the first RF QHRS 56 and the second RF QHRS 58 fluctuating somewhat from a 90-degree or $\pi/2$ radians phase difference. These types of errors are acceptable so long as the first RF QHRS 56 and the second RF QHRS 58 can be combined into the RF receive output signal 30, such that the RF receive output signal 30 complies with spectrum requirements for the RF communication band 34.

Again referring to FIG. 2 and FIGS. 2E and 2F, the first hybrid coupler 18 (FIG. 1) splits the RF transmission input signal 26 into the first RF QHTS 60 and the second RF QHTS 62. Both the first RF QHTS 60 and the second RF QHTS 62 have substantially identical magnitude characteristics as the RF transmission input signal 26. However, a spectral density of the first RF QHTS 60 and the second RF QHTS 62 is at a power ratio with respect to a power spectral density of the RF transmission input signal 26. In this example, the power ratio is a 3 dB power ratio, and thus the first RF QHTS 60 and the second RF QHTS 62 are at about half power with respect to the RF transmission input signal 26. The first RF QHTS 60 and the second RF QHTS 62 are quadrature hybrids, because each has a 90-degree or $\pi/2$ radians phase difference with respect to the other. Non-ideal characteristics of the first hybrid coupler 18, such as parasitic impedances, may result in the first RF QHTS 60 and the second RF QHTS 62 having slightly lower power ratios with respect to the RF transmission input signal 26. These non-ideal characteristics may also result in the first RF QHTS 60 and the second RF QHTS 62 being slightly unbalanced. Furthermore, the phase difference between the first RF QHTS 60 and the second RF QHTS 62 may vary slightly due to non-ideal characteristics of the tunable RF duplexer 10. These variations in both power and magnitude are acceptable, so long as the first RF QHTS 60 and the second RF QHTS 62 can combine into the RF transmission output signal 16 and comply with spectral requirements for the RF communication band 34.

Since the RF receive input signal 14 is split into the first RF QHRS 56 and the second RF QHRS 58, both the first RF QHRS 56 and the second RF QHRS 58 operate in the RF receive band 36 of the RF communication band 34. As shown in FIGS. 2E and 2F, the frequency response 48 of the RF filter circuit 22 has been transposed so that the passband 50 and the stopband 52 are shifted into the RF communication band 34. More particularly, the passband 50 is shifted so that the RF receive band 36 is in the passband 50. When the first hybrid coupler 18 outputs the first RF QHRS 56 and the second RF QHRS 58, the RF filter circuit 22 filters the first RF QHRS 56 and the second RF QHRS 58 to pass the first RF QHRS 56 and the second RF QHRS 58 within the passband 50 (procedure 1012). Since the first RF QHRS 56 and the second RF QHRS 58 are within the passband 50, the RF filter circuit 22 is configured to pass the first RF QHRS 56 and the second RF QHRS 58 to the second hybrid coupler 20.

However, the stopband 52 has been shifted so that the RF transmission band 38 is in the stopband 52. When the second hybrid coupler 20 outputs the first RF QHTS 60 and the second RF QHTS 62, the RF filter circuit 22 filters the first RF QHTS 60 and the second RF QHTS 62 to reflect the first RF QHTS 60 and the second RF QHTS 62 within the stopband 52 (procedure 1014). The first RF QHTS 60 and the second RF QHTS 62 operate within the RF transmission band 38. Since the stopband 52 is in the RF transmission band 38, the RF filter circuit 22 has been tuned to block the first RF QHTS 60 and the second RF QHTS 62.

As shown in FIGS. 2E and 2F, the first RF QHRS 56 has a signal bandwidth 64 and the second RF QHRS 58 has a signal bandwidth 66. Although the first RF QHRS 56 and the second RF QHRS 58 have approximately half the power spectral density (excluding losses) of the RF receive input signal 14 shown in FIG. 2A, the signal bandwidth 64 of the first RF QHRS 56 and the signal bandwidth 66 of the second RF QHRS 58 are approximately the same size and are located at approximately the same frequencies. In FIGS. 2E and 2F, the signal bandwidth 64 of the first RF QHRS 56 and the signal bandwidth 66 of the second RF QHRS 58 are between the frequencies $f_{RBW1}$ and $f_{RBW2}$. Both the signal bandwidth 64 and the signal bandwidth 66 are approximately equal to the signal bandwidth 40 (FIG. 2A) of the RF receive input signal 14. However, non-ideal circuit behavior may result in either slight misalignments and/or slight size differences in the signal bandwidth 64 and the signal bandwidth 66. The amount of error that is permissible may depend on the particular application and spectrum requirements. As mentioned above, the tuning circuit 24 is configured to tune the frequency response 48 of the RF filter circuit 22 so that the signal bandwidth 64 of the first RF QHRS 56 and the signal bandwidth 66 of the second RF QHRS 58 are each within the passband 50. Consequently, the RF filter circuit 22 filters the first RF QHRS 56 and the second RF QHRS 58 to pass the first RF QHRS 56 and the second RF QHRS 58 within the passband 50 to the second hybrid coupler 20.

As shown in FIGS. 2E and 2F, the first RF QHTS 60 has a signal bandwidth 68, while the second RF QHTS 62 has a signal bandwidth 70. Although the first RF QHTS 60 and the second RF QHTS 62 have approximately half the power spectral density of the RF transmission input signal 26 (excluding losses), the signal bandwidth 68 of the first RF QHTS 60 and the signal bandwidth 70 of the second RF QHTS 62 are configured to be approximately the same as the signal bandwidth 43 of the RF transmission input signal 26. In the embodiments illustrated in FIGS. 2E and 2F, the signal bandwidth 68 and the signal bandwidth 70 are both between the frequencies $f_{TBW1}$ and $f_{TBW2}$. However, non-ideal circuit behavior may result in slight misalignments or size differences in the signal bandwidth 68 and the signal bandwidth 70. The amount of error that is permissible may depend on the particular application and spectrum requirements. The tuning circuit 24 is configured to tune the frequency response 48 of the RF filter circuit 22 so that the signal bandwidth 68 of the first RF QHTS 60 and the signal bandwidth 70 of the second RF QHTS 62 are each within the stopband 52. In this manner, the RF filter circuit 22 blocks the first RF QHTS 60 and the second RF QHTS 62 such that the first RF QHTS 60 and the second RF QHTS 62 are reflected back to the first hybrid coupler 18.

Figure 2G:
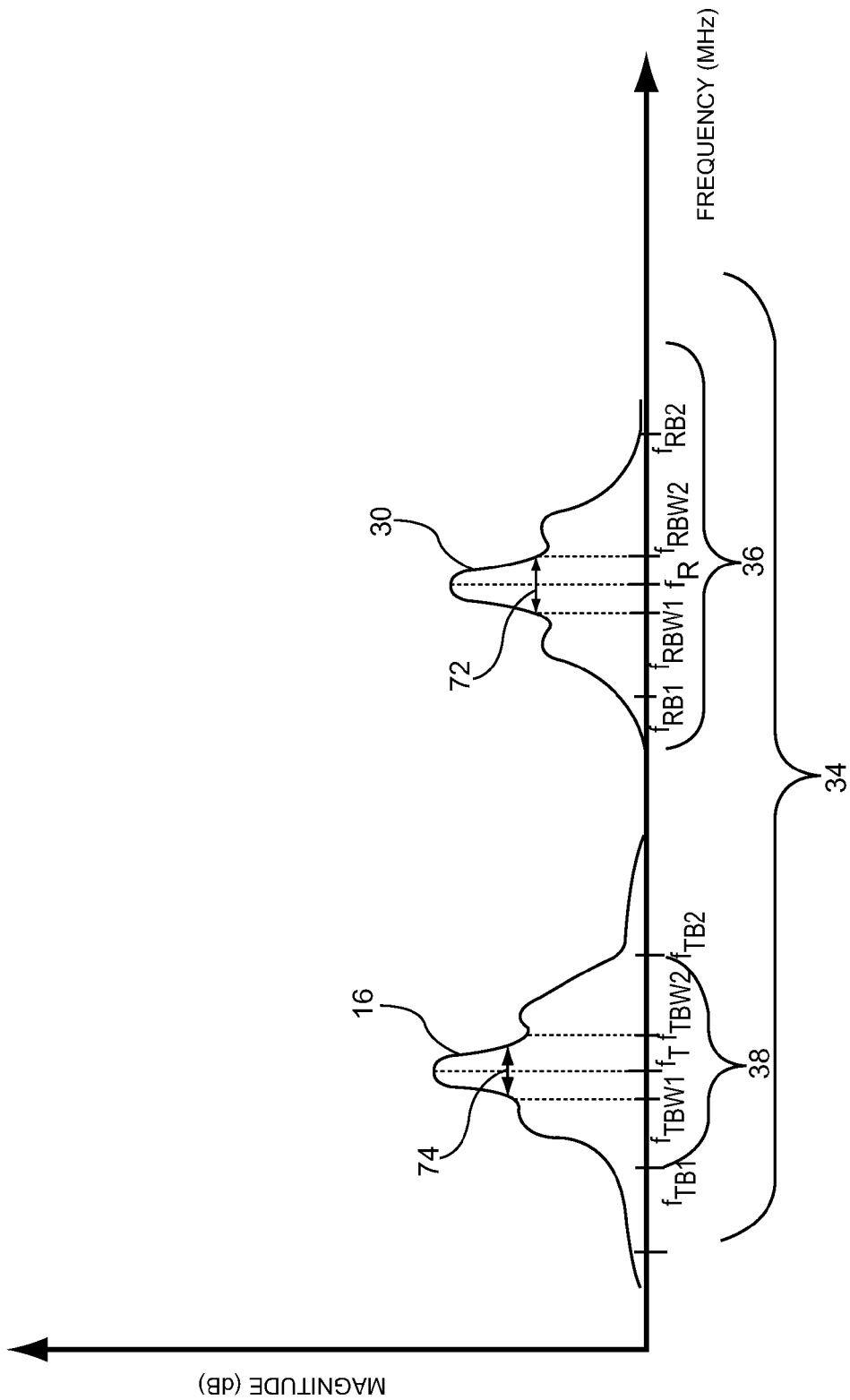
FIG. 2G is a frequency domain representation of one embodiment of the RF receive output signal provided as a result of combining the first RF QHRS and the second RF QHRS and the RF transmission output signal provided as a result of combining the first RF QHTS and the second RF QHTS.

Referring now to FIGS. 2 and 2G, FIG. 2G illustrates one embodiment of the RF receive output signal 30 and one embodiment of the RF transmission output signal 16. To provide the RF receive output signal 30, the second hybrid coupler 20 combines the first RF QHRS 56 (shown in FIG. 2E) and the second RF QHRS 58 (shown in FIG. 2F) within the passband 50 (shown in FIGS. 2E and 2F) into the RF receive output signal 30 (procedure 1016). As shown in FIG. 2G, the RF receive output signal 30 operates within the RF receive band 36. Ideally, the RF receive output signal 30 has the same power spectral density as the RF receive input signal 14. However, in practice, the tunable RF duplexer 10 may not be lossless, and thus the power spectral density of the RF receive output signal 30 may be somewhat smaller than the power spectral density of the RF receive input signal 14.

As shown in FIG. 2G, the RF receive output signal 30 has a signal bandwidth 72 within the RF receive band 36. In this example, the signal bandwidth 72 is the same as the signal bandwidth 40 (shown in FIG. 2A) of the RF receive input signal 14. Thus, the signal bandwidth 72 is between the frequencies $f_{RBW1}$ and $f_{RBW2}$. Furthermore, the RF receive output signal 30 operates at the RF receive frequency $f_R$, like the RF receive input signal 14. However, this may not be exactly the case in all circumstances. For example, the signal bandwidth 72 may be slightly smaller, larger, or misaligned with the signal bandwidth 40 of the RF receive input signal 14. There may also be a small frequency displacement between the RF receive frequency of the RF receive input signal 14 and the RF receive frequency $f_R$ of the RF receive output signal 30. The amount of error permissible for these parameters may depend on the particular application and/or spectrum requirements. Furthermore, additional circuitry may be provided in order to compensate for these errors.

Referring again to FIGS. 2 and 2G, FIG. 2G also illustrates one embodiment of the RF transmission output signal 16. To provide the RF transmission output signal 16, the first hybrid coupler 18 combines the first RF QHTS 60 (shown in FIG. 2E) and the second RF QHTS 62 (shown in FIG. 2F) within the stopband 52 (shown in FIGS. 2E and 2F) into the RF transmission output signal 16 (procedure 1018). Ideally, the RF transmission output signal 16 has the same power spectral density as the RF transmission input signal 26 shown in FIG. 2A. However, the tunable RF duplexer 10 may not be lossless, and thus, the power spectral density of the RF transmission output signal 16 may be smaller. As shown in FIG. 2G, the RF transmission output signal 16 has a signal bandwidth 74. The signal bandwidth 74 may be the same as the signal bandwidth 43 (shown in FIG. 2A) of the RF transmission input signal 26. Thus, in FIG. 2G, the signal bandwidth 74 of the RF transmission output signal 16 is between the frequency $f_{TBW1}$ and $f_{TBW2}$. However, this may not be the case. For example, the signal bandwidth 74 may be smaller, larger, or misaligned with the signal bandwidth 43. Also, the RF transmission output signal 16 shown in FIG. 2G operates at the RF transmission frequency $f_T$, like the RF transmission input signal 26. This may or may not be the case. For example, there may be a small displacement between the RF transmission frequency $f_T$ of the RF transmission output signal 16 and the RF transmission frequency $f_T$ of the RF transmission input signal 26. The amount of error that is permissible in these parameters may depend on a particular application and/or spectrum requirements.

Figure 3A:
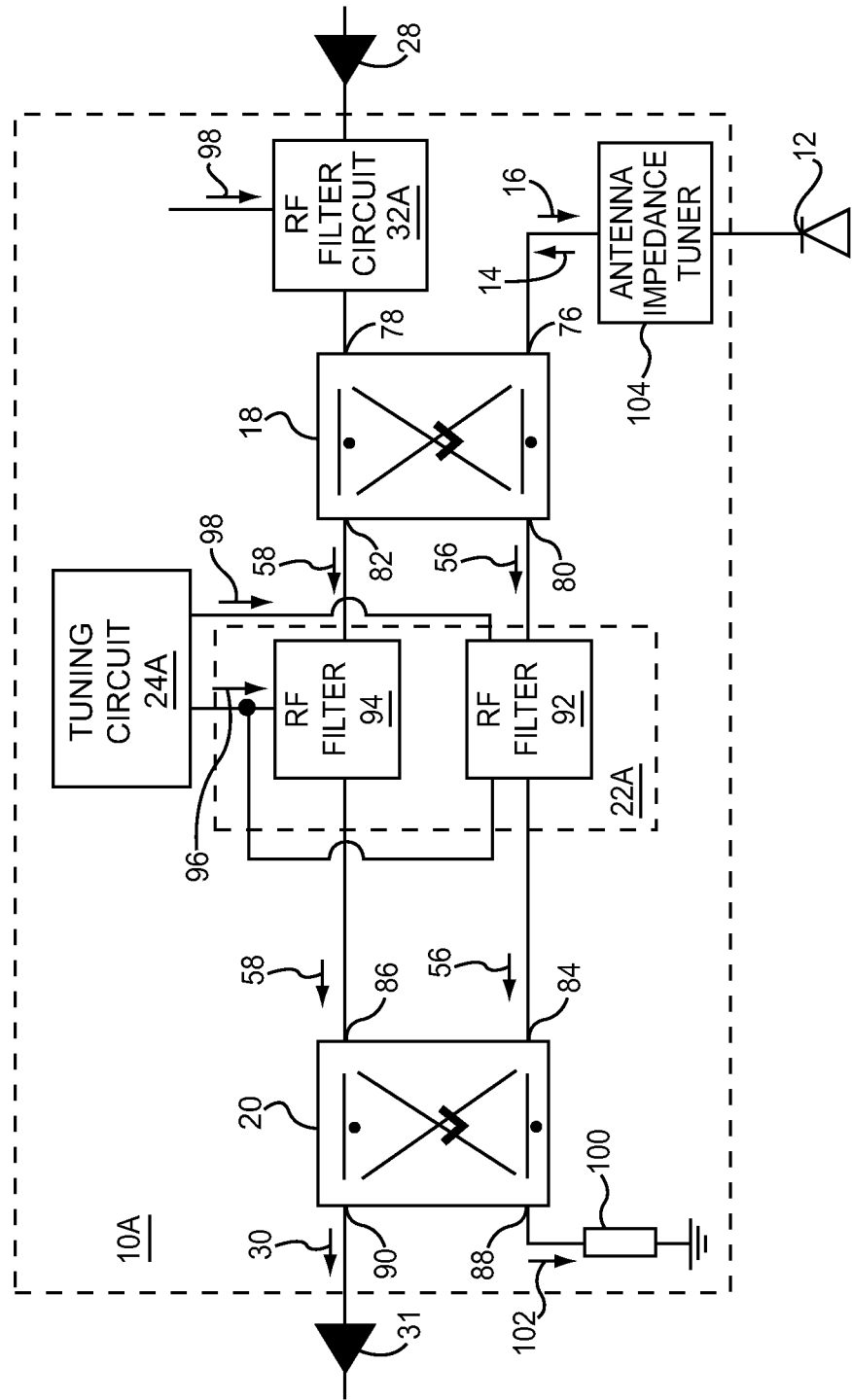
FIG. 3A illustrates one embodiment of a tunable RF duplexer along with a receive signal flow.

FIG. 3A illustrates a tunable RF duplexer 10A along with a receive signal flow of the tunable RF duplexer 10A. The tunable RF duplexer 10A includes the first hybrid coupler 18, the second hybrid coupler 20, an RF filter circuit 22A, and a tuning circuit 24A. As shown in FIG. 3A, the first hybrid coupler 18 has a first port 76, a second port 78, a third port 80, and a fourth port 82, while the second hybrid coupler 20 has a fifth port 84, a sixth port 86, a seventh port 88, and an eighth port 90.

The antenna 12 intercepts the RF receive input signal 14 as electromagnetic waves in free space. These electromagnetic waves result in excitations within the antenna 12, thereby converting the electromagnetic waves into the RF receive input signal 14. The first hybrid coupler 18 is operable to receive the RF receive input signal 14. In this particular embodiment, the first hybrid coupler 18 is coupled to receive the RF receive input signal 14 at the first port 76 from the antenna 12. The first hybrid coupler 18 is operable to split the RF receive input signal 14 into the first RF QHRS 56 and the second RF QHRS 58. In this manner, the first RF QHRS 56 and the second RF QHRS 58 have approximately the same power ratio with respect to the RF receive input signal 14, but have a quadrature phase difference of approximately 90 degrees or $\pi/2$ radians with respect to one another.

With regard to the first hybrid coupler 18 shown in FIG. 3A, the first port 76 is phase-aligned with the third port 80, while the first port 76 has a quadrature phase shift with respect to the fourth port 82. Thus, the first RF QHRS 56 at the third port 80 is approximately phase-aligned with the RF receive input signal 14 at the first port 76, but there is a quadrature phase difference between the RF receive input signal 14 at the first port 76 and the second RF QHRS 58 at the fourth port 82.

Note that in alternative embodiments, this may or may not be the case. For example, there may be a phase shift between the first port 76 and the third port 80 (such as +45 degrees or +$\pi/4$ radians). The phase shift between the first port 76 and the fourth port 82 may then be equal to this phase shift plus or minus 90 degrees (such as +135 degrees or +$3\pi/4$ radians, −45 degrees or −$\pi/4$ radians). Accordingly, so long as the phase difference between the first RF QHRS 56 and the second RF QHRS 58 is about 90 degrees or $\pi/2$ radians, phase alignment between the third port 80 and the first port 76, and between the fourth port 82 and the first port 76, can vary.

The first RF QHRS 56 is output at the third port 80 to the RF filter circuit 22A. Additionally, the second RF QHRS 58 is output at the fourth port 82 to the RF filter circuit 22A. In this embodiment, the RF filter circuit 22A has a first RF filter 92 (an embodiment of the RF filter 23A shown in FIG. 1) and a second RF filter 94 (an embodiment of the RF filter 23B shown in FIG. 1). The first RF filter 92 is coupled to the third port 80 so as to receive the first RF QHRS 56 from the first hybrid coupler 18. The second RF filter 94 is coupled to the fourth port 82 so as to receive the second RF QHRS 58 from the first hybrid coupler 18. The first RF filter 92 and the second RF filter 94 each have a frequency response. The frequency response of the RF filter circuit 22A is thus determined in accordance with the combined effect of the independent frequency responses provided by the first RF filter 92 and the second RF filter 94. However, in this embodiment, the first RF filter 92 and the second RF filter 94 are identical to one another. As such, the overall frequency response of the RF filter circuit 22A is the same as the independent frequency responses provided by the first RF filter 92 or the second RF filter 94. Alternatively, in other embodiments, the first RF filter 92 and the second RF filter 94 may be different and/or may be tuned independently by the tuning circuit 24A. As such, the different independent frequency responses from the first RF filter 92 and the second RF filter 94 may combine to determine the overall frequency response of the RF filter circuit 22A.

Referring again to FIG. 3A, the tuning circuit 24A is configured to tune the frequency response of the RF filter circuit 22A so that the passband includes the RF receive band. The tuning circuit 24A thus shifts the passband of the RF filter circuit 22A to include the RF receive band. In this manner, the RF filter circuit 22A is operable to pass the first RF QHRS 56 and the second RF QHRS 58 to the second hybrid coupler 20. The manner of tuning the frequency response may depend on the topology of the RF filter circuit 22A. For example, the first RF filter 92 and the second RF filter 94 shown in FIG. 3A may both be passive filters. Accordingly, one or more reactive impedance components (inductive, capacitive, or both) in each of the first and second RF filters 92, 94 may have a variable reactive impedance level. By varying these variable reactive impedance levels, the poles and zeros of the individual frequency responses provided by each of the first and second RF filters 92, 94 are adjusted. This thereby shifts the passband and/or the stopband of the RF filter circuit 22A. Ideally, the first RF filter 92 and the second RF filter 94 in FIG. 3A each operate as a short with respect to the RF receive band and as an open circuit with respect to the RF transmission band.

The tuning circuit 24A illustrated in FIG. 3A generates a receive tuning control output 96 and a transmission tuning control output 98. The variable reactive impedance components in both the first RF filter 92 and the second RF filter 94 are set in accordance with one or more signal levels of the receive tuning control output 96. In this manner, the stopband is shifted to include the RF transmission band in accordance with one or more signal levels of the transmission tuning control output 98. Similarly, reactive impedance levels of variable reactive components in the first RF filter 92 and the second RF filter 94 are set in accordance with one or more signal levels of the receive tuning control output 96. The RF filter circuit 22A may also include active RF filters, Surface Acoustic Wave (SAW) filters, or any other type of RF filter or combination of RF filters that is suitable to provide a desired frequency response. As such, the tuning circuit 24A may employ various types of tuning topologies, depending on the particular filtering topology being employed by the RF filter circuit 22A.

By placing the passband in the RF receive band, the RF filter circuit 22A passes the first RF QHRS 56 and the second RF QHRS 58 to the second hybrid coupler 20. In this particular embodiment, the first RF filter 92 passes the first RF QHRS 56 to the second hybrid coupler 20, while the second RF filter 94 passes the second RF QHRS 58 to the second hybrid coupler 20. As mentioned above, the passband is set in the RF receive band.

Referring again to FIG. 3A, the second hybrid coupler 20 receives the first RF QHRS 56 from the first RF filter 92 at the fifth port 84. The second RF QHRS 58 is received by the second hybrid coupler 20 from the second RF filter 94 at the sixth port 86. As discussed above, the first RF QHRS 56 and the second RF QHRS 58 have a quadrature phase difference of about 90 degrees or $\pi/2$ radians. Thus, for example, if the first RF QHRS 56 has a phase of zero degrees, the second RF QHRS 58 would have a phase of approximately 90 degrees (or $\pi/2$ radians). From the fifth port 84 to the seventh port 88, the second hybrid coupler 20 provides no phase shift. Alternatively, the second hybrid coupler 20 may be configured to provide a phase shift from the fifth port 84 to the seventh port 88 of $\Delta$ (i.e., such as +45 degrees or $\pi/4$ radians).

The second hybrid coupler 20 shown in FIG. 3A is configured to provide a quadrature phase shift from the sixth port 86 to the seventh port 88. In this example, the phase shift is 90 degrees (or $\pi/2$ radians), and thus the second RF QHRS 58 has a phase, as seen from the seventh port 88, of 180 degrees (note that the second RF QHRS 58 was received with a phase of 90 degrees in this example, and thus is seen with a phase of 180 degrees with another phase shift of 90 degrees). Alternatively, the phase shift from the sixth port 86 to the seventh port 88 may be $\Delta \pm 90$ degrees (or $\pi/2$ radians). In any case, the phase difference between the first RF QHRS 56 and the second RF QHRS 58 as seen from the seventh port 88 is about 180 degrees (note that the first RF QHRS 56 was received with a phase of zero (0) degrees and thus is seen with a phase of zero (0) degrees at the seventh port 88). Accordingly, the quadrature phase shift at the seventh port 88 from the sixth port 86 results in destructive interference between the first RF QHRS 56 and the second RF QHRS 58 at the seventh port 88. As a result, the first RF QHRS 56 and the second RF QHRS 58 are substantially cancelled at the seventh port 88. In this manner, the seventh port 88 is substantially isolated from receive signal flow.

The second hybrid coupler 20 is configured to output the RF receive output signal 30 from the eighth port 90 in response to the first RF QHRS 56 being received from the RF filter circuit 22A at the fifth port 84 and the second RF QHRS 58 being received from the RF filter circuit 22A at the sixth port 86. In this particular embodiment, the second hybrid coupler 20 is configured to pass the second RF QHRS 58 from the sixth port 86 to the eighth port 90. The second hybrid coupler 20 provides no phase shift to the second RF QHRS 58 from the sixth port 86 to the eighth port 90. The second RF QHRS 58 is thus passed with a phase of 90 degrees to the eighth port 90. Alternatively, the second hybrid coupler 20 may provide a phase shift of $\Delta$ (i.e., such as +45 degrees or $\pi/4$ radians) to the second RF QHRS 58 when passed from the sixth port 86 to the eighth port 90. The second hybrid coupler 20 is configured to pass the first RF QHRS 56 from the fifth port 84 to the eighth port 90. The second hybrid coupler 20 provides a quadrature phase shift to the first RF QHRS 56 at the eighth port 90. In this embodiment, the quadrature phase shift is 90 degrees or $\pi/2$ radians. Alternatively, if a phase shift of Δ was provided to the second RF QHRS 58 from the sixth port 86 to the eighth port 90, the quadrature phase shift would be Δ±90 degrees (or π/2 radians).

Accordingly, the first RF QHRS 56 is provided substantially as a duplicate of the second RF QHRS 58 at the eighth port 90. This is a result of the quadrature phase shift provided to the first RF QHRS 56 when passed from the fifth port 84 to the eighth port 90 (now, at the eighth port 90, the first RF QHRS 56 is shifted to have a phase of 90 degrees, just like the second RF QHRS 58). Referring again to the example discussed previously, if the first RF QHRS 56 has a phase of zero at the fifth port 84, then the first RF QHRS 56 has a phase of 90 degrees at the eighth port 90. If the phase of the second RF QHRS 58 at the sixth port 86 is 90 degrees, then the phase of the second RF QHRS 58 is also 90 degrees at the eighth port 90. Accordingly, the first RF QHRS 56 is substantially a duplicate of the second RF QHRS 58 at the eighth port 90 because the first RF QHRS 56 and the second RF QHRS 58 become phase-aligned at the eighth port 90. As a result, the first RF QHRS 56 and the second RF QHRS 58 constructively interfere at the eighth port 90 to output the RF receive output signal 30 from the eighth port 90. Note that since the first RF QHRS 56 and the second RF QHRS 58 substantially cancel at the seventh port 88 due to destructive interference, very little or no power is transferred from the first RF QHRS 56 and the second RF QHRS 58 to the seventh port 88. Instead most, if not all, of the power in the first RF QHRS 56 and the second RF QHRS 58 is transferred to the eighth port 90 and provided in the RF receive output signal 30.

An impedance load 100 is coupled to the seventh port 88 of the second hybrid coupler 20. The impedance load 100 may be a 50 Ohm load. Due to the phase-shifting provided by the first hybrid coupler 18 and the second hybrid coupler 20, spurious emissions from the second port 78 of the first hybrid coupler 18 would see a very high (theoretically infinite) impedance level at the eighth port 90 of the second hybrid coupler, but only the impedance load 100 at the seventh port 88. Thus, the spurious emissions are aggregated to be an aggregated noise signal 102 at the seventh port 88. This aggregated noise signal 102 is dissipated by the impedance load 100. Additionally, the eighth port 90 is isolated from the seventh port 88. As such, the seventh port 88 is substantially unresponsive to signals incident at the eighth port 90 and the seventh port 88 is substantially unresponsive to signals incident at the eighth port 90.

Additionally, an antenna impedance tuner 104 is coupled between the antenna 12 and the first port 76. Since the RF transmission output signal 16 is in the RF transmission band, the impedance of the antenna 12 may result in a portion of the RF transmission output signal 16 being reflected back to the first port 76. This not only would degrade the RF transmission output signal 16, but would also degrade the isolation between the receive signal flow and the eighth port 90. The antenna impedance tuner 104 is tunable so as to reduce reflections from the antenna 12 to the first port 76. More specifically, an impedance of the antenna 12 may be tuned so as to provide impedance matching between the first port 76 and the antenna 12.

Figure 3B:
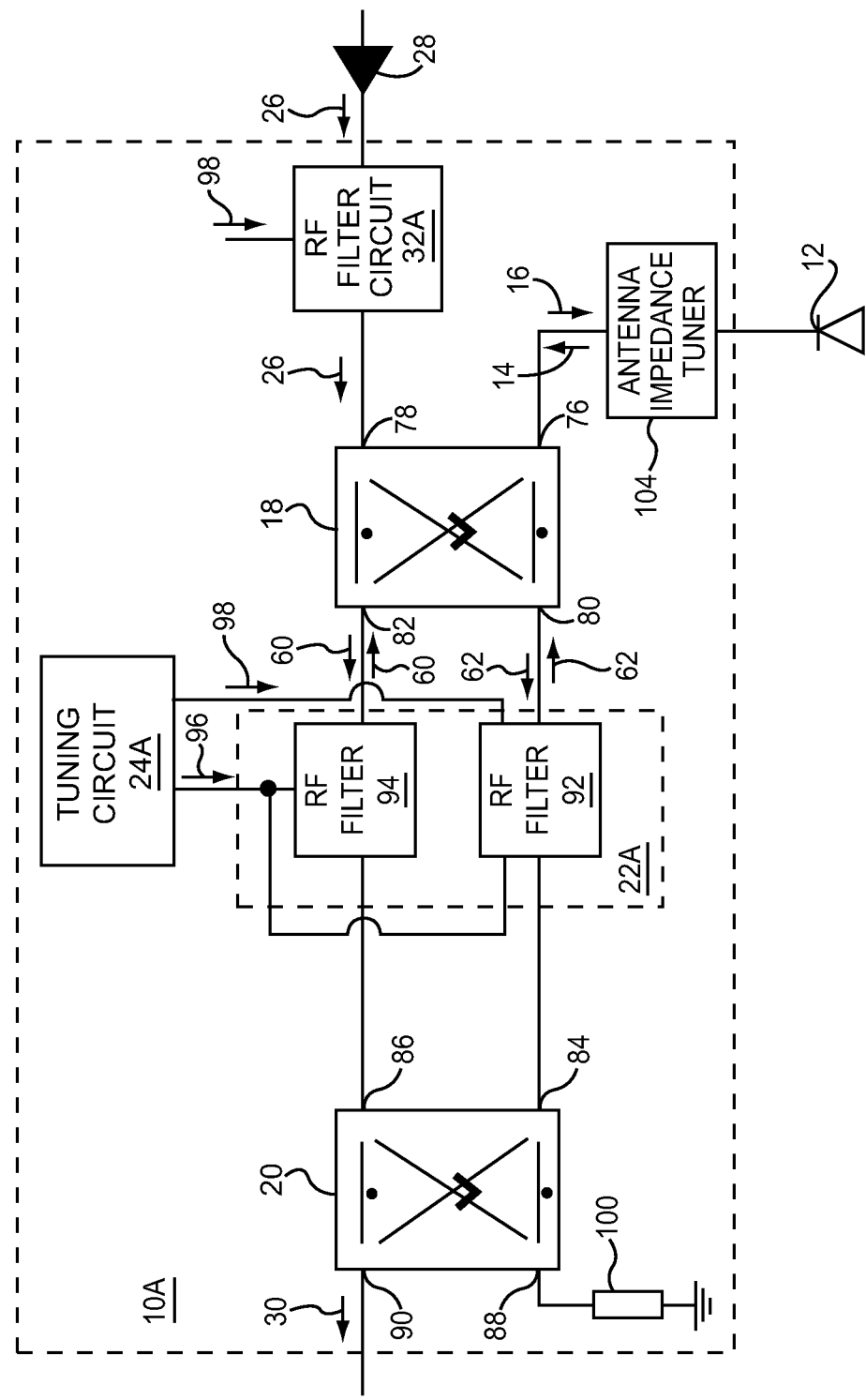
FIG. 3B illustrates the same embodiment of the tunable RF duplexer along with a transmission signal flow.

FIG. 3B illustrates the tunable RF duplexer 10A along with the transmission signal flow. The RF filter circuit 32A may be coupled to the power amplifier 28 to receive the RF transmission input signal 26. The RF filter circuit 32A may be tunable so as to define a stopband. The tuning circuit 24A may be configured to tune the RF filter circuit 32A to provide the stopband within the RF receive band. In particular, the RF filter circuit 32A is operable to receive the transmission tuning control output 98 from the tuning circuit 24A, which tunes the stopband accordingly. As a result, the RF filter circuit 32A is operable to filter out spurious emissions resulting from upstream RF circuitry, such as the power amplifier 28, that are within the RF receive band.

The first hybrid coupler 18 is operable to receive the RF transmission input signal 26 at the second port 78. The RF transmission input signal 26 operates in the RF transmission band, which is within the same RF communication band as the RF receive band of the RF receive input signal 14 (see FIG. 2A). The first hybrid coupler 18 is operable to split the RF transmission input signal 26 into the first RF QHTS 60 and the second RF QHTS 62. Since the first RF QHTS 60 and the second RF QHTS 62 are quadrature hybrids, the first RF QHTS 60 and the second RF QHTS 62 are approximately equal in power, but have a quadrature phase difference of 90 degrees or π/2 radians. The first hybrid coupler 18 is operable to output the first RF QHTS 60 from the fourth port 82 and to output the second RF QHTS 62 from the third port 80 in response to receiving the RF transmission input signal 26 at the second port 78.

In the embodiment illustrated in FIG. 3B, the first RF QHTS 60 is phase-aligned with the RF transmission input signal 26, while the second RF QHTS 62 has a phase difference of about 90 degrees with respect to the RF transmission input signal 26. It should be noted that this may or may not be the case. For example, in alternative embodiments, a phase shift of Δ (i.e., +45 degrees or π/4 radians) may be provided between the second port 78 and the fourth port 82, and thus, a phase shift of Δ±90 degrees (or π/2 radians) would be provided between the second port 78 and the fourth port 82.

The RF filter circuit 22A is operable to reflect the first RF QHTS 60 and the second RF QHTS 62. As discussed above, the frequency response of the RF filter circuit 22A defines the stopband and the RF filter circuit 22A is tunable so as to shift the stopband. For example, the stopband may be a notch that is shiftable. The tuning circuit 24A is configured to tune the frequency response of the RF filter circuit 22A so that the signal bandwidth of the first RF QHTS 60 and the signal bandwidth of the second RF QHTS 62 are each within the stopband. For instance, the tuning circuit 24A may be configured to place the notch within the RF transmission band so that the notch is centered at the RF transmission signal frequency. In this embodiment, the tuning circuit 24A generates the transmission tuning control output 98. Variable reactive impedance components in both the first RF filter 92 and the second RF filter 94 are responsive to the one or more signal levels of the transmission tuning control output 98 so as to adjust the variable impedance levels based on the signal level(s) of the transmission tuning control output 98. As a result, the notch defined by the individual frequency response of the first RF filter 92 is shifted to include the signal bandwidth of the second RF QHTS 62. Also, the notch defined by the individual frequency response of the second RF filter 94 is shifted to include the signal bandwidth of the first RF QHTS 60. In other words, the notches defined by the individual frequency responses of the first RF filter 92 and the second RF filter 94 are placed in the RF transmission band.

Since the tuning circuit 24A has tuned the frequency response of the RF filter circuit 22A so that the stopband includes the RF transmission signal band, the RF filter circuit 22A blocks the first RF QHTS 60 and the second RF QHTS 62. Accordingly, the second hybrid coupler 20 is substantially isolated from the transmission signal flow. The RF filter circuit 22A then reflects the first RF QHTS 60 and the second RF QHTS 62 back to the first hybrid coupler 18. In the embodiment illustrated in FIG. 3B, the second RF filter 94 reflects the first RF QHTS 60 back to the first hybrid coupler 18 at the fourth port 82. The first RF filter 92 reflects the second RF QHTS 62 back to the first hybrid coupler 18 at the third port 80.

The first hybrid coupler 18 is configured to combine the first RF QHTS 60 and the second RF QHTS 62 into the RF transmission output signal 16. To combine the first RF QHTS 60 and the second RF QHTS 62 into the RF transmission output signal 16, the first hybrid coupler 18 is configured to pass the second RF QHTS 62 from the fourth port 82 to the first port 76. Additionally, the first hybrid coupler 18 is configured to pass the first RF QHTS 60 from the fourth port 82 to the first port 76. However, the first hybrid coupler 18 provides a quadrature phase shift to the first RF QHTS 60 from the fourth port 82 to the first port 76. Thus, the first RF QHTS 60 is provided substantially as a duplicate of the second RF QHTS 62 at the first port 76. For example, if the phase of the second RF QHTS 62 is 90 degrees at the third port 80, the second RF QHTS 62 has a phase of 90 degrees at the first port 76. Additionally, the phase of the first RF QHTS 60 at the third port 80 is approximately zero degrees. However, due to the quadrature phase shift between the fourth port 82 and the first port 76, the first RF QHTS 60 has a phase of about 90 degrees at the first port 76. Accordingly, the first RF QHTS 60 and the second RF QHTS 62 constructively interfere at the first port 76 to output the RF transmission output signal 16 from the first port 76.

Also, note that the first hybrid coupler 18 is configured such that the quadrature phase shift at the second port 78 results in destructive interference between the first RF QHTS 60 and the second RF QHTS 62. Referring again to the previous example provided, at the second port 78, the first RF QHTS 60 appears to have a phase of zero degrees, but the second RF QHTS 62 appears to have a phase of 180 degrees. As a result, the first RF QHTS 60 and the second RF QHTS 62 are substantially cancelled at the second port 78. Consequently, most, if not all, of the power of the first RF QHTS 60 and the second RF QHTS 62 is transferred to the first port 76 and provided in the RF transmission output signal 16. The first hybrid coupler 18 is thus configured to output the RF transmission output signal 16 from the first port 76 in response to the first RF QHTS 60 being reflected back by the RF filter circuit 22A to the fourth port 82 and the second RF QHTS 62 being reflected back by the RF filter circuit 22A to the third port 80.

Note that spurious emissions from the first RF QHTS 60 and the second RF QHTS 62 that are not reflected by the RF filter circuit 22A, such as spurious noise emissions outside the stopband, may be passed toward the second hybrid coupler 20. In this example, the spurious emissions would destructively interfere at the eighth port 90 and constructively interfere at the seventh port 88. Accordingly, these spurious emissions become part of the aggregated noise signal 102 and are dissipated by the impedance load 100. Therefore, the tunable RF duplexer 10A significantly reduces noise interference resulting at the second port 78 of the first hybrid coupler 18 from degrading the RF receive output signal 30 at the eighth port 90.

As shown in FIGS. 3A and 3B, the tunable RF duplexer 10A allows the receive signal flow and the transmission signal flow to be simultaneous. More specifically, the first port 76 of the first hybrid coupler 18 is configured to simultaneously receive the RF receive input signal 14 and output the RF transmission output signal 16 to and from the antenna 12. As a result, the RF transmission output signal 16 is output from the first port 76 while the RF receive input signal 14 is being received at the first port 76. The tunable RF duplexer 10A can provide this functionality because the second port 78 is substantially isolated from the eighth port 90.

Note that the first RF filter 92 in the RF filter circuit 22A is coupled in series between the third port 80 of the first hybrid coupler 18 and the fifth port 84 of the second hybrid coupler 20. Furthermore, the second RF filter 94 in the RF filter circuit 22A is coupled in series between the fourth port 82 of the first hybrid coupler 18 and the sixth port 86 of the second hybrid coupler 20. As noted above, the stopband of the RF filter circuit 22A, and thus the stopband of each of the first and second RF filters 92, 94, should reflect the first RF QHTS 60 and the second RF QHTS 62. As a result, an impedance of the second RF filter 94 should appear very high within the RF transmission band as seen from the fourth port 82, and an impedance of the first RF filter 92 should appear very high within the RF transmission band as seen from the third port 80. Ideally, the impedance of the second RF filter 94 as seen from the fourth port 82 and the impedance of the first RF filter 92 as seen from the third port 80 should be infinite. In practice, these impedances should simply be high enough to meet RF communication band specifications.

Additionally, the passband of the RF filter circuit 22A, and thus the passband of each of the first and second RF filters 92, 94, should pass the first RF QHRS 56 and the second RF QHRS 58. The first and second RF filters 92, 94 should therefore appear transparent in the RF receive band. Since the first and second RF filters 92, 94 are coupled in series, the input/output impedances of each of the first and second RF filters 92, 94 would ideally be the same as the characteristic impedance of the intra-hybrid connection lines. In practice, the input/output impedances of each of the first and second RF filters 92, 94 may simply be provided sufficiently near the characteristic impedance of the intra-hybrid connection lines such that RF communication band specifications are met. Nevertheless, tuning by the tuning circuit 24A can be difficult to implement when the first and second RF filters 92, 94 are coupled in series, as shown in FIGS. 3A and 3B.

Figure 4:
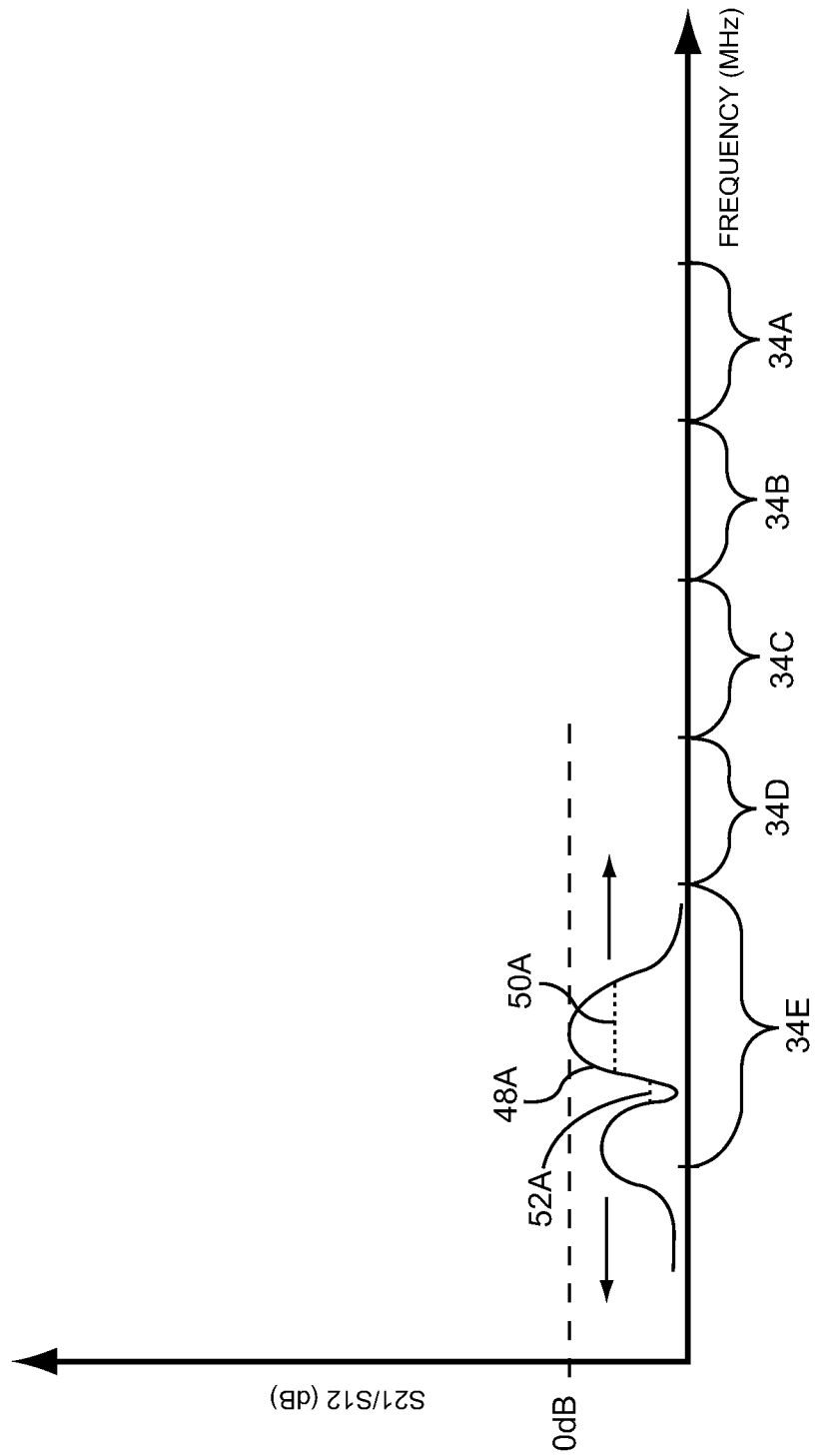
FIG. 4 illustrates one embodiment of a frequency response of an RF filter circuit in the tunable RF duplexer shown in FIGS. 3A and 3B wherein the frequency response defines a stopband and a passband.

Referring now to FIG. 4, FIG. 4 illustrates one embodiment of a frequency response 48A provided by the RF filter circuit 22A shown in FIGS. 3A and 3B. The frequency response 48A defines a passband 50A and a stopband 52A. The RF filter circuit 22A described in FIGS. 3A and 3B is tunable so that the RF communication band (referred to generically as element 34 and specifically as elements 34A-34E) can be switched to be any one of a plurality of different RF communication bands 34A-34E. The different RF communication bands 34A-34E may each define different RF receive band(s) and different RF transmission band(s) within each of the RF communication bands 34A-34E. Accordingly, the RF transmission input signal 26 (shown in FIGS. 3A-3B) and the RF receive input signal 14 (shown in FIGS. 3A-3B) may be in the respective RF receive band and RF transmission band of any of the different RF communication bands 34A-34E. Accordingly, the first RF QHRS 56, the second RF QHRS 58, and the RF receive output signal 30 would also operate within the RF receive band of the RF receive input signal 14. Similarly, the first RF QHTS 60, the second RF QHTS 62, and the RF transmission output signal 16 would operate in the respective RF transmission band of the RF transmission input signal 26.

When the RF communication band 34 is switched to be a different one of the plurality of RF communication bands 34A-34E, the tuning circuit 24A is operable to tune the frequency response 48A to the particular RF communication band 34A-34E. Since the RF communication band 34 has been switched, the first RF QHRS 56 and the second RF QHRS 58 are provided in the new RF communication band 34A-34E. In particular, the first RF QHRS 56 and the second RF QHRS 58 operate within the RF receive band of the new RF communication band 34A-34E. Also, since the RF communication band 34 has been switched to the new RF communication band 34A-34E, the first RF QHTS 60 and the second RF QHTS 62 are provided within the new RF communication band 34A-34E. In particular, the first RF QHTS 60 and the second RF QHTS 62 operate within the RF transmission band of the new RF communication band 34A-34E. The tuning circuit 24A tunes the passband 50A so as to pass the first RF QHRS 56 and the second RF QHRS 58 in response to the RF communication band 34 being switched to the new RF communication band 34A-34E. More particularly, the passband 50A is provided so as to include the RF receive band of the selected RF communication band 34A-34E. Similarly, the tuning circuit 24A shifts the stopband 52A to reflect the first RF QHTS 60 and the second RF QHTS 62 in response to the RF communication band 34 being switched to the new RF communication band 34A-34E. More particularly, the stopband 52A is shifted to include the RF transmission band of the selected RF communication band 34A-34E.

Figure 5:
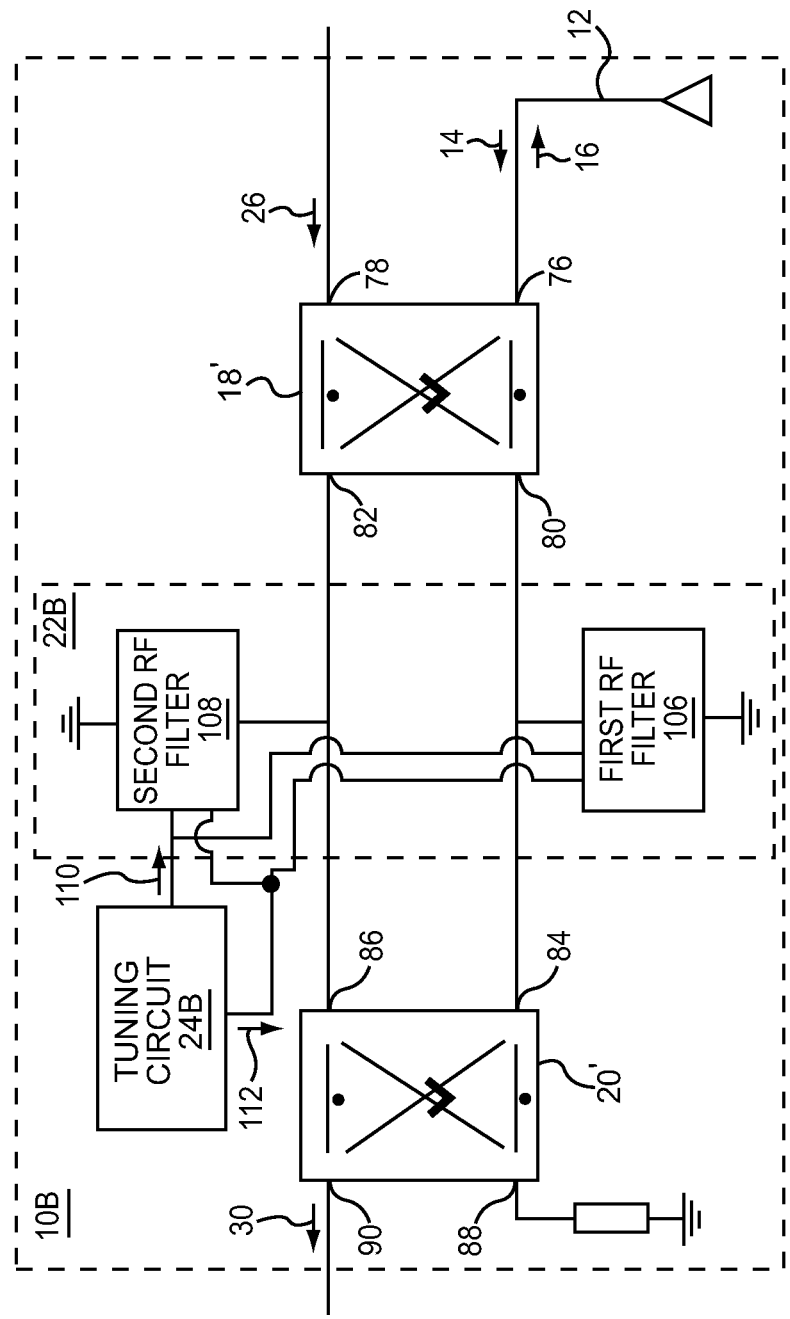
FIG. 5 illustrates another embodiment of a tunable RF duplexer, wherein the tunable RF duplexer is designed for dual carrier aggregation.

FIG. 5 illustrates another embodiment of a tunable RF duplexer 10B. The tunable RF duplexer 10B is similar to the tunable RF duplexer 10A shown in FIGS. 3A and 3B. The tunable RF duplexer 10B has a first hybrid coupler 18' and a second hybrid coupler 20', an RF filter circuit 22B, and a tuning circuit 24B. The RF filter circuit 22B is another embodiment of the RF filter circuit 22 in FIG. 1. As explained in further detail below, the first hybrid coupler 18' and the second hybrid coupler 20' operate in the same manner as the first hybrid coupler 18 and second hybrid coupler 20 described above in FIGS. 3A and 3B, except in this embodiment the first hybrid coupler 18' and the second hybrid coupler 20' are tunable. Also, like the RF filter circuit 22A shown in FIGS. 3A and 3B, the RF filter circuit 22B has a frequency response that defines a stopband and a passband and is tunable so as to shift the passband and the stopband. However, a first RF filter 106 has an individual frequency response that defines a passband and a stopband. Unlike the RF filter circuit 22A shown in FIGS. 3A and 3B, the RF filter circuit 22B in FIG. 5 has the first RF filter 106 and a second RF filter 108 coupled in shunt. More specifically, the first RF filter 106 is coupled in shunt between the third port 80 and the fifth port 84, while the second RF filter 108 is coupled in shunt between the fourth port 82 and the sixth port 86.

The tuning circuit 24B illustrated in FIG. 5 is configured to tune the RF filter circuit 22B so as to shift the passband to within the RF receive band of the RF receive input signal 14 and the stopband to within the RF transmission input signal 26. More specifically, the first RF filter 106 has an individual frequency response that defines a passband and a stopband. The second RF filter 108 also has an individual frequency response that defines a passband and a stopband. As such, the different independent frequency responses from the first RF filter 106 and the second RF filter 108 may combine to determine the overall frequency response of the RF filter circuit 22B. Alternatively, in other embodiments, the first RF filter 106 and the second RF filter 108 may be different, and/or may be tuned independently by the tuning circuit 24B. As such, the different independent frequency responses from the first RF filter 106 and the second RF filter 108 may combine to determine the overall frequency response of the RF filter circuit 22B.

The tuning circuit 24B shown in FIG. 5 is configured to generate a receive tuning control output 110, hybrid control outputs (referred to generically as element 111 and specifically as elements 111A and 111B), and a transmission tuning control output 112. The variable reactive impedance components of both the first RF filter 106 and the second RF filter 108 are set in accordance with one or more signal levels of the receive tuning control output 110. In this manner, the passbands of both the first RF filter 106 and the second RF filter 108 are shifted within the RF receive band of the RF receive input signal 14. The second hybrid coupler 20' is operable to output the RF receive output signal 30 at the eighth port 90. Additionally, reactive impedance levels of variable reactive components in both the first RF filter 106 and the second RF filter 108 are set in accordance with a signal level of the transmission tuning control output 112. In this manner, the stopbands of both the first RF filter 106 and the second RF filter 108 are shifted within the RF transmission band of the RF transmission input signal 26 at the second port 78. The first hybrid coupler 18' is configured to output the RF transmission output signal 16 at the first port 76. As such, the tunable RF duplexer 10B is configured to simultaneously receive the RF receive input signal 14 from the antenna 12 and output the RF transmission output signal 16 to the antenna 12. The tuning of the first hybrid coupler 18' by the first hybrid control output 111A and the tuning of the second hybrid coupler 20' by the second hybrid control output 111B is described in further detail below.

Figure 6A:
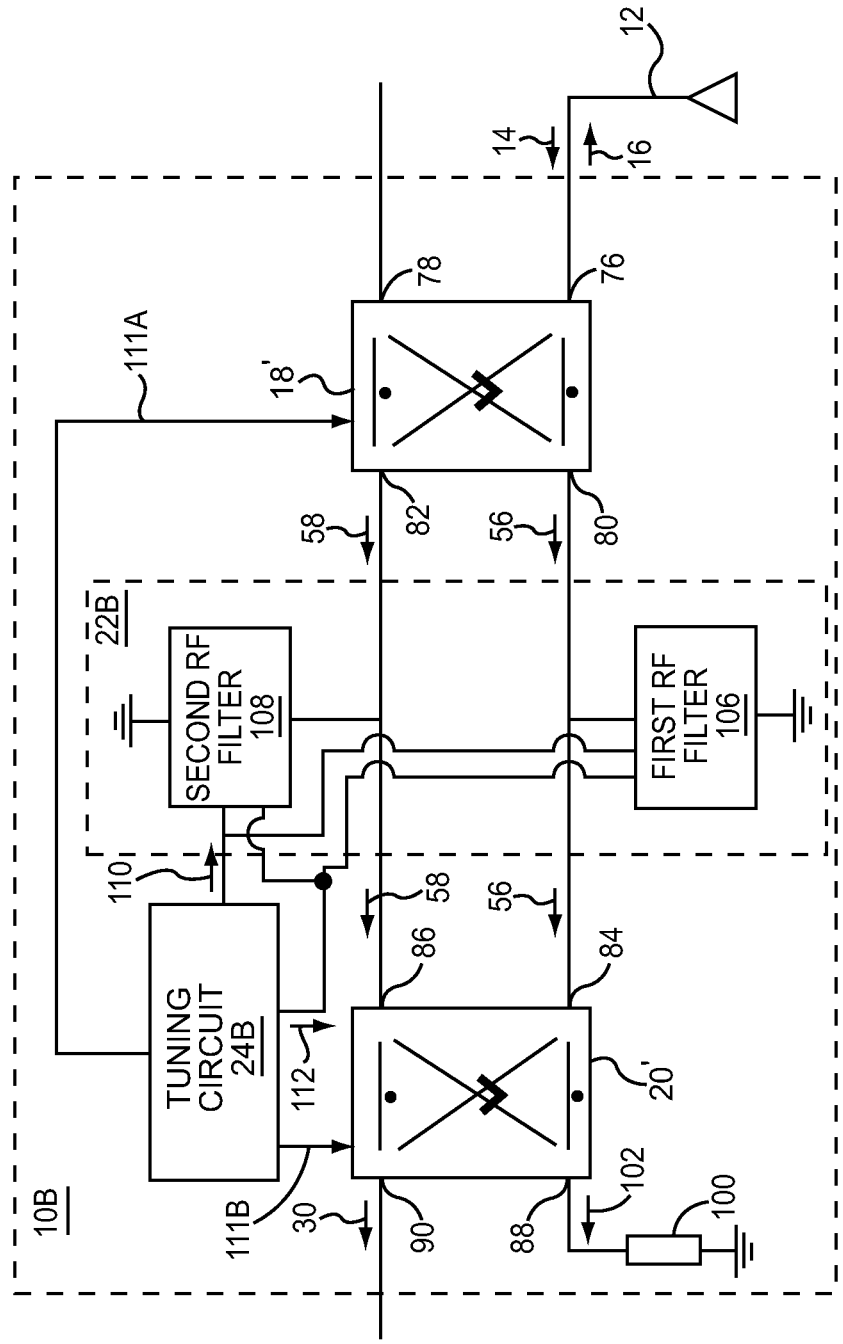
FIG. 6A illustrates the tunable RF duplexer shown in FIG. 5 along with a receive signal flow.

FIG. 6A illustrates the tunable RF duplexer 10B along with a receive signal flow. The antenna 12 intercepts the RF receive input signal 14 as electromagnetic waves in free space. These electromagnetic waves result in excitations within the antenna 12, thereby converting the electromagnetic waves into the RF receive input signal 14. The first hybrid coupler 18' is operable to receive the RF receive input signal 14 at the first port 76.

The first hybrid coupler 18' is operable to split the RF receive input signal 14 into the first RF QHRS 56 and the second RF QHRS 58. In this manner, the first RF QHRS 56 and the second RF QHRS 58 have approximately the same power ratio with respect to the RF receive input signal 14, but have a quadrature phase difference of approximately 90 degrees or $\pi/2$ radians with respect to one another. The first RF QHRS 56 is output at the third port 80 to the RF filter circuit 22B. Additionally, the second RF QHRS 58 is output at the fourth port 82 to the RF filter circuit 22B.

The tuning circuit 24B is configured to tune the frequency response so that a signal bandwidth of the first RF QHRS 56 and a signal bandwidth of the second RF QHRS 58 are each within the passband of the RF filter circuit 22B. In this embodiment, the tuning circuit 24B is configured to tune the passband of the first RF filter 106 within the signal bandwidth of the first RF QHRS 56 and to tune the passband of the second RF filter 108 within the signal bandwidth of the second RF QHRS 58. To provide each of the passbands, the first RF filter 106 and the second RF filter 108 each appear approximately as open circuits. Since the first RF filter 106 is coupled in shunt, the first RF filter 106 appears approximately transparent within the passband of the first RF filter 106. Similarly, since the second RF filter 108 is coupled in shunt, the second RF filter 108 appears approximately transparent within the passband of second RF filter 108. Unlike the series coupled first and second RF filters 92, 94 shown in FIGS. 3A and 3B, the input/output impedances of the first RF filter 106 and the second RF filter 108 in FIG. 6A do not have to approximate the characteristic impedance of the intra-hybrid connection lines in order to appear transparent. This may make it easier to implement the tuning circuit 24B. Also, since the first RF filter 106 and the second RF filter 108 are coupled in shunt, the first RF filter 106 and the second RF filter 108 can provide paths for neutralizing parasitic loading effects within the RF receive band using reactive compensation.

By placing the passband in the RF receive band, the RF filter circuit 22B passes the first RF QHRS 56 and the second RF QHRS 58 to the second hybrid coupler 20'. In this particular embodiment, the first RF filter 106 passes the first RF QHRS 56 to the second hybrid coupler 20', while the second RF filter 108 passes the second RF QHRS 58 to the second hybrid coupler 20'. More specifically, the first RF QHRS 56 is received at the fifth port 84 of the second hybrid coupler 20', and the second RF QHRS 58 is received at the sixth port 86 of the second hybrid coupler 20'.

As described above with respect to FIG. 3A, the second hybrid coupler 20' shown in FIG. 3A is configured to provide a quadrature phase shift from the sixth port 86 to the seventh port 88. In this example, the phase shift is 90 degrees (or $\pi/2$ radians), and thus the second RF QHRS 58 has a phase, as seen from the seventh port 88, of 180 degrees (note that the second RF QHRS 58 was received with a phase of 90 degrees in this example, and thus is seen with a phase of 180 degrees with another phase shift of 90 degrees). No phase shift is provided from the fifth port 84 to the eighth port 90. Thus, the phase difference between the first RF QHRS 56 and the second RF QHRS 58 as seen from the seventh port 88 is about 180 degrees (note that the first RF QHRS 56 was received with a phase of zero (0) degrees and thus is seen with a phase of zero (0) degrees at the seventh port 88). Accordingly, the quadrature phase shift at the seventh port 88 from the sixth port 86 results in destructive interference between the first RF QHRS 56 and the second RF QHRS 58 at the seventh port 88. As a result, the first RF QHRS 56 and the second RF QHRS 58 are substantially cancelled at the seventh port 88. In this manner, the seventh port 88 is substantially isolated from receive signal flow.

The second hybrid coupler 20' is configured to output the RF receive output signal 30 from the eighth port 90 in response to the first RF QHRS 56 being received from the RF filter circuit 22B at the fifth port 84 and the second RF QHRS 58 being received from the RF filter circuit 22B at the sixth port 86. In this particular embodiment, the second hybrid coupler 20' is configured to pass the second RF QHRS 58 from the sixth port 86 to the eighth port 90. The second hybrid coupler 20' provides no phase shift to the second RF QHRS 58 from the sixth port 86 to the eighth port 90. Since no phase shift is provided to the second RF QHRS 58 from the sixth port 86 to the eighth port 90, the second RF QHRS 58 is thus passed with a phase of 90 degrees (or $\pi/2$ radians) to the eighth port 90. The second hybrid coupler 20' is configured to provide a quadrature phase shift to the first RF QHRS 56 at the eighth port 90. Thus, since the quadrature phase shift is provided to the first RF QHRS 56 from the fifth port 84 to the eighth port 90, the second RF QHRS 58 is passed with a phase of 90 degrees (or $\pi/2$ radians) to the eighth port 90.

Accordingly, the first RF QHRS 56 is provided substantially as a duplicate of the second RF QHRS 58 at the eighth port 90. As a result, the first RF QHRS 56 and the second RF QHRS 58 constructively interfere at the eighth port 90 to output the RF receive output signal 30 from the eighth port 90. Note that since the first RF QHRS 56 and the second RF QHRS 58 substantially cancel at the seventh port 88 due to destructive interference, very little or no power is transferred from the first RF QHRS 56 and the second RF QHRS 58 to the seventh port 88. Instead most, if not all, of the power in the first RF QHRS 56 and the second RF QHRS 58 is transferred to the eighth port 90 and provided in the RF receive output signal 30.

The impedance load 100 is coupled to the seventh port 88 of the second hybrid coupler 20'. The impedance load 100 may be a 50 Ohm load. Due to the phase-shifting provided by the first hybrid coupler 18' and the second hybrid coupler 20', spurious emissions from the second port 78 of the first hybrid coupler 18 would see a very high (theoretically infinite) impedance level at the eighth port 90 of the second hybrid coupler, but only the impedance load 100 at the seventh port 88. Thus, the spurious emissions are aggregated to be the aggregated noise signal 102 at the seventh port 88. The aggregated noise signal 102 is dissipated by the impedance load 100. Additionally, the eighth port 90 is isolated from the seventh port 88. As such, the seventh port 88 is substantially unresponsive to signals incident at the eighth port 90 and the eighth port 90 is substantially unresponsive to signals incident at the seventh port 88.

Figure 6B:
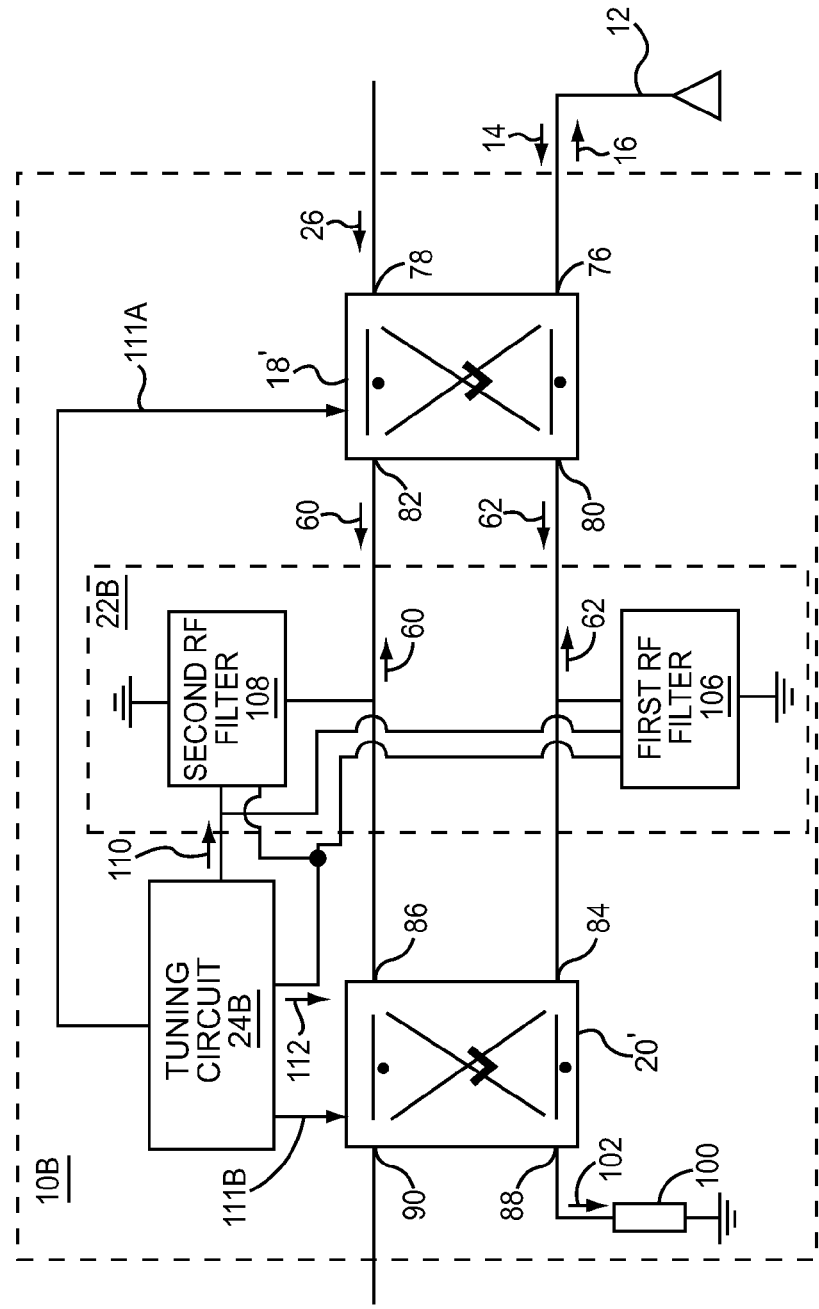
FIG. 6B illustrates the tunable RF duplexer shown in FIG. 5 along with a transmission signal flow.

FIG. 6B illustrates the tunable RF duplexer 10B along with the transmission signal flow. The first hybrid coupler 18' is operable to receive the RF transmission input signal 26 at the second port 78. The RF transmission input signal 26 operates in the RF transmission band, which is within the same RF communication band as the RF receive band of the RF receive input signal 14 (see FIG. 2A). The first hybrid coupler 18' is configured to split the RF transmission input signal 26 into the first RF QHTS 60 and the second RF QHTS 62. Since the first RF QHTS 60 and the second RF QHTS 62 are quadrature hybrids, the first RF QHTS 60 and the second RF QHTS 62 are approximately equal in power, but have a quadrature phase difference of 90 degrees or $\pi/2$ radians. The first hybrid coupler 18' is operable to output the first RF QHTS 60 from the fourth port 82 and to output the second RF QHTS 62 from the third port 80 in response to receiving the RF transmission input signal 26 at the second port 78.

The RF filter circuit 22B is tunable so as to reflect the first RF QHTS 60 and the second RF QHTS 62 back to the first hybrid coupler 18'. The frequency response of the RF filter circuit 22B defines a stopband and the RF filter circuit 22B is tunable so as to shift the stopband. For example, the stopband may be a notch that is shiftable. The tuning circuit 24B is configured to tune the frequency response of the RF filter circuit 22B so that the signal bandwidth of the first RF QHTS 60 and the signal bandwidth of the second RF QHTS 62 are each within the stopband of the RF filter circuit 22B. In this embodiment, the tuning circuit 24B is configured to tune a stopband of the second RF filter 108 within the signal bandwidth of the first RF QHTS 60 and to tune a stopband of the first RF filter 106 within the signal bandwidth of the second RF QHTS 62. To provide each of the stopbands, the first RF filter 106 and the second RF filter 108 each appear approximately as short circuits within the RF transmission band.

In this embodiment, the frequency response of the RF filter circuit 22B defines the stopband of the RF filter circuit 22B as a notch. The tuning circuit 24B may be configured to place the notch within the RF transmission band so that the notch is centered at the RF transmission signal frequency. More specifically, the frequency response of the first RF filter 106 defines its stopband as a notch. Similarly, the frequency response of the second RF filter 108 is a notch. The tuning circuit 24B is configured to generate the transmission tuning control output 112 such that variable reactive impedance components in both the first RF filter 106 and the second RF filter 108 are responsive to one or more signal levels of the transmission tuning control output 112 and adjust the variable impedance levels based on the one or more signal levels of the transmission tuning control output 112. As a result, the notch defined by the individual frequency response of the first RF filter 106 is shifted to include the signal bandwidth of the second RF QHTS 62. Also, the notch defined by the individual frequency response of the second RF filter 108 is shifted to include the signal bandwidth of the first RF QHTS

60. In other words, the notches defined by the individual frequency responses of the first RF filter 106 and the second RF filter 108 are placed within the RF transmission band.

Since the first RF filter 106 is coupled in shunt and operates approximately as a short in the RF transmission band, the first RF filter 106 reflects the second RF QHTS 62 back to the third port 80 of the first hybrid coupler 18'. Also, since the second RF filter 108 is coupled in shunt and operates approximately as a short in the RF transmission band, the second RF filter 108 reflects the first RF QHTS 60 back to the fourth port 82 of the first hybrid coupler 18'. Accordingly, the second hybrid coupler 20' is substantially isolated from the transmission signal flow. The first hybrid coupler 18' is configured to combine the first RF QHTS 60 and the second RF QHTS 62 into the RF transmission output signal 16. To combine the first RF QHTS 60 and the second RF QHTS 62 into the RF transmission output signal 16, the first hybrid coupler 18' is configured to pass the second RF QHTS 62 from the third port 80 to the first port 76. Additionally, the first hybrid coupler 18' is configured to pass the first RF QHTS 60 from the fourth port 82 to the first port 76. However, the first hybrid coupler 18' provides a quadrature phase shift to the first RF QHTS 60 from the fourth port 82 to the first port 76. Thus, the first RF QHTS 60 is provided substantially as a duplicate of the second RF QHTS 62 at the first port 76. For example, if the phase of the second RF QHTS 62 is 90 degrees at the third port 80, the second RF QHTS 62 has a phase of 90 degrees at the first port 76. Additionally, the phase of the first RF QHTS 60 at the fourth port 82 is approximately zero (0) degrees. However, due to the quadrature phase shift between the fourth port 82 and the first port 76, the first RF QHTS 60 has a phase of about 90 degrees at the first port 76. Accordingly, the first RF QHTS 60 and the second RF QHTS 62 constructively interfere at the first port 76 to output the RF transmission output signal 16 from the first port 76.

Also, note that the first hybrid coupler 18' is configured such that the quadrature phase shift at the second port 78 results in destructive interference between the first RF QHTS 60 and the second RF QHTS 62. Referring again to the previous example provided, at the second port 78, the first RF QHTS 60 appears to have a phase of zero degrees, but the second RF QHTS 62 appears to have a phase of 180 degrees. As a result, the first RF QHTS 60 and the second RF QHTS 62 are substantially cancelled at the second port 78. Consequently, most, if not all, of the power of the first RF QHTS 60 and the second RF QHTS 62 is transferred to the first port 76 and provided in the RF transmission output signal 16. The first hybrid coupler 18' is thus configured to output the RF transmission output signal 16 from the first port 76 in response to the first RF QHTS 60 being reflected back by the RF filter circuit 22B to the fourth port 82 and the second RF QHTS 62 being reflected back by the RF filter circuit 22B to the third port 80.

Note that spurious emissions from the first RF QHTS 60 and the second RF QHTS 62 may not be reflected by the RF filter circuit 22B. Instead, spurious noise emissions outside the stopband, may be passed toward the second hybrid coupler 20'. In this example, the spurious emissions would destructively interfere at the eighth port 90 and constructively interfere at the seventh port 88. Accordingly, these spurious emissions become part of the aggregated noise signal 102 and are dissipated by the impedance load 100. Therefore, the tunable RF duplexer 10B significantly reduces noise interference from the second port 78 of the first hybrid coupler 18' (see FIG. 3A) at the eighth port 90.

As shown in FIGS. 6A and 6B, the tunable RF duplexer 10B allows the receive signal flow and the transmission signal flow to be simultaneous. More specifically, the first port 76 of the first hybrid coupler 18' is configured to simultaneously receive the RF receive input signal 14 and output the RF transmission output signal 16 to and from the antenna 12. As a result, the RF transmission output signal 16 is output from the first port 76 while the RF receive input signal 14 is being simultaneously received at the first port 76. The tunable RF duplexer 10B can provide this functionality because the second port 78 is substantially isolated from the eighth port 90.

Figure 7:
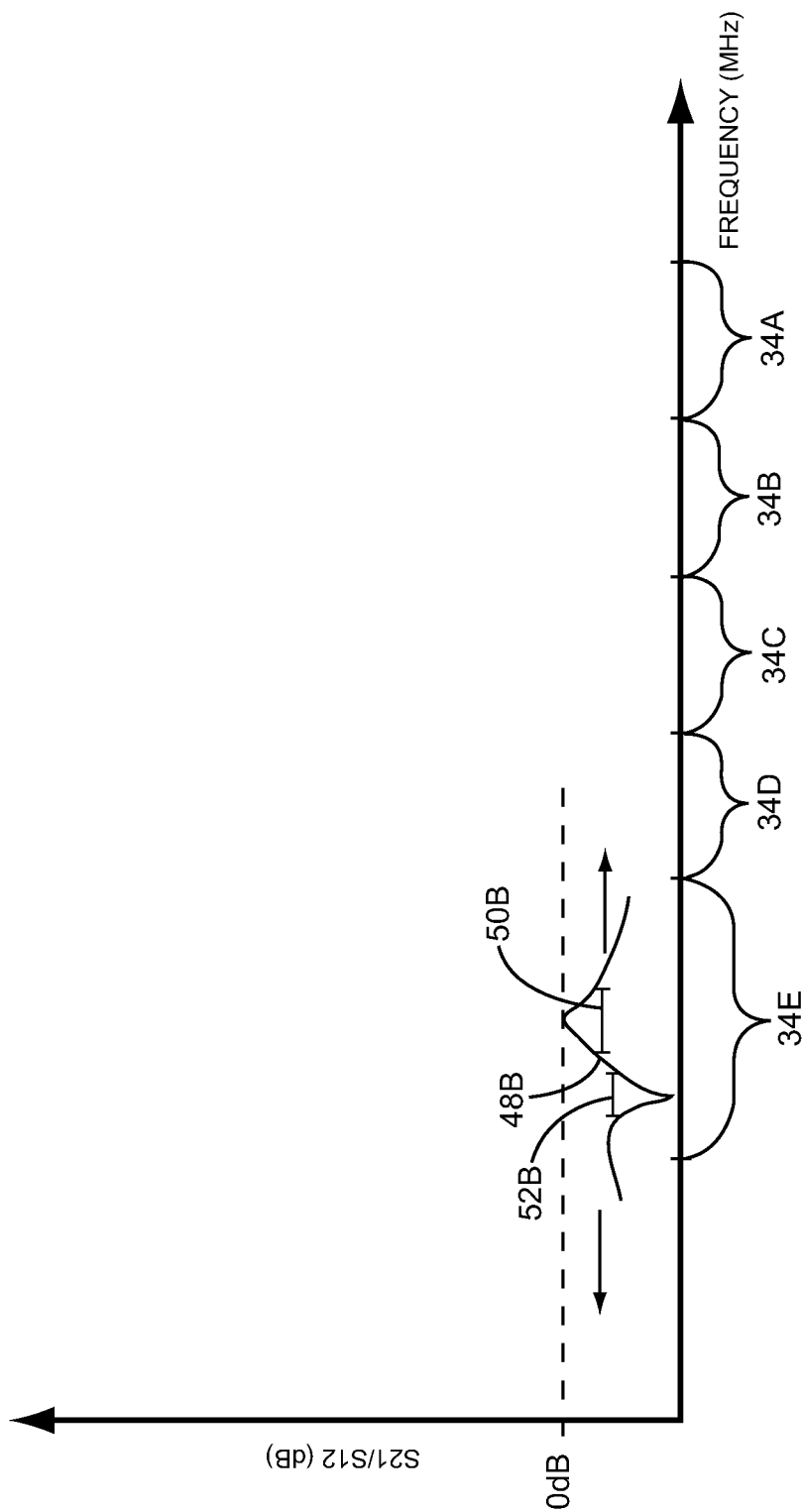
FIG. 7 illustrates one embodiment of a frequency response of an RF filter circuit in the tunable RF duplexer shown in FIGS. 6A and 6B wherein the frequency response defines a stopband and a passband.

Referring now to FIG. 7, FIG. 7 illustrates one embodiment of a frequency response 48B provided by the RF filter circuit 22B shown in FIGS. 6A and 6B. The frequency response 48B defines a passband 50B and a stopband 52B. The RF filter circuit 22B described in FIGS. 6A and 6B is tunable so that the RF communication band (referred to generically as element 34, and specifically as elements 34A-34E) can be switched to be any one of the plurality of different RF communication bands 34A-34E. The different RF communication bands 34A-34E may each define different RF receive band(s) and different RF transmission band(s) within each of the RF communication bands 34A-34E. Accordingly, the RF transmission input signal 26 (shown in FIGS. 6A-6B) and the RF receive input signal 14 (shown in FIGS. 6A-6B) may be in the respective RF receive band and RF transmission band of any of the different RF communication bands 34A-34E. Accordingly, the first RF QHRS 56, the second RF QHRS 58, and the RF receive output signal 30 would also operate within the RF receive band of the RF receive input signal 14. Similarly, the first RF QHTS 60, the second RF QHTS 62, and the RF transmission output signal 16 would operate in the respective RF transmission band of the RF transmission input signal 26.

When the RF communication band 34 is switched to be a different one of the plurality of RF communication bands 34A-34E, the tuning circuit 24B is operable to tune the frequency response 48B to the particular RF communication band 34A-34E. Since the RF communication band 34 has been switched, the first RF QHRS 56 and the second RF QHRS 58 are provided in the new RF communication band 34A-34E. In particular, the first RF QHRS 56 and the second RF QHRS 58 operate within the RF receive band of the new RF communication band 34A-34E. Also, since the RF communication band 34 has been switched to the new RF communication band 34A-34E, the first RF QHTS 60 and the second RF QHTS 62 are provided within the new RF communication band 34A-34E. In particular, the first RF QHTS 60 and the second RF QHTS 62 operate within the RF transmission band of the new RF communication band 34A-34E. The tuning circuit 24B tunes the passband 50B so as to pass the first RF QHRS 56 and the second RF QHRS 58 in response to the RF communication band 34 being switched to the new RF communication band 34A-34E. More particularly, the passband 50B is provided so as to include the RF receive band of the selected RF communication band 34A-34E. Similarly, the tuning circuit 24B shifts the stopband 52B to reflect the first RF QHTS 60 and the second RF QHTS 62 in response to the RF communication band 34 being switched to the new RF communication band 34A-34E. As such, the stopband 52B is shifted to include the RF transmission band of the selected RF communication band 34A-34E.

Figure 8A:
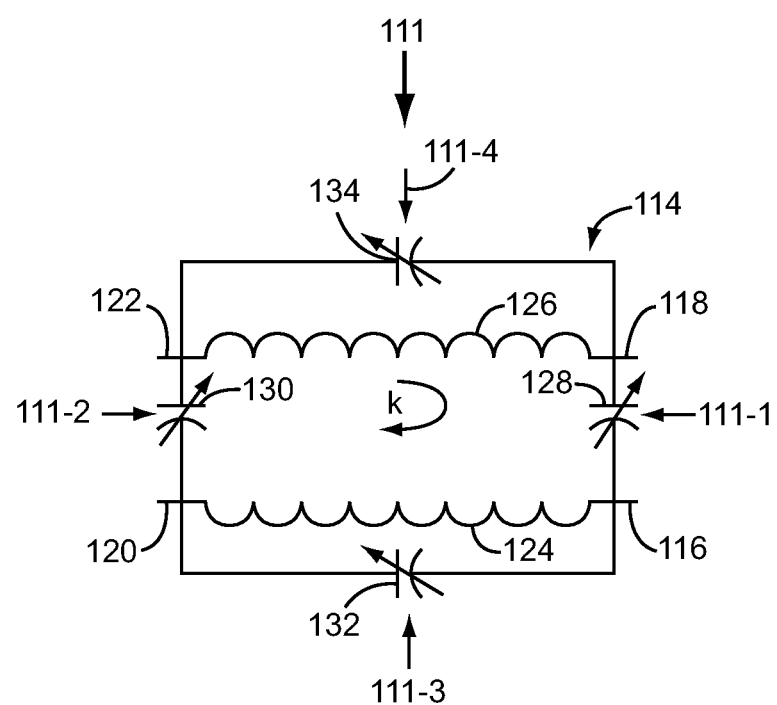
FIG. 8A illustrates one embodiment of a tunable hybrid coupler that may be provided in the tunable RF duplexer shown in FIGS. 6A and 6B.

Referring to FIGS. 6A, 6B, and 8A, FIG. 8A illustrates one embodiment of a tunable hybrid coupler 114. In practice, the tunable RF duplexer 10B shown in FIGS. 6A and 6B may not be able to provide infinite transmission/receive isolation. For example, impedance mismatches between the first hybrid coupler 18' and the second hybrid coupler 20' may result in small reflections and leaks that degrade transmission/receive isolation. To help reduce and/or eliminate these reflections and leaks, the first hybrid coupler 18' and the second hybrid coupler 20' are tunable. As mentioned above, the first hybrid coupler 18' and the second hybrid coupler 20' in FIGS. 6A and 6B may each be tunable. Accordingly, in one exemplary embodiment of the tunable RF duplexer 10B, the first hybrid coupler 18' and the second hybrid coupler 20' are each provided as the tunable hybrid coupler 114 of FIG. 8A.

The tunable hybrid coupler 114 shown in FIG. 8A is a lumped-element hybrid coupler. However, the tunable hybrid coupler 114 may be implemented using any suitable hybrid coupler topology. In alternative embodiments, the tunable hybrid coupler 114 may be a rat-race hybrid coupler, transmission line coupler, Wilkinson hybrid coupler, stripline hybrid coupler, microstrip hybrid coupler, ferrite core hybrid coupler, amalgamations of different types of hybrid couplers, and/or the like. The tunable hybrid coupler 114 has a first port 116, a second port 118, a third port 120, and a fourth port 122. With regard to the first hybrid coupler 18' shown in FIGS. 6A-6B, the first port 116 of the tunable hybrid coupler 114 corresponds to the first port 76 of the first hybrid coupler 18', the second port 118 of the tunable hybrid coupler 114 corresponds to the second port 78 of the first hybrid coupler 18', the third port 120 of the tunable hybrid coupler 114 corresponds to the third port 80 of the first hybrid coupler 18', and the fourth port 122 of the tunable hybrid coupler 114 corresponds to the fourth port 82 of the first hybrid coupler 18'. With regard to the second hybrid coupler 20' shown in FIGS. 6A-6B, the first port 116 of the tunable hybrid coupler 114 corresponds to the fifth port 84 of the second hybrid coupler 20', the second port 118 of the tunable hybrid coupler 114 corresponds to the sixth port 86 of the second hybrid coupler 20', the third port 120 of the tunable hybrid coupler 114 corresponds to the seventh port 88 of the second hybrid coupler 20', and the fourth port 122 of the tunable hybrid coupler 114 corresponds to the eighth port 90 of the second hybrid coupler 20'.

The tunable hybrid coupler 114 shown in FIG. 8A includes a first inductive element 124 and a second inductive element 126. The first inductive element 124 is connected in series between the fourth port 122 and the second port 118. The second inductive element is connected in series between the third port 120 and the first port 116. In this embodiment, the first inductive element 124 and the second inductive element 126 are inductively coupled and have a coupling coefficient k that is equal to approximately one (1). As such, the first inductive element 124 is operable to generate a magnetic flux in response to a current propagating on the first inductive element 124. The magnetic flux generated by the first inductive element 124 also flows within the second inductive element 126. The magnetic flux thus induces an electromotive force on the second inductive element 126 so as to generate a current that propagates on the second inductive element 126. However, a quadrature phase shift of 90 degrees or $\pi/2$ radians is provided from the first inductive element 124 to the second inductive element 126. The current that propagates on the second inductive element 126 has a phase of 90 degrees or $\pi/2$ radians with respect to the current that propagates through the first inductive element 124. Since the coupling coefficient k between the first inductive element 124 and the second inductive element 126 is one (1), the currents propagating on the first inductive element 124 and the second inductive element 126 have approximately the same magnitude. In other words, half of the power (ignoring parasitic and non-ideal circuit behavior) is transferred through the magnetic flux from the first inductive element 124 and the second inductive element 126.

Similarly, the second inductive element 126 is operable to generate a magnetic flux in response to a current propagating on the second inductive element 126. The magnetic flux generated by the second inductive element 126 also flows within the first inductive element 124. The magnetic flux thus induces an electromotive force on the first inductive element 124 so as to generate a current that propagates on the first inductive element 124. However, a quadrature phase shift of 90 degrees or $\pi/2$ radians is provided from the second inductive element 126 to the first inductive element 124. The current that propagates on the first inductive element 124 has a phase of 90 degrees or $\pi/2$ radians with respect to the current that propagates through the second inductive element 126. Since the coupling coefficient k between the second inductive element 126 and the first inductive element 124 is one (1), the currents propagating on the second inductive element 126 and the first inductive element 124 have approximately the same magnitude. In other words, half of the power (ignoring parasitic and non-ideal circuit behavior) is transferred through the magnetic flux from the second inductive element 126 to the first inductive element 124. In this embodiment, the first inductive element 124 has a first inductance and the second inductive element 126 has a second inductance, wherein the first inductance and the second inductance are the same.

Accordingly, the tunable hybrid coupler 114 is configured to split an RF signal received at one of the ports 116, 118, 120, 122 into a pair of RF quadrature hybrid signals (QHS). One of the RF QHS generated from the splitting of the RF signal propagates through the inductive element 124, 126 in series with the port 116, 118, 120, 122 that received the RF signal. The tunable hybrid coupler 114 is configured to output this RF QHS from the other port 120, 122, 116, 118 in series with the inductive element 124, 126. In this embodiment, the RF QHS output from the other port 120, 122, 116, 118 in series with the inductive element 124, 126 is phase-aligned with the RF signal. However, in alternative embodiments, a phase shift of Δ (i.e., such as +45 degrees or +$\pi/4$ radians) may be provided from the port 116, 118, 120, 122 that receives the RF signal and the other port 120, 122, 116, 118 in series with the inductive element 124, 126.

The other RF QHS generated from the splitting of the RF signal propagates through the other inductive element 126, 124 that is inductively coupled with the inductive element 124, 126. Each RF QHS has half the spectral power density of the RF signal received at the port 116, 118, 120, 122. The other RF QHS propagates in the same direction as the RF signal. Thus, the tunable hybrid coupler 114 is configured to output the other RF QHS propagating on the other inductive element 126, 124 at the port 122, 120, 118, 116. In this embodiment, the other RF QHS output from the port 122, 120, 118, 116 has a phase of +90 degrees or +$\pi/2$ radians with respect to the RF signal. However, in alternative embodiments, a phase shift of Δ±90 degrees (such as +135 degrees or +$3\pi/4$ radians, −45 degrees or −$\pi/4$ radians) may be provided from the port 116, 118, 120, 122 that receives the RF signal and the port 122, 120, 118, 116 that outputs the other RF QHS. Furthermore, note that that the port 118, 116, 122, 120 is isolated from the port 116, 118, 120, 122 that received the RF signal. As mentioned above, the first hybrid coupler 18' and the second hybrid coupler 20' of FIGS. 6A and 6B may each be implemented as the tunable hybrid coupler 114 shown in FIG. 8A. In this manner, the tunable RF duplexer 10B can simultaneously receive the RF receive input signal 14 and the RF transmission input signal 26, generate the first RF QHRS 56, the second RF QHRS 58, the first RF QHTS 60, and the second RF QHTS 62, and output the RF receive output signal 30 and the RF transmission output signal 16, as described above with respect to FIGS. 6A and 6B.

Referring to FIG. 8A, the tunable hybrid coupler 114 includes a variable capacitive element 128 and a variable capacitive element 130. The variable capacitive element 128 is connected between the first port 116 and the second port 118. The variable capacitive element 128 is operable to provide a first variable capacitance. As a result, a first variable capacitive impedance is presented by the variable capacitive element 128 between the first port 116 and the second port 118. In addition, the variable capacitive element 130 is coupled between the third port 120 and the fourth port 122. The variable capacitive element 130 is operable to provide a second variable capacitance. As a result, a second variable capacitive impedance is presented by the variable capacitive element 130 between the third port 120 and the fourth port 122.

Accordingly, the first inductive element 124, the second inductive element 126, the variable capacitive element 128, and the variable capacitive element 130 form an impedance matching network for a 4-port system. The impedance matching network provides impedance transformations so as to increase impedance matching between input and output impedances at the first port 116, the second port 118, the third port 120, and the fourth port 122. The term "input impedance" refers to an internal impedance at the respective port 116, 118, 120, 122 toward the tunable hybrid coupler 114. "Output impedance" refers to an external impedance at the respective port 116, 118, 120, 122 out of the tunable hybrid coupler 114. The impedance matching network also provides an impedance transformation so as to increase impedance matching between an impedance from the first port 116 to the second port 118 and an impedance from the third port 120 to the fourth port 122.

In this embodiment, the impedance matching network provides an impedance transformation that increases impedance matching between an input impedance and an output impedance at the first port 116. Additionally, the impedance matching network provides an impedance transformation that increases impedance matching between an input impedance and an output impedance at the second port 118. The impedance matching network also provides an impedance transformation that increases impedance matching between an input impedance and an output impedance at the third port 120. Finally, the impedance matching network provides an impedance transformation that increases impedance matching between an input impedance and an output impedance at the fourth port 122.

As shown in FIG. 8A, the tunable hybrid coupler 114 also includes a variable capacitive element 132 and a variable capacitive element 134. The variable capacitive element 132 is connected between the first port 116 and the third port 120 in parallel with the first inductive element 124. The variable capacitive element 132 is operable to provide a third variable capacitance. As a result, a third variable capacitive impedance is presented by the variable capacitive element 132 between the first port 116 and the third port 120 in parallel with the first inductive element 124. In addition, the variable capacitive element 134 is coupled between the second port 118 and the fourth port 122 in parallel with the inductive element 126. The variable capacitive element 134 is operable to provide a fourth variable capacitance. As a result, a fourth variable capacitive impedance is presented by the variable capacitive element 134 between the second port 118 and the fourth port 122 in parallel with the inductive element 126. The variable capacitive element 132 and the variable capacitive element 134 allow for more accurate tuning of the impedance transformations. Additionally, the variable capacitive element 132 in parallel with the first inductive element 124 can be used to define a notch. Similarly, the variable capacitive element 134 in parallel with the second inductive element 136 can also be used to define a notch.

Accordingly, the variable capacitive element 128, the variable capacitive element 130, the variable capacitive element 132, and the variable capacitive element 134 allow the tunable hybrid coupler 114 to be tuned. In this manner, the tunable hybrid coupler 114 is operable to provide impedance transformations to increase impedance matching of the input and output impedances at the first port 116, the second port 118, the third port 120, and the fourth port 122 within different RF communication bands. Ideally, the tunable hybrid coupler 114 perfectly matches the input impedances and the output impedances at each of the ports 116, 118, 120, 122. However, in practice, there may be some mismatches between input and output impedances despite the impedance transformations. An acceptable amount of mismatch may depend on the particular application for the tunable hybrid coupler 114 along with RF communication band specifications. For example, the tunable hybrid coupler 114 shown in FIG. 8A is sufficiently broadband such that the impedance transformations increase matching of the input and output impedances both within the transmission frequency band and the receive frequency band of a selected RF communication band. However, for any selected capacitance value of the variable capacitances, the tunable hybrid coupler 114 may not be capable of providing perfect matching within both the transmission frequency band and the receive frequency band and/or the transmission frequency and the receive frequency simultaneously. Therefore, in some circumstances, the variable capacitances may be selected at an interpolated point that does not provide perfect matching within or at either the transmission frequency band/transmission frequency or the receive frequency band/receive frequency.

The tunable hybrid coupler 114 is configured to received the hybrid control output 111 (in FIGS. 6A-6B, the first hybrid coupler 18' is operable to receive the first hybrid control output 111A and the second hybrid coupler 20' is operable to receive the second hybrid control output 111B). The hybrid control output 111 includes one or more hybrid control signals 111-1, 111-2, 111-3, and 111-4. Each of the variable capacitive elements 128, 130, 132, 134 is configured to set its respective variable capacitance in accordance with a signal level of a corresponding one of the hybrid control signals 111-1, 111-2, 111-3, and 111-4.

For example, the variable capacitive element 128 is configured to set the first variable capacitance in accordance with a signal level of the hybrid control signal 111-1. Additionally, the variable capacitive element 130 is configured to set the second variable capacitance in accordance with a signal level of the hybrid control signal 111-2. Furthermore, the variable capacitive element 132 is configured to set the third variable capacitance in accordance with a signal level of the hybrid control signal 111-3. Finally, the variable capacitive element 134 is configured to set the third variable capacitance in accordance with a signal level of the hybrid control signal 111-4. Thus, the first variable capacitance, the second variable capacitance, the third variable capacitance, and the fourth variable capacitance are each configured to be adjusted in accordance with the respective signal level of the corresponding one of the respective hybrid control signals 111-1, 111-2, 111-3, and 111-4. In this manner, the tunable hybrid coupler 114 can be tuned to increase impedance matching between input and output impedances at the ports 116, 118, 120, 122 within the different RF communication bands.

Figure 8B:
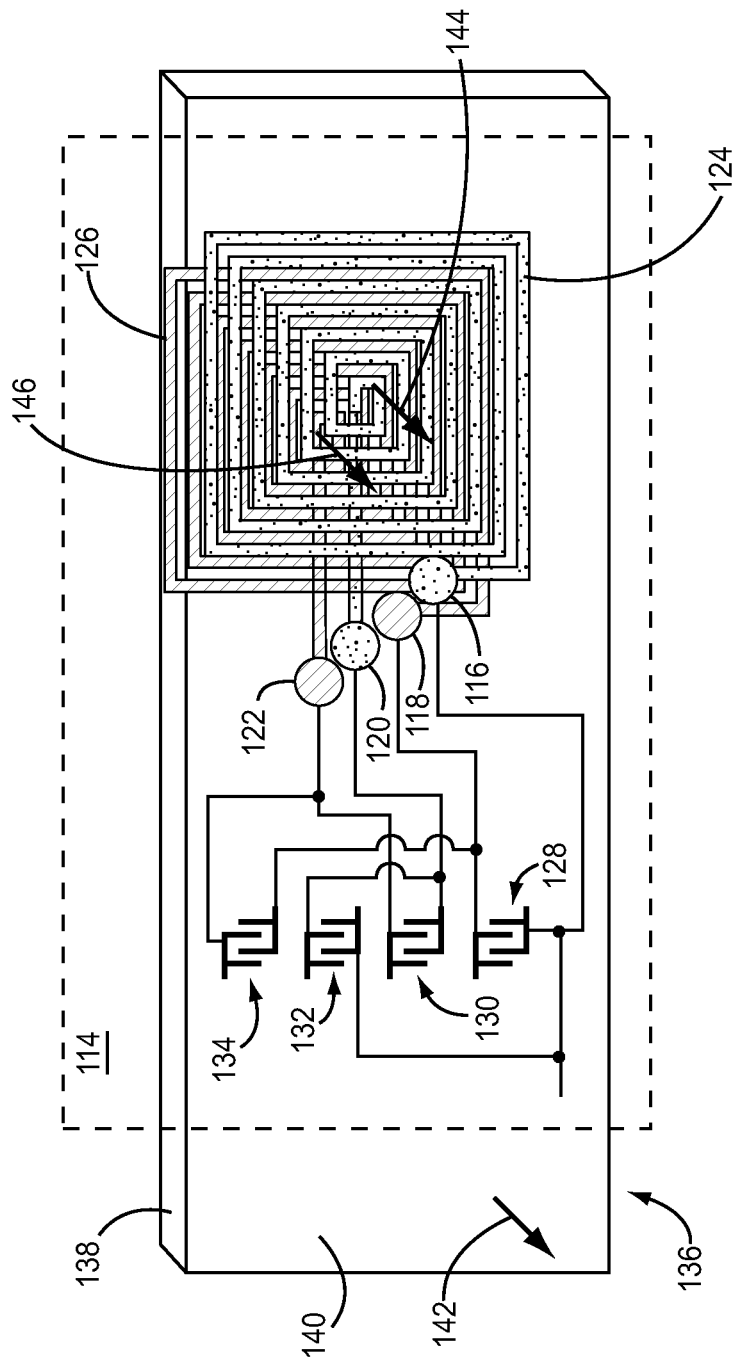
FIG. 8B illustrates one embodiment of the tunable hybrid coupler shown in FIG. 8A formed in a semiconductor substrate.

FIG. 8B illustrates one embodiment of the tunable hybrid coupler 114 formed on a semiconductor substrate 136. The semiconductor substrate 136 has a substrate body 138 formed from a wafer and/or doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers, insulating layers, and the like may be formed on one or more surfaces or within the substrate body 138 to provide terminals, traces, coils, connections, passive impedance elements, active semiconductor components, and/or the like. Also, any type of suitable semiconductor technology may be used to provide the topology of the semiconductor substrate 136. For example, the semiconductor technology may be Complementary Metal-On-Oxide Semiconductor technology (CMOS), BiComplementary Metal-On-Oxide Semiconductor technology (BiCMOS), Silicon-On-Insulator technology (SOI), and/or the like. In this embodiment, the semiconductor technology of the semiconductor substrate 136 is SOI, and thus the semiconductor material of the substrate body 138 is Si. Additionally, the substrate body 138 has a surface 140. The surface 140 thus defines a direction 142 normal to the surface 140. Terms in this disclosure referring to directional words such as "over" or "top" and "under" or "beneath" are made with respect to the direction 142 defined by the surface 140 of the substrate body 138. It should be noted that the first hybrid coupler 18', the second hybrid coupler 20', the first RF filter 106, and the second RF filter 108 shown in FIGS. 6A and 6B may be formed with the same semiconductor substrate 136, or one or more of these components may be formed on one or more separate semiconductor substrates.

As shown in FIG. 8B, the first port 116, the second port 118, the third port 120, and the fourth port 122 are each formed as a terminal on the surface 140 of the substrate body 138. In this manner, RF signals may be input and/or output from the tunable hybrid coupler 114. The first inductive element 124 is formed as a spiral coil on the surface 140. The first inductive element 124 and the first port 116, the second port 118, the third port 120, and the fourth port 122 may be formed from a metallic layer on the surface 140 that has been etched to provide the first inductive element 124 and the first port 116, the second port 118, the third port 120, and the fourth port 122. At a center of the spiral coil, the first inductive element 124 shown in FIG. 8B defines a central axis 144 approximately parallel to the direction 142 and thus normal to the surface 140. The first inductive element 124 is wound about the central axis 144 to form turns that have increasing circumferences the more outwardly the turns are from the central axis 144. Additionally, the second inductive element 126 is formed as a spiral coil within the substrate body 138. The second inductive element 126 may be formed from a metallic layer within the substrate body 138. The metallic layer may be formed on a layer beneath the surface 140 and etched to provide the second inductive element 126. At a center of the spiral coil, the second inductive element 126 shown in FIG. 8B defines a central axis 146 approximately parallel to the direction 142 and thus normal to the surface 140. The second inductive element 126 is wound about the central axis 146 to form turns that have increasing circumferences the more outwardly the turns are from the central axis 146. The first inductive element 124 and the second inductive element 126 are inductively coupled so that the magnetic flux of each one of the inductive elements 124, 126 induces a current in the other one of the inductive elements 126, 124.

FIG. 8B also illustrates the variable capacitive elements 128, 130, 132, and 134, which are formed as variable metal-insulator-metal capacitors in the semiconductor substrate 136. However, with the arrangement shown in FIG. 8B, the first inductive element 124 and the second inductive element 126 are configured so that there is a parasitic capacitance between the first inductive element 124 and the second inductive element 126. In this embodiment, the parasitic capacitance between the first inductive element 124 and the second inductive element 126 is significantly greater than a highest capacitive value of the variable capacitances provided by the variable capacitive elements 128, 130, 132, and 134. As such, the largest and greatest capacitive impedance is from this parasitic capacitance between the inductive elements 126, 124. Also, the parasitic capacitance sets a minimum capacitance between the first inductive element 124 and the second inductive element 126. While the variable capacitance of the variable capacitive element 128 can be used to adjust a capacitive impedance as seen between the first port 116 and the second port 118 and the variable capacitance of the variable capacitive element 130 can be used to adjust a capacitive impedance as seen between the third port 120 and the fourth port 122, the primary capacitive impedance between the first port 116 and the second port 118 and between the third port 120 and the fourth port 122 is from the parasitic capacitance between the first inductive element 124 and the second inductive element 126.

As such, the parasitic capacitance between the first inductive element 124 and the second inductive element 126 sets a minimum capacitance of the tunable hybrid coupler 114. Note that in this embodiment, there is a displacement along the surface 140 from the central axis 144 of the first inductive element 124 to the central axis 146 of the second inductive element 126. Since the first inductive element 124 and the second inductive element 126 are approximately parallel, this displacement sets the parasitic capacitance and the minimum capacitance of the tunable hybrid coupler 114. Accordingly, when manufacturing the tunable hybrid coupler 114, this displacement may be selected to set the parasitic capacitance in accordance with a frequency range of the different RF communication bands for a particular design application. During operation, adjustments can be made to the variable capacitances of the variable capacitive elements 128, 130, 132, and 134 so as to tune the tunable hybrid coupler 114 to a selected one of the different RF communication bands.

Figure 9A:
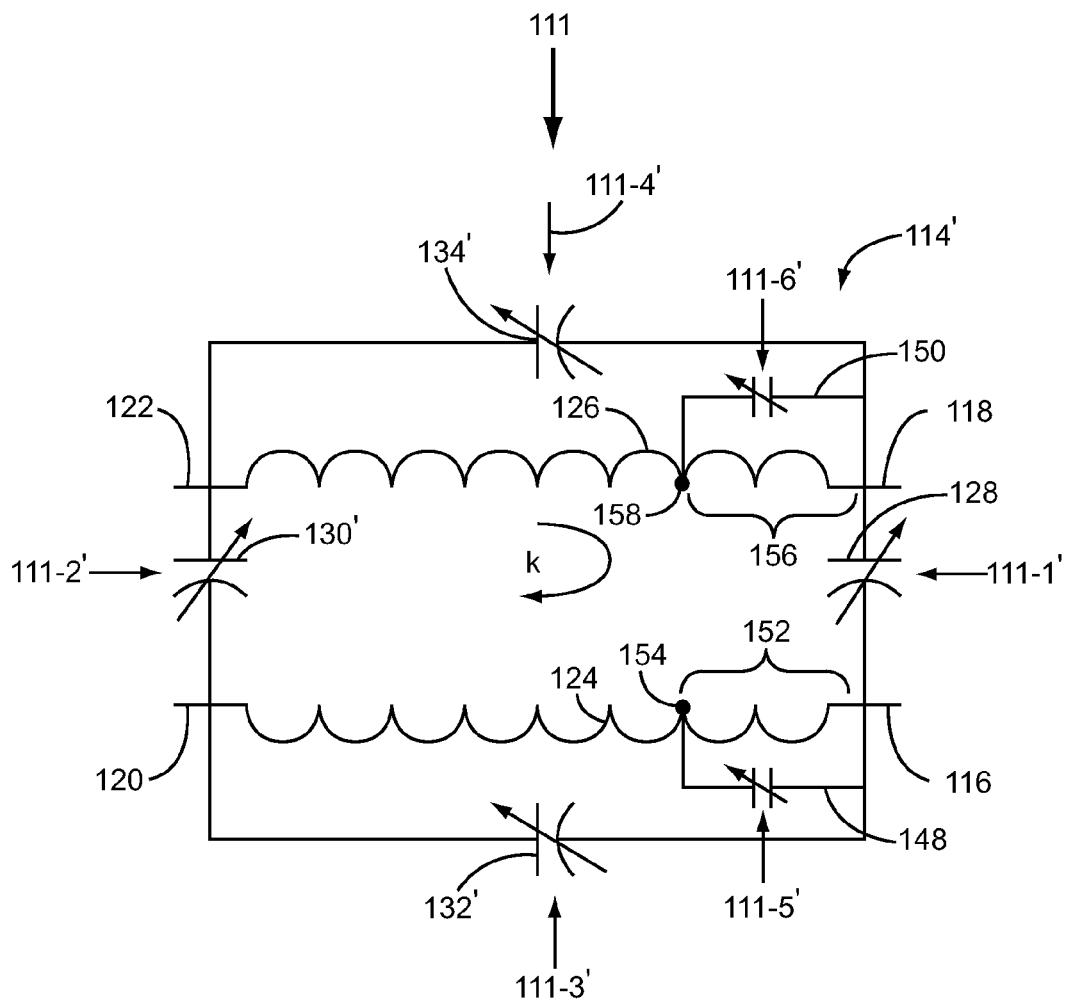
FIG. 9A illustrates one embodiment of a tunable hybrid coupler that may be provided in the tunable RF duplexer shown in FIGS. 6A and 6B.

FIG. 9A illustrates another embodiment of a tunable hybrid coupler 114'. Like the tunable hybrid coupler 114 shown in FIG. 8A, the tunable hybrid coupler 114' also has the first port 116, the second port 118, the third port 120, and the fourth port 122. Similarly, with regard to the first hybrid coupler 18' shown in FIGS. 6A-6B, the first port 116 of the tunable hybrid coupler 114' corresponds to the first port 76 of the first hybrid coupler 18', the second port 118 of the tunable hybrid coupler 114' corresponds to the second port 78 of the first hybrid coupler 18', the third port 120 of the tunable hybrid coupler 114' corresponds to the third port 80 of the first hybrid coupler 18', and the fourth port 122 of the tunable hybrid coupler 114' corresponds to the fourth port 82 of the first hybrid coupler 18'. With regard to the second hybrid coupler 20' shown in FIGS. 6A-6B, the first port 116 of the tunable hybrid coupler 114' corresponds to the fifth port 84 of the second hybrid coupler 20', the second port 118 of the tunable hybrid coupler 114' corresponds to the sixth port 86 of the second hybrid coupler 20', the third port 120 of the tunable hybrid coupler 114' corresponds to the seventh port 88 of the second hybrid coupler 20', and the fourth port 122 of the tunable hybrid coupler 114' corresponds to the eighth port 90 of the second hybrid coupler 20'.

Also like the tunable hybrid coupler 114 shown in FIG. 8A, the tunable hybrid coupler 114' includes the first inductive element 124 connected in series between the fourth port 122 and the second port 118 and includes the second inductive element 126 connected in series between the third port 120 and the first port 116. The first inductive element 124 and the second inductive element 126 are inductively coupled and have the coupling coefficient k that is equal to approximately one (1).

Referring to FIG. 9A, the tunable hybrid coupler 114' includes a variable capacitive element 128', a variable capacitive element 130', a variable capacitive element 132', a variable capacitive element 134', a variable capacitive element 148, and a variable capacitive element 150. The variable capacitive element 128' is connected between the first port 116 and the second port 118 so as to provide a first variable capacitance between the first port 116 and the second port 118.

As with the tunable hybrid coupler 114 illustrated in FIG. 8A, the first inductive element 124, the second inductive element 126, the variable capacitive element 128', and the variable capacitive element 130' shown in FIG. 9A form an impedance matching network for a 4-port system. The impedance matching network provides impedance transformations so as to increase impedance matching between input and output impedances at the first port 116, the second port 118, the third port 120, and the fourth port 122. Accordingly, the impedance matching network provides an impedance transformation that increases impedance matching between an input impedance and an output impedance at the first port 116. Additionally, the impedance matching network provides an impedance transformation that increases impedance matching between an input impedance and an output impedance at the second port 118. The impedance matching network also provides an impedance transformation that increases impedance matching between an input impedance and an output impedance at the third port 120. Finally, the impedance matching network provides an impedance transformation that increases impedance matching between an input impedance and an output impedance at the fourth port 122.

As shown in FIG. 9A, the tunable hybrid coupler 114' also includes the variable capacitive element 132' and the variable capacitive element 134'. The variable capacitive element 132' is connected between the first port 116 and the third port 120 in parallel with the first inductive element 124. The variable capacitive element 132' is operable to provide a third variable capacitance. As a result, a third variable capacitive impedance is presented by the variable capacitive element 132' between the first port 116 and the third port 120 in parallel with the first inductive element 124. In addition, the variable capacitive element 134' is coupled between the second port 118 and the fourth port 122 in parallel with the second inductive element 126. The variable capacitive element 134' is operable to provide a fourth variable capacitance. As a result, a fourth variable capacitive impedance is presented by the variable capacitive element 134' between the second port 118 and the fourth port 122 in parallel with the second inductive element 126. The variable capacitive element 132' and the variable capacitive element 134' allow for more accurate tuning of the impedance transformations. Additionally, the variable capacitive element 132' in parallel with the first inductive element 124 can be used to define a notch. Similarly, the variable capacitive element 134' in parallel with the second inductive element 126 can be also used to define a notch.

However, in order to have strong inductive coupling between the first inductive element 124 and the second inductive element 126, the first inductive element 124 and the second inductive element 126 may have relatively large inductances for any given minimum capacitance. The large inductances of the first inductive element 124 and the second inductive element 126 could restrict a frequency range for tuning the notches. In order to expand the frequency range for the notches, the tunable hybrid coupler 114' also includes the variable capacitive element 148 and the variable capacitive element 150. The variable capacitive element 148 is connected in parallel with a portion 152 of the first inductive element 124. More specifically, the variable capacitive element 148 of FIG. 9A is connected from the first port 116 to an intermediary node 154 of the first inductive element 124. The variable capacitive element 148 is operable to provide a fifth variable capacitance. As such, unlike the variable capacitive element 132', the variable capacitive element 148 does not have to resonate with the entire first inductive element 124 to create a notch. Rather, the variable capacitive element 148 is configured to create the notch by resonating with only the portion 152 of the first inductive element 124. Since the portion 152 of the first inductive element 124 has a smaller inductance than the entire first inductive element 124, the notch created by the portion 152 of the first inductive element 124 and the variable capacitive element 148 can be tuned to a greater frequency range than the frequency range of the notch created by the variable capacitive element 132' and the entire first inductive element 124.

Similarly, the variable capacitive element 150 is connected in parallel with a portion 156 of the second inductive element 126. More specifically, the variable capacitive element 150 of FIG. 9A is connected from the second port 118 to an intermediary node 158 of the second inductive element 126. The variable capacitive element 150 is operable to provide a sixth variable capacitance. As such, unlike the variable capacitive element 134', the variable capacitive element 150 does not have to resonate with the entire second inductive element 126 to create a notch. Rather, the variable capacitive element 150 is configured to create the notch by resonating with only the portion 156 of the second inductive element 126. Since the portion 156 of the second inductive element 126 has a smaller inductance than the entire second inductive element 126, the notch created by the portion 156 of the second inductive element 126 and the variable capacitive element 150 can be tuned to a greater frequency range than the frequency range of the notch created by the variable capacitive element 134' and the entire second inductive element 126.

The tunable hybrid coupler 114' is configured to receive the hybrid control output 111 (in FIGS. 6A-6B, the first hybrid coupler 18' is operable to receive the first hybrid control output 111A and the second hybrid coupler 20' is operable to receive the second hybrid control output 111B). However, in FIG. 9A, each of the variable capacitive elements 128', 130', 132', 134', 148, and 150 is a programmable capacitor array (PCA). As such, each one of the variable capacitive elements 128', 130', 132', 134', 148, and 150 includes a group of selectable capacitive components. These selectable capacitive components in each of the variable capacitive elements 128', 130', 132', 134', 148, and 150 can all have the same fixed capacitances, or they may have different fixed capacitances. To set the variable capacitance of each of the variable capacitive elements 128', 130', 132', 134', 148, and 150, a particular combination of the selectable capacitive components from a total set of permissible combinations is selected in each of the variable capacitive elements 128', 130', 132', 134', 148, and 150. Since the selectable capacitive components each have fixed capacitances, the variable capacitance of each of the variable capacitive elements 128', 130', 132', 134', 148, and 150 varies in a discrete manner depending on the particular combination of the selectable capacitive components that has been selected.

The hybrid control output 111 thus includes hybrid word outputs 111-1', 111-2', 111-3', 111-4', 111-5', 111-6' for the variable capacitive elements 128', 130', 132', 134', 148, and 150. Each one of the hybrid word outputs 111-1', 111-2', 111-3', 111-4', 111-5', 111-6' may include one or more bit signals so that each one of the hybrid word outputs 111-1', 111-2', 111-3', 111-4', 111-5', 111-6' represents a decoded word. The decoded word indicates the particular combination of selectable capacitive components that are to be selected in a corresponding one of the variable capacitive elements 128', 130', 132', 134', 148, and 150. Thus, the decoded word represents a particular discrete capacitance value for the variable capacitance of the corresponding one of the variable capacitive elements 128', 130', 132', 134', 148, and 150. Each of the variable capacitive elements 128', 130', 132', 134', 148, and 150 is configured to set the variable capacitance in accordance with a corresponding one of the hybrid word outputs 111-1', 111-2', 111-3', 111-4', 111-5', 111-6'.

For example, the variable capacitive element 128' is configured to set the first variable capacitance in accordance to a decoded word represented by the hybrid word output 111-1'. The decoded word represents a particular combination of the selectable capacitive components in the variable capacitive element 128'. The variable capacitive element 128' is configured to select the particular combination of the selectable capacitive components in the variable capacitive element 128' in response to the hybrid word output 111-1'. The variable capacitive element 130' is configured to set the second variable capacitance in accordance to a decoded word represented by the hybrid word output 111-2'. The decoded word represents a particular combination of the selectable capacitive components in the variable capacitive element 130'. The variable capacitive element 130' is configured to select the particular combination of the selectable capacitive components in the variable capacitive element 130' in response to the hybrid word output 111-2'. The variable capacitive element 132' is configured to set the third variable capacitance in accordance to a decoded word represented by the hybrid word output 111-3'. The decoded word represents a particular combination of the selectable capacitive components in the variable capacitive element 132'. The variable capacitive element 132' is configured to select the particular combination of the selectable capacitive components in the variable capacitive element 132' in response to the hybrid word output 111-3'. The variable capacitive element 134' is configured to set the fourth variable capacitance in accordance to a decoded word represented by the hybrid word output 111-4'. The decoded word represents a particular combination of the selectable capacitive components in the variable capacitive element 134'. The variable capacitive element 134' is configured to select the particular combination of the selectable capacitive components in the variable capacitive element 134' in response to the hybrid word output 111-4'. The variable capacitive element 148 is configured to set the fifth variable capacitance in accordance to a decoded word represented by the hybrid word output 111-5'. The decoded word represents a particular combination of the selectable capacitive components in the variable capacitive element 148. The variable capacitive element 148 is configured to select the particular combination of the selectable capacitive components in the variable capacitive element 148 in response to the hybrid word output 111-5'. The variable capacitive element 150 is configured to set the sixth variable capacitance in accordance to a decoded word represented by the hybrid word output 111-6'. The decoded word represents a particular combination of the selectable capacitive components in the variable capacitive element 150. The variable capacitive element 150 is configured to select the particular combination of the selectable capacitive components in the variable capacitive element 150 in response to the hybrid word output 111-6'.

Thus, the first variable capacitance, the second variable capacitance, the third variable capacitance, the fourth variable capacitance, the fifth variable capacitance, and the sixth variable capacitance are each configured to be adjusted in accordance with the respective decoded word represented by the corresponding one of the respective hybrid word outputs 111-1', 111-2', 111-3', 111-4', 111-5', 111-6'. In this manner, the tunable hybrid coupler 114' can be tuned to increase impedance matching between input and output impedances at the ports 116, 118, 120, 122 within the different RF communication bands.

Figure 9B:
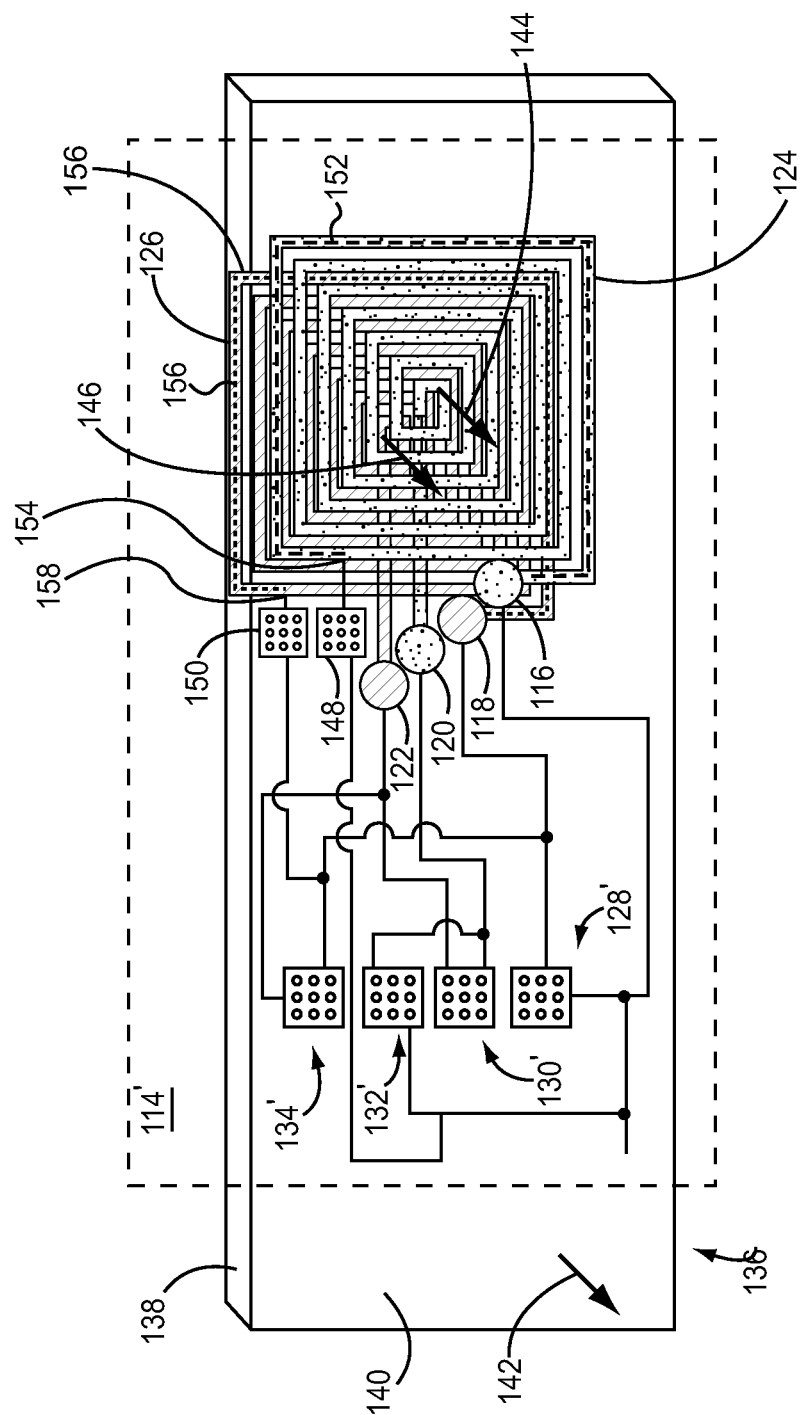
FIG. 9B illustrates one embodiment of the tunable hybrid coupler shown in FIG. 9A formed in a semiconductor substrate.

FIG. 9B illustrates one embodiment of the tunable hybrid coupler 114' formed on the semiconductor substrate 136. The first port 116, the second port 118, the third port 120, the fourth port 122, the first inductive element 124, and the second inductive element 126 are each formed in the same manner described above with respect to the tunable hybrid coupler 114 shown in FIG. 8B. However, unlike the tunable hybrid coupler 114 illustrated in FIG. 8B, each of the variable capacitive elements 128', 130', 132', and 134' in the tunable hybrid coupler 114' illustrated in FIG. 9B is formed as a PCA in the semiconductor substrate 136. Additionally, the tunable hybrid coupler 114' has the variable capacitive elements 148, 150, each of which is also formed as a PCA in the semiconductor substrate 136. The variable capacitive element 148 is connected in parallel with the portion 152 of the first inductive element 124. More specifically, the variable capacitive element 148 of FIG. 9B is connected from the first port 116 to the intermediary node 154 of the first inductive element 124. Additionally, the variable capacitive element 150 is connected in parallel with the portion 156 of the second inductive element 126. More specifically, the variable capacitive element 150 of FIG. 9A is connected from the second port 118 to the intermediary node 158 of the second inductive element 126. During operation, adjustments can be made to the variable capacitances of the variable capacitive elements 128', 130', 132', 134', 148, 150 so as to tune the tunable hybrid coupler 114' to a selected one of the different RF communication bands.

FIGS. 10A-10E illustrate embodiments of RF filters 160, 162, 164, 166, 168, respectively. Each of the RF filters 160, 162, 164, 166, 168, is a shunt coupled RF filter. Accordingly, the first RF filter 106 in the RF filter circuit 22B of FIGS. 6A and 6B can be provided as any one of the RF filters 160, 162, 164, 166, 168, shown in FIGS. 10A-10E. Similarly, the second RF filter 108 in the RF filter circuit 22B of FIGS. 6A and 6B can be provided as any one of the RF filters 160, 162, 164, 166, 168 shown in FIGS. 10A-10E.

Figure 10A:
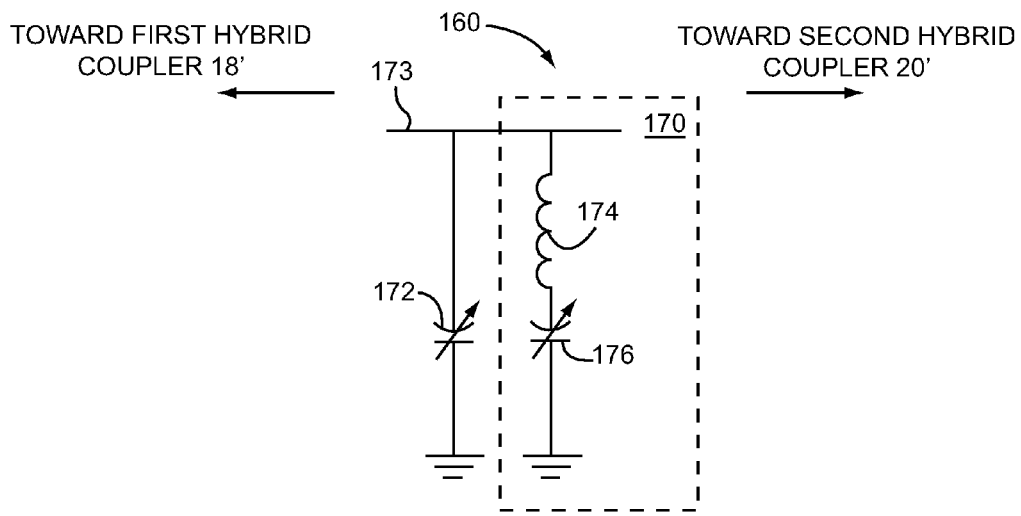
FIGS. 10A-10E illustrate different embodiments of an RF filter that may be used in the tunable RF duplexer shown in FIGS. 6A and 6B.

Referring now to FIG. 10A, as the first RF filter 106 (see FIG. 6A), the RF filter 160 is tunable to pass the first RF QHRS 56 (see FIG. 6A) to the second hybrid coupler 20' (see FIG. 6A), or, as the second RF filter 108 (see FIG. 6A), the RF filter 160 is tunable to pass the second RF QHRS 58 (see FIG. 6A) to the second hybrid coupler 20' (see FIG. 6A). Also, as the second RF filter 108 (see FIG. 6B) the RF filter 160 is tunable to reflect the first RF QHTS 60 (see FIG. 6B) back to the first hybrid coupler 18' (see FIG. 6B), or, as the first RF filter 106 (see FIG. 6B), the RF filter 160 is tunable to reflect the second RF QHTS 62 (see FIG. 6B) back to the first hybrid coupler 18' (see FIG. 6B). The RF filter 160 includes a series LC resonator 170 and a variable capacitive element 172 that are coupled in shunt between the first hybrid coupler 18' and the second hybrid coupler 20'. The series LC resonator 170 is thus connected in parallel with respect to the variable capacitive element 172. The variable capacitive element 172 is operable to provide a variable capacitance. Thus, in this embodiment, the variable capacitive element 172 is coupled to present a variable capacitive impedance from a line 173 to ground. The series LC resonator 170 includes an inductive element 174 and a variable capacitive element 176 coupled in series with respect to one another. The variable capacitive element 176 also has a variable capacitance. The series LC resonator 170 is therefore tunable by adjusting the variable capacitance of the variable capacitive element 176. Thus, in this embodiment, the series LC resonator 170 is coupled to present a variable reactive impedance from the line 173 to ground.

The RF filter 160 has a frequency response that defines a stopband (i.e., a notch). The series LC resonator 170 operates approximately as a short circuit at a series resonant frequency of the series LC resonator 170. Accordingly, the stopband of the RF filter 160 is transposed, shifting the series resonant frequency, which is done in this embodiment by adjusting the variable capacitance of the variable capacitive element 176. To do this, the variable capacitance of the variable capacitive element 176 is set in response to the transmission tuning control output 112. The transmission tuning control output 112 either represents a decoded word or has a signal level that indicates the variable capacitance value for setting the variable capacitance of the variable capacitive element 176. In this manner, the series resonant frequency is set at approximately the transmission frequency of the RF transmission input signal 26 (see FIGS. 6A-6B), and the stopband is shifted within the RF transmission band of the RF transmission input signal 26 (see FIGS. 6A-6B).

The variable capacitive element 172 and the series LC resonator 170 form a parallel LC resonator. The RF filter 160 thus operates approximately as an open circuit at a parallel resonant frequency of the parallel LC resonator. The frequency response of the RF filter 160 thus also defines a passband. The parallel resonant frequency is equal to approximately the series resonant frequency plus a frequency offset. The frequency offset is determined in accordance to the variable capacitance of the variable capacitive element 172. Accordingly, the frequency offset of the RF filter 160 from the series resonant frequency can be transposed by adjusting the variable capacitance of the variable capacitive element 176. To do this, the variable capacitance of the variable capacitive element 176 is set in response to the receive control output 110. The receive control output 110 either represents a decoded word or has a signal level that indicates the variable capacitance value for setting the variable capacitance of the variable capacitive element 172. In this manner, the parallel resonant frequency is set at approximately the receive frequency of the RF receive input signal 14 (see FIGS. 6A-6B), and the passband is shifted within the RF receive band of the RF receive input signal 14 (see FIGS. 6A-6B). The RF filter 160 demonstrates good performance when operating in 3G and 4G RF communication bands. However, RF communication bands with smaller duplex offsets between the RF transmission band and the RF communication band, such as Long Term Evolution (LTE) RF communication bands, require a higher quality factor performance.

Figure 10B:
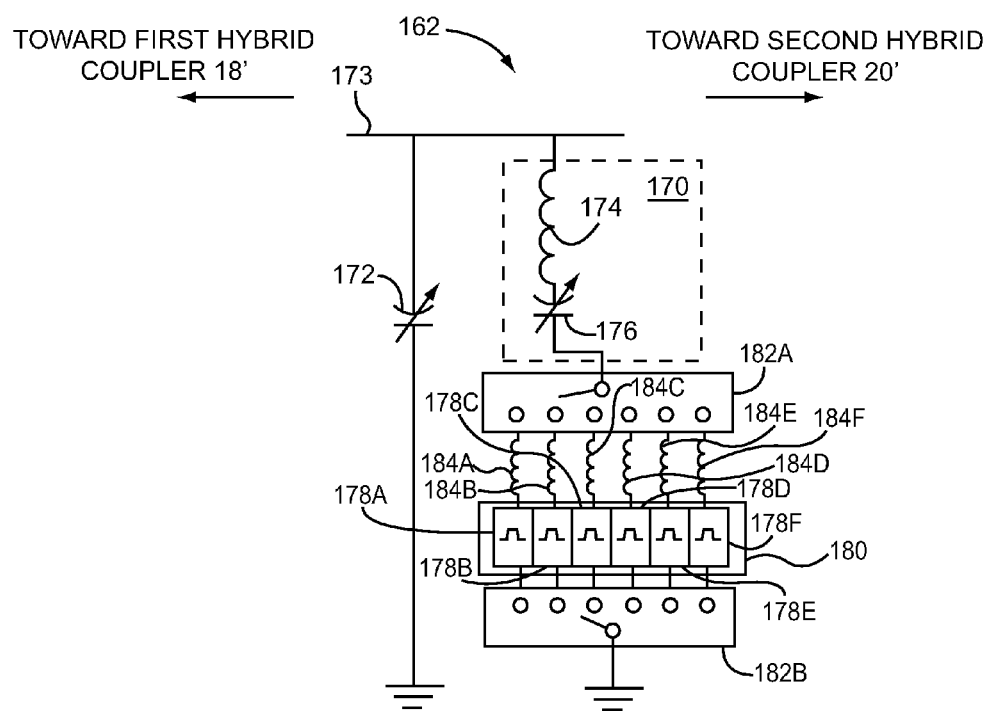

FIG. 10B illustrates an embodiment of the RF filter 162. As the first RF filter 106 (see FIG. 6A), the RF filter 162 is tunable to pass the first RF QHRS 56 (see FIG. 6A) to the second hybrid coupler 20' (see FIG. 6A), or, as the second RF filter 108 (see FIG. 6A), the RF filter 162 is tunable to pass the second RF QHRS 58 (see FIG. 6A) to the second hybrid coupler 20' (see FIG. 6A). Also, as the second RF filter 108 (see FIG. 6B), the RF filter 162 is tunable to reflect the first RF QHTS 60 (see FIG. 6B) back to the first hybrid coupler 18' (see FIG. 6B), or, as the first RF filter 106 (see FIG. 6B), the RF filter 162 is tunable to reflect the second RF QHTS 62 (see FIG. 6B) back to the first hybrid coupler 18' (see FIG. 6B). In this embodiment, the RF filter 162 has a plurality of SAW resonators (referred to generically as element 178, and specifically as elements 178A-178F). The SAW resonators 178 are formed on a piezo-electric substrate 180. These SAW resonators 178 are selectable by a set of single-pole multiple-throw switches (referred to generically as element 182, and specifically as elements 182A and 182B). Alternatively, the RF filter 162 (and the RF filters 164, 166, and 168) may only include either the single-pole multiple-throw switch 182A (and not the single-pole multiple-throw switch 182B) or the single-pole multiple-throw switch 182B (and not the single-pole multiple-throw switch 182A). In some embodiments, providing only the single-pole multiple-throw switch 182A (and not the single-pole multiple-throw switch 182B) or the single-pole multiple-throw switch 182B (and not the single-pole multiple-throw switch 182A) has provided for a better quality factor in comparison to using both of the single-pole multiple-throw switches 182A, 182B in series.

Each of the SAW resonators 178 in FIG. 10B corresponds to a different RF communication band. Essentially, each of the SAW resonators 178 is configured to present an inductance in series with a first capacitance and a second capacitance in parallel with the inductance in series with the first capacitance. Each of the SAW resonators 178 thus operates approximately as a short circuit at a series resonant frequency of the inductance in series with the first capacitance. Additionally, each of the SAW resonators 178 thus operates approximately as a open circuit at a parallel resonant frequency of the second capacitance in parallel with the inductance in series with the first capacitance. The inductance, the first capacitance, and the second capacitance of each of the SAW resonators 178 have different values. As such, a stopband and a passband defined by a frequency response of the RF filter 162 are tuned discretely by selecting a different one of the SAW resonators 178. The RF filter 162 shown in FIG. 10B has SAW resonators 178 for six different RF communication bands. Optionally, each of the SAW resonators 178 is connected in series with an inductive element (referred to generically as elements 184, and specifically as elements 184A-184F). Each of the inductive elements 184 has a different inductance.

The SAW resonator 178A is selectable to set the stopband of the RF filter 162 within a first RF transmission band of a first RF communication band and to set the passband within a first RF receive band of the first RF communication band. The inductance of the inductive element 184A provides a shift in the series resonant frequency and the parallel resonant frequency so as to more accurately set the stopband and the passband within the first RF communication band. The SAW resonator 178B is selectable to set the stopband of the RF filter 162 within a second RF transmission band of a second RF communication band and to set the passband within a second RF receive band of the second RF communication band. The inductance of the inductive element 184B provides a shift in the series resonant frequency and the parallel resonant frequency so as to more accurately set the stopband and the passband within the second RF communication band. The SAW resonator 178C is selectable to set the stopband of the RF filter 162 within a third RF transmission band of a third RF communication band and to set the passband within a third RF receive band of the third RF communication band. The inductance of the inductive element 184C provides a shift in the series resonant frequency and the parallel resonant frequency so as to more accurately set the stopband and the passband within the third RF communication band. The SAW resonator 178D is selectable to set the stopband of the RF filter 162 within a fourth RF transmission band of a fourth RF communication band and to set the passband within a fourth RF receive band of the fourth RF communication band. The inductance of the inductive element 184D provides a shift in the series resonant frequency and the parallel resonant frequency so as to more accurately set the stopband and the passband within the fourth RF communication band. The SAW resonator 178E is selectable to set the stopband of the RF filter 162 within a fifth RF transmission band of a fifth RF communication band and to set the passband within a fifth RF receive band of the fifth RF communication band. The inductance of the inductive element 184E provides a shift in the series resonant frequency and the parallel resonant frequency so as to more accurately set the stopband and the passband within the fifth RF communication band. The SAW resonator 178F is selectable to set the stopband of the RF filter 162 within a sixth RF transmission band of a sixth RF communication band and to set the passband within a sixth RF receive band of the sixth RF communication band. The inductance of the inductive element 184E provides a shift in the series resonant frequency and the parallel resonant frequency so as to more accurately set the stopband and the passband within the sixth RF communication band.

In this embodiment, the series LC resonator 170 described above with respect to FIG. 10A is connected in series with the single-pole multiple-throw switch 182A. Thus, the series LC resonator 170 is configured to be connected in series with each of the SAW resonators 178 when a particular one of the SAW resonators 178 is selected. As mentioned above, the stopband and the passband defined by the frequency response of the RF filter 162 are tuned discretely by selecting one of the different SAW resonators 178. The series LC resonator 170 shown in FIG. 10B is tunable so as to further shift the series resonant frequency of the selected one of the SAW resonators 178. In this manner, the series LC resonator 170 is configured to provide additional and more granular tuning of the series resonant frequency. The transmission tuning control output 112 either represents a decoded word or has a signal level that indicates the variable capacitance value for setting the variable capacitance of the variable capacitive element 176. The variable capacitive element 172 described above with respect to FIG. 10A also is connected in shunt with the line 173 in FIG. 10B. In this manner, the second variable capacitor is tunable so as to adjust the frequency offset of the parallel resonant frequency from the series resonant frequency. The receive control output 110 either represents a decoded word or has a signal level that indicates the variable capacitance value for setting the variable capacitance of the variable capacitive element 172.

To select each of the SAW resonators 178, the transmission tuning control output 112 may include a decoded word to operate the single-pole multiple-throw switch 182A and may include a decoded word to operate the single-pole multiple-throw switch 182B. The decoded words indicate which of the SAW resonators 178 is to be selected. The single-pole multiple-throw switch 182A and the single-pole multiple-throw switch 182B are configured to select the appropriate one of the SAW resonators 178 in response to the decoded words in the transmission tuning control output 112. The RF filter 162 with the SAW resonators 178 provides very good system performance with LTE communication bands because the SAW resonators 178 have a higher quality factor performance. However, the RF filter 160 shown in FIG. 10A may provide better performance with respect to 3G/4G RF communication bands with larger duplex offsets than the RF filter 162 shown in FIG. 10B.

Figure 10C:
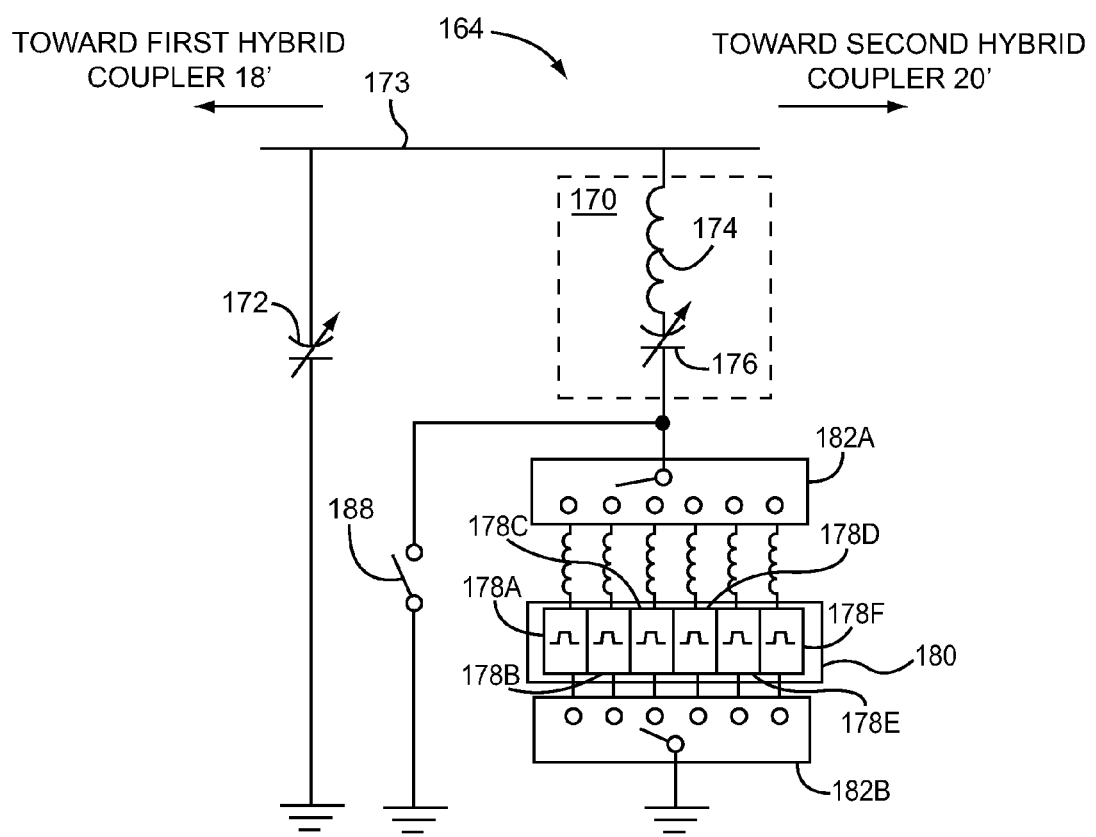

FIG. 10C illustrates the RF filter 164. As the first RF filter 106 (see FIG. 6A), the RF filter 164 is tunable to pass the first RF QHRS 56 (see FIG. 6A) to the second hybrid coupler 20' (see FIG. 6A), or, as the second RF filter 108 (see FIG. 6A) the RF filter 164 is tunable to pass the second RF QHRS 58 (see FIG. 6A) to the second hybrid coupler 20' (see FIG. 6A). Also, as the second RF filter 108 (see FIG. 6B), the RF filter 164 is tunable to reflect the first RF QHTS 60 (see FIG. 6B) back to the first hybrid coupler 18' (see FIG. 6B), or, as the first RF filter 106 (see FIG. 6B), the RF filter 164 is tunable to reflect the second RF QHTS 62 (see FIG. 6B) back to the first hybrid coupler 18' (see FIG. 6B). The RF filter 164 is an amalgamation of the RF filter 160 shown in FIG. 10A and the RF filter 162 shown in FIG. 10B. In particular, the RF filter 164 includes a switchable ground path 186 connected in shunt between the series LC resonator 170 and the single-pole multiple-throw switch 182A. The switchable ground path 186 includes a switch 188. When the switch 188 is in a closed state, the SAW resonators 178 are bypassed and the RF filter 164 operates in the same manner as the RF filter 160 described above with respect to FIG. 10A. However, when the switch 188 is in an open state, the RF filter 164 operates in the same manner as the RF filter 162 described above with respect to FIG. 10B.

Figure 10D:
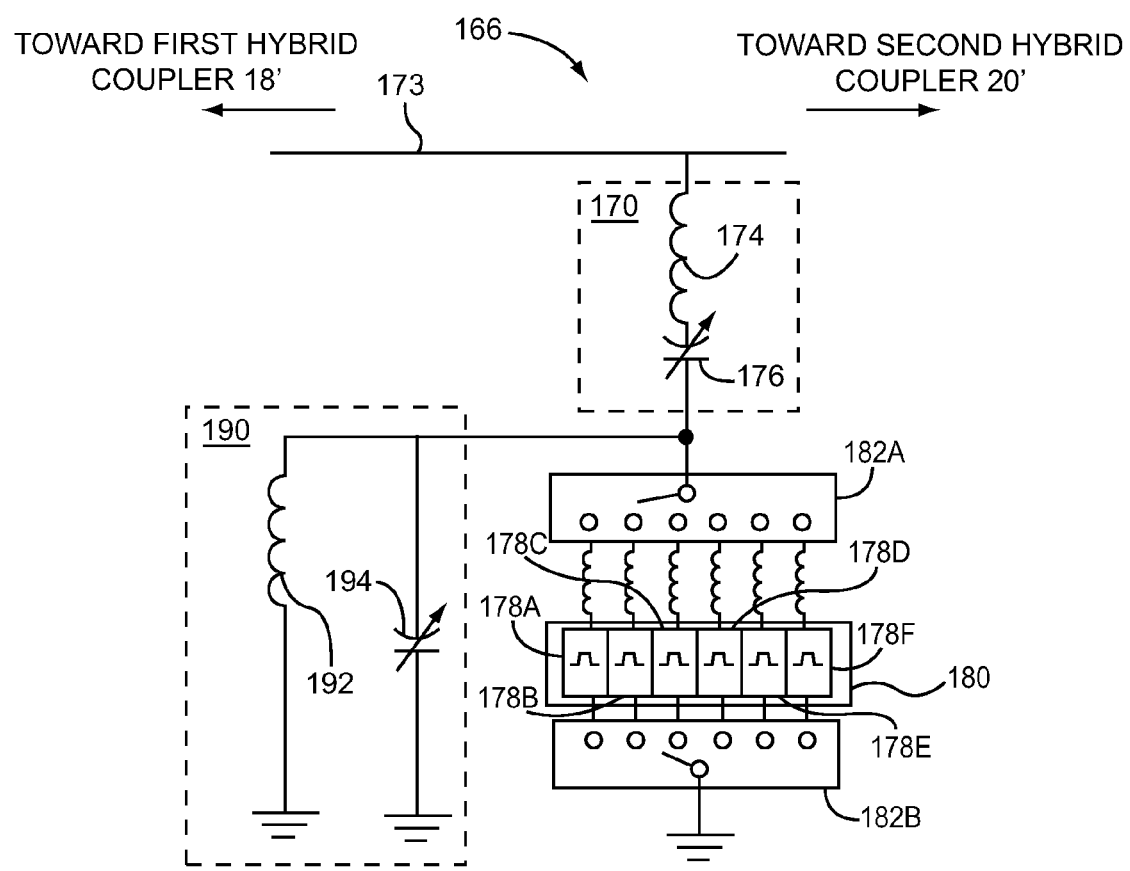

FIG. 10D illustrates the RF filter 166. As the first RF filter 106 (see FIG. 6A), the RF filter 166 is tunable to pass the first RF QHRS 56 (see FIG. 6A) to the second hybrid coupler 20' (see FIG. 6A), or, as the second RF filter 108 (see FIG. 6A), the RF filter 166 is tunable to pass the second RF QHRS 58 (see FIG. 6A) to the second hybrid coupler 20' (see FIG. 6A). Also, as the second RF filter 108 (see FIG. 6B), the RF filter 166 is tunable to reflect the first RF QHTS 60 (see FIG. 6B) back to the first hybrid coupler 18' (see FIG. 6B), or, as the first RF filter 106 (see FIG. 6B) the RF filter 166 is tunable to reflect the second RF QHTS 62 (see FIG. 6B) back to the first hybrid coupler 18' (see FIG. 6B). The RF filter 166 is similar to the RF filter 162 described above with respect to FIG. 10B except that the RF filter 166 of FIG. 10D does not have the variable capacitive element 172 connected in shunt with respect to the line 173. Instead, the RF filter 166 has a parallel LC resonator 190 connected in shunt between the series LC resonator 170 and the single-pole multiple-throw switch 182A. As such, the parallel LC resonator 190 is configured to be connected in parallel with each of the SAW resonators 178 when one of the SAW resonators 178 is selected. In this manner, the parallel LC resonator 190 is tunable so as to adjust the frequency offset of the parallel resonant frequency of the selected one of the SAW resonators 178 from the series resonant frequency of the selected one of the SAW resonators 178.

The parallel LC resonator 190 shown in FIG. 10D includes an inductive element 192 and a variable capacitive element 194. The inductive element 192 and the variable capacitive element 194 are connected in parallel with respect to one another. The variable capacitive element 194 has a variable capacitance and the inductive element 192 has a fixed inductance. To tune the parallel LC resonator 190, the receive control output 110 either represents a decoded word or has a signal level that indicates the variable capacitance value for setting the variable capacitance of the variable capacitive element 194.

Figure 10E:
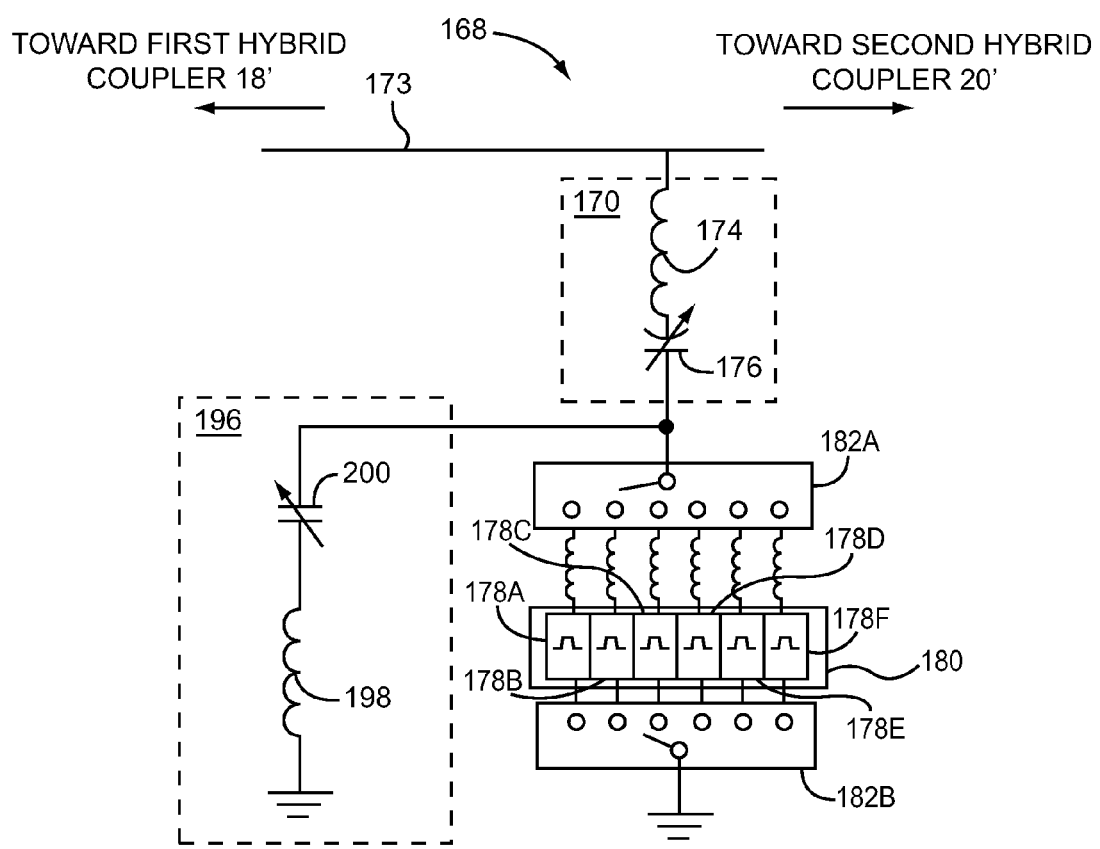

FIG. 10E illustrates the RF filter 168. As the first RF filter 106 (see FIG. 6A), the RF filter 168 is tunable to pass the first RF QHRS 56 (see FIG. 6A) to the second hybrid coupler 20' (see FIG. 6A), or, as the second RF filter 108 (see FIG. 6A), the RF filter 168 is tunable to pass the second RF QHRS 58 (see FIG. 6A) to the second hybrid coupler 20' (see FIG. 6A). Also, as the second RF filter 108 (see FIG. 6B), the RF filter 168 is tunable to reflect the first RF QHTS 60 (see FIG. 6B) back to the first hybrid coupler 18' (see FIG. 6B), or, as the first RF filter 106 (see FIG. 6B), the RF filter 168 is tunable to reflect the second RF QHTS 62 (see FIG. 6B) back to the first hybrid coupler 18' (see FIG. 6B). The RF filter 168 is similar to the RF filter 166 described above with respect to FIG. 10D except that instead of having the parallel LC resonator 190 of FIG. 10D, the RF filter 168 of FIG. 10E has a series LC resonator 196. More specifically, the series LC resonator 196 is connected in shunt between the series LC resonator 170 and the single-pole multiple-throw switch 182A. As such, the series LC resonator 196 is configured to be connected in parallel with each of the SAW resonators 178 when a selected one of the SAW resonators 178 is selected. In this manner, the series LC resonator 196 is tunable so as to adjust the frequency offset of the parallel resonant frequency of the selected one of the SAW resonators 178 from the series resonant frequency of the selected one of the SAW resonators 178.

The series LC resonator 196 shown in FIG. 10E includes an inductive element 198 and a variable capacitive element 200. The inductive element 198 and the variable capacitive element 200 are connected in series with respect to one another. The variable capacitive element 200 has a variable capacitance and the inductive element 198 has a fixed inductance. To tune the parallel LC resonator 200, the receive control output 110 either represents a decoded word or has a signal level that indicates the variable capacitance value for setting the variable capacitance of the variable capacitive element 200.

Figure 11A:
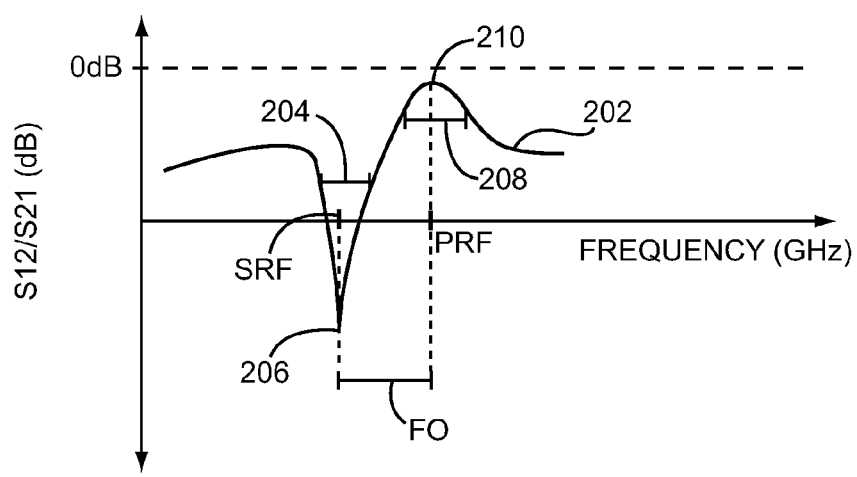
FIG. 11A illustrates an exemplary frequency response of any one of the RF filters shown in FIGS. 10A-10E.

Referring now to FIG. 11A, FIG. 11A illustrates an exemplary frequency response 202 of any one of the RF filters 160, 162, 164, 166, 168 shown in FIGS. 10A-10E. The frequency response 202 defines a stopband 204 as a result of the series resonant frequency (SRF). A minima 206 of the stopband 204 is set at the series resonant frequency (SRF). Changing the series resonant frequency (SRF) thereby shifts the stopband 204. The frequency response 202 for each of the RF filters 160, 162, 164, 166, 168 also defines a passband 208 where a maxima 210 of the passband 208 is set at the parallel resonant frequency (PRF). However, the parallel resonant frequency (PRF) is a function of the series resonant frequency (SRF). As previously discussed, the parallel resonant frequency (PRF) is the series resonant frequency (SRF) plus the frequency offset (FO).

Figure 11B:
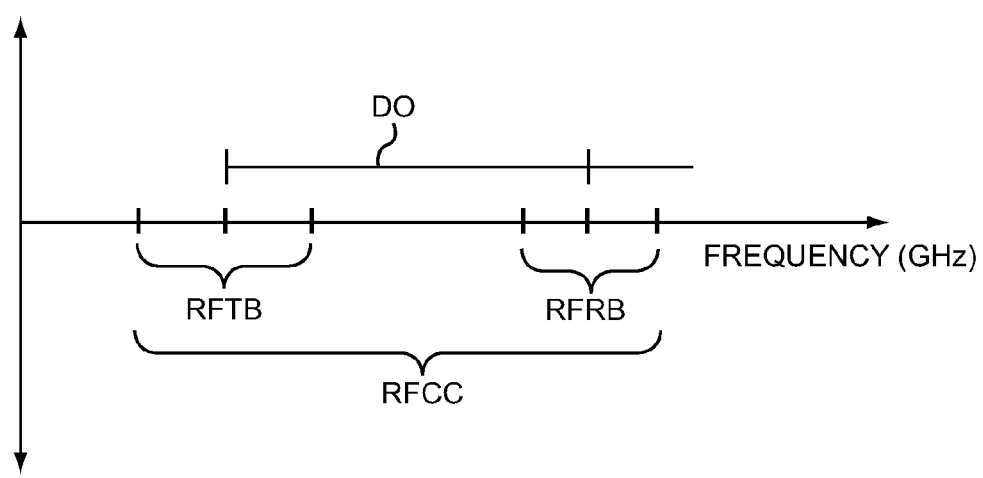
FIG. 11B illustrates an RF communication channel having an RF receive band and an RF transmission band separated by a duplex offset.

Referring now to FIGS. 11A and 11B, FIG. 11B illustrates an RF communication channel (RFCC) having an RF receive band (RFRB) and an RF transmission band (RFTB) separated by a duplex offset (DO). The RF receive band (RFRB) is has a higher frequency range than the RF transmission band (RFTB). By tuning the series resonant frequency (SRF) to be at a frequency within the RF transmission band (RFTB), the minima 206 is shifted and the stopband 204 is placed within the RF transmission band (RFTB). The frequency offset (FO) can then be adjusted to set the frequency offset (FO) to the duplex offset (DO) of an RF communication channel (RFCC). In this manner, the maxima 210 is shifted and the passband 208 is placed within the RF receive band (RFRB) of the RF communication channel (RFCC). However, the frequency offset (FO) provided by the RF filters 160, 162, 164, 166, 168 shown in FIGS. 10A-10E cannot be negative. Thus, the RF filters 160, 162, 164, 166, 168 are configured to operate with the RF communication channels, like the RF communication channel (RFCC), where the RF receive band (RFRB) has the higher frequency range in comparison to the RF transmission band (RFTB). Most RF communication channels defined by RF communication specifications and/or RF communication standards have the RF receive band (RFRB) with the higher frequency range. However, a few RF communication channels, particularly certain RF communication channels defined by LTE RF communication standards, have an RF transmission band at a higher frequency range than the RF receive band. In this case, the RF filters 160, 162, 164, 166, 168 in and of themselves would not be able to set the passband 208 within the RF receive band at a lower frequency range than the RF transmission band. This is because the frequency offset (FO) has to be positive and thus the passband 208 must be set at a higher frequency range than the stopband 204. Since the stopband 204 is tuned within the RF transmission band and the frequency offset (FO) has to be positive, the passband 208 cannot be set within the RF receive band at a lower frequency range than the RF transmission band.

Figure 12A:
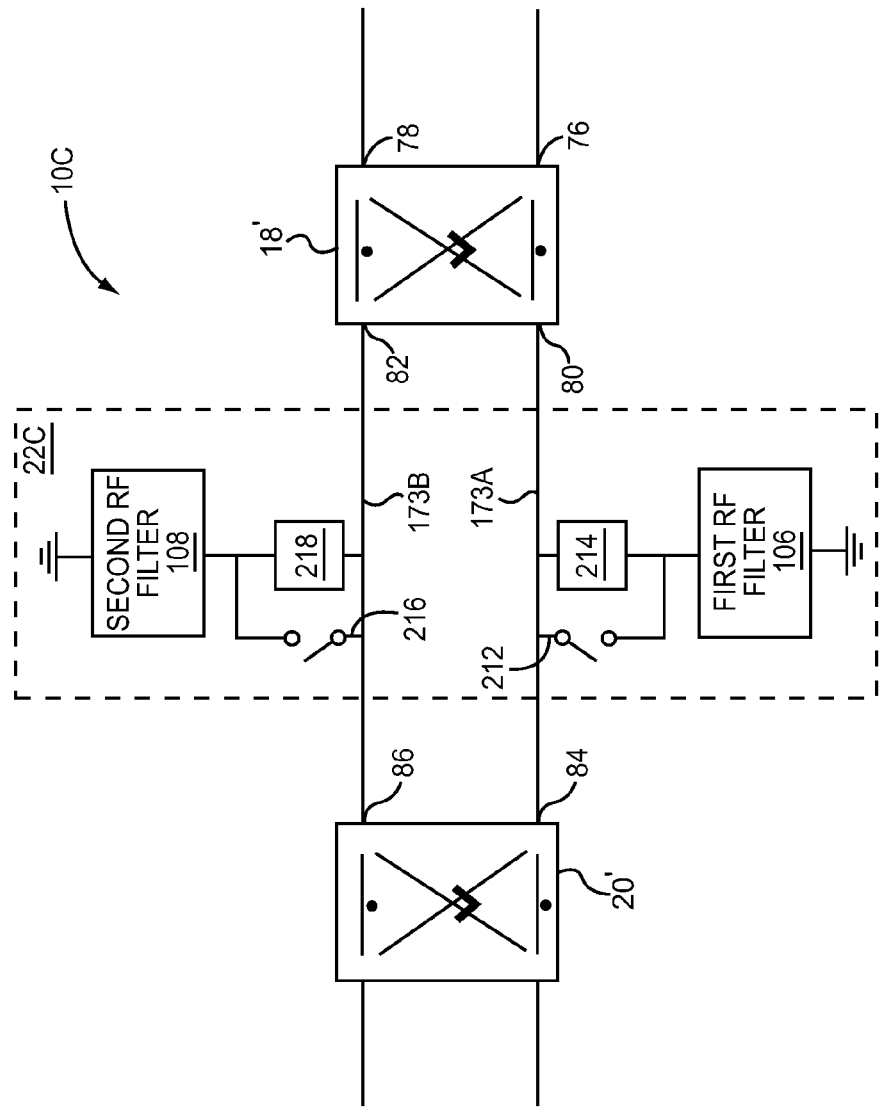
FIG. 12A illustrates one embodiment of a tunable RF duplexer that is tunable to set the stopband within the RF transmission band and to set the passband within the RF receive band whenever the RF receive band is at a higher frequency range than the RF transmission band.
Figure 12B:
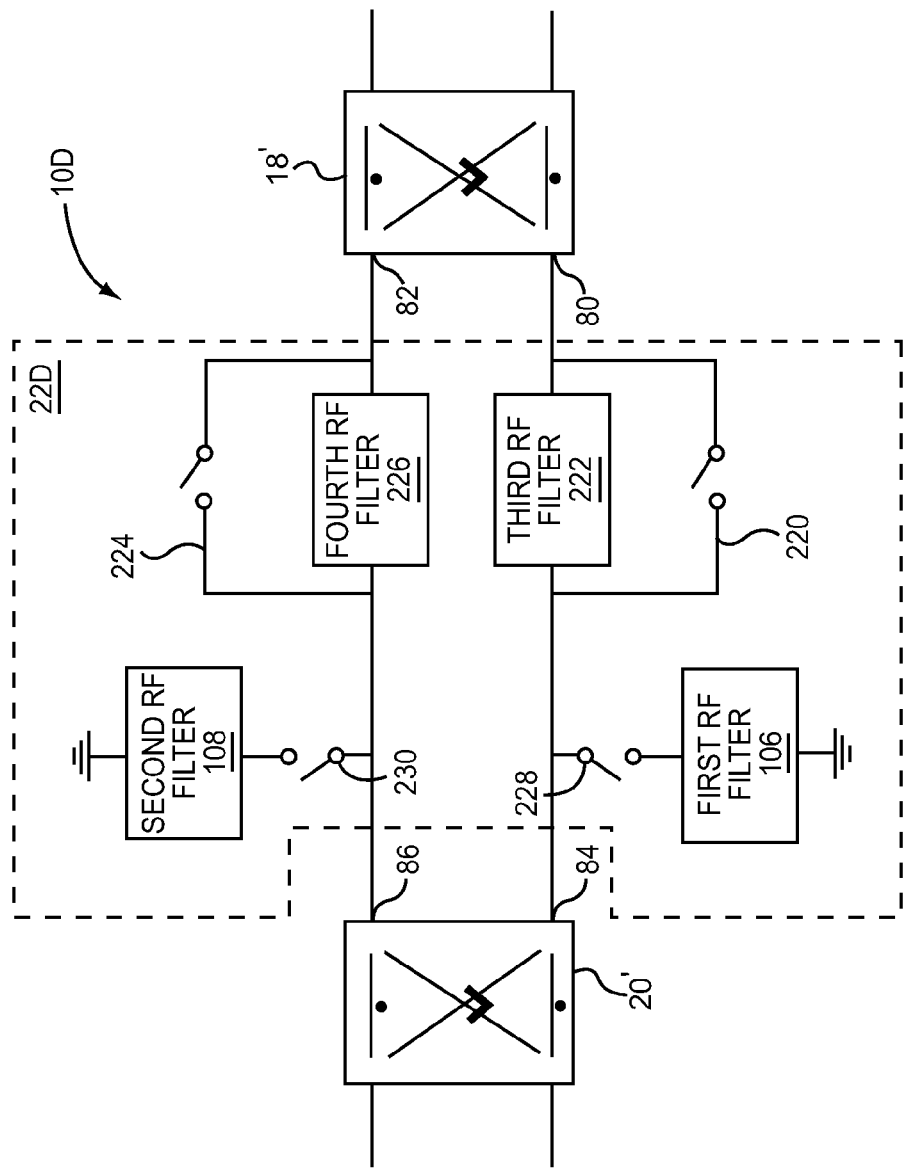
FIG. 12B illustrates one embodiment of a tunable RF duplexer that is tunable to set the stopband within the RF transmission band and to set the passband within the RF receive band whenever the RF receive band is at a higher frequency range than the RF transmission band.
Figure 12C:
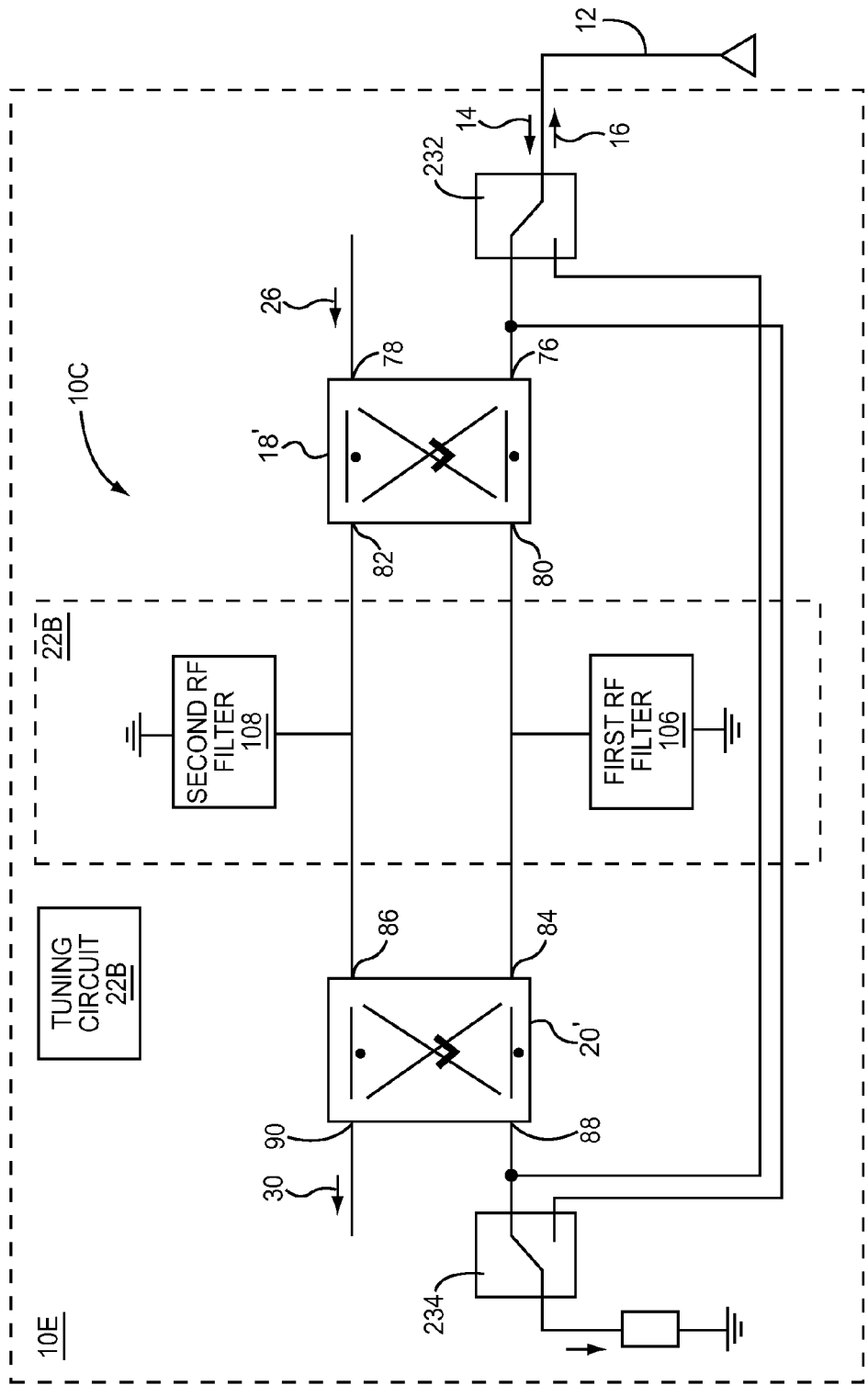
FIG. 12C illustrates one embodiment of a tunable RF duplexer that is tunable to set the stopband within the RF transmission band and to set the passband within the RF receive band whenever the RF receive band is at a higher frequency range than the RF transmission band.

FIGS. 12A-12C illustrate exemplary embodiments of a tunable RF duplexer 10C, a tunable RF duplexer 10D, and a tunable RF duplexer 10E, respectively. Like the tunable RF duplexer 10B shown in FIGS. 6A and 6B, the tunable RF duplexers 10C-10E include the first RF filter 106 and the second RF filter 108. In each of the tunable RF duplexers 10C-10E, the first RF filter 106 may be provided as any of the RF filters 160, 162, 164, 166, 168 described above with regard to FIGS. 10A-10E. Also, in each of the tunable RF duplexers 10C-10E, the second RF filter 108 may be provided as any of the RF filters 160, 162, 164, 166, 168 described above with regard to FIGS. 10A-10E. Each of the tunable RF duplexers 10C, 10D, and 10E is tunable to set the stopband within the RF transmission band and to set the passband within the RF receive band whenever the RF receive band is at a higher frequency range than the RF transmission band. However, each of the tunable RF duplexers 10C, 10D, and 10E can also handle RF communication channels where the RF receive band is at a lower frequency range than the RF transmission band.

Referring now to FIG. 12A, the tunable RF duplexer 10C is like the tunable RF duplexer 10B in FIGS. 6A and 6B, except that the tunable RF duplexer 10C includes an RF filter circuit 22C. The RF filter circuit 22C has the same first RF filter 106 and the same second RF filter 108 as the RF filter circuit 22B in FIGS. 6A and 6B. However, the RF filter circuit 22C further includes a switchable bypass path 212, a quarter-wave phase-shifting transmission line element 214, a switchable bypass path 216, and a quarter-wave phase-shifting transmission line element 218. The quarter-wave phase-shifting transmission line element 214 is connected between a line 173A and the first RF filter 106. The line 173A connects the third port 80 of the first hybrid coupler 18' to the fifth port 84 of the second hybrid coupler 20'. In FIG. 12A, the quarter-wave phase-shifting transmission line element 214 is connected in series with the first RF filter 106. The switchable bypass path 212 is connected from the line 173A to the first RF filter 106. Accordingly, the quarter-wave phase-shifting transmission line element 214 is connected in parallel with respect to the switchable bypass path 212. As such, the switchable bypass path 212 is coupled such that the quarter-wave phase-shifting transmission line element 214 is bypassed when the switchable bypass path 212 is closed, and is not bypassed when the switchable bypass path 212 is open.

Additionally, the quarter-wave phase-shifting transmission line element 218 is connected between a line 173B and the second RF filter 108. The line 173B connects the fourth port 82 of the first hybrid coupler 18' to the sixth port 86 of the second hybrid coupler 20'. In FIG. 12A, the quarter-wave phase-shifting transmission line element 218 is connected in series with the second RF filter 108. The switchable bypass path 216 is connected from the line 173B to the second RF filter 108. Accordingly, the quarter-wave phase-shifting transmission line element 218 is connected in parallel with respect to the switchable bypass path 216. As such, the switchable bypass path 216 is coupled such that the quarter-wave phase-shifting transmission line element 218 is bypassed when the switchable bypass path 216 is closed, and is not bypassed when the switchable bypass path 216 is open.

When the switchable bypass path 212 and the switchable bypass path 216 are both open, the tunable RF duplexer 10C operates in the same manner as the tunable RF duplexer 10B described above with respect to FIGS. 6A and 6B. However, when the switchable bypass path 212 and the switchable bypass path 216 are both closed, impedance transformations of the quarter-wave phase-shifting transmission line element 214 and the quarter-wave phase-shifting transmission line element 218 create frequency responses that can provide duplexing when the RF receive band is at a lower frequency range than the RF transmission band. More specifically, the impedance transformation of the quarter-wave phase-shifting transmission line element 214 presents a frequency response at the line 173A that is a frequency response inversion of the frequency response provided by the first RF filter 106. In addition, the impedance transformation of the quarter-wave phase-shifting transmission line element 214 218 presents a frequency response at the line 173B that is a frequency response inversion of the frequency response provided by the second RF filter 108. When the switchable bypass path 212 is closed, the frequency response of the quarter-wave phase-shifting transmission line element 214 in series with the first RF filter 106 defines a stopband and a passband, where the passband is at a lower frequency range than the stopband. Similarly, when the switchable bypass path 216 is closed, the frequency response of the quarter-wave phase-shifting transmission line element 214 218 in series with the second RF filter 108 defines a stopband and a passband, where the passband is at a lower frequency range than the stopband.

In this embodiment, the series resonant frequency of the first RF filter 106 is configured to set the passband when the switchable bypass path 212 is closed due to the frequency response inversion. The series resonant frequency of the first RF filter 106 may thus be shifted within the RF receive band. Additionally, the series resonant frequency of the second RF filter 108 is configured to set the passband when the switchable bypass path 212 is closed due to the frequency response inversion. The series resonant frequency of the second RF filter 108 may thus be set within the RF receive band. Thus, the series resonant frequency of the second RF filter 108 may be shifted within the RF receive band.

The parallel resonant frequency of the first RF filter 106 sets the stopband of the first RF filter 106 when the switchable bypass path 212 is closed and the parallel resonant frequency of the second RF filter 108 sets the stopband of the second RF filter 108 when the switchable bypass path 216 is closed. Since the parallel resonant frequency is equal to the series resonant frequency plus the frequency offset, the frequency offset of the first RF filter 106 may be adjusted so that the parallel resonant frequency is shifted within the RF transmission band. Also, since the parallel resonant frequency is equal to the series resonant frequency plus the frequency offset, the frequency offset of the second RF filter 108 may be adjusted so that the parallel resonant frequency is shifted within the RF transmission band. In this manner, the stopband of the first RF filter 106 is shifted within the RF transmission band and the stopband of the second RF filter 108 is shifted within the RF transmission band. Accordingly, the impedance transformations of the quarter-wave phase-shifting transmission line elements 214, 218 allow for the tunable RF duplexer 10C to provide duplexing in RF communication bands where the RF receive band is within a lower frequency range with respect to the RF transmission band.

Referring now to FIG. 12B, the tunable RF duplexer 10D is like the tunable RF duplexer 10B in FIGS. 6A and 6B, except that the tunable RF duplexer 10D includes an RF filter circuit 22D. The RF filter circuit 22D has the first RF filter 106 and the second RF filter 108, like the RF filter circuit 22B in FIGS. 6A and 6B. However, the RF filter circuit 22D further includes a switchable bypass path 220, a third RF filter 222 coupled in series between the third port 80 of the first hybrid coupler 18' and the fifth port 84 of the second hybrid coupler 20', a switchable bypass path 224, a fourth RF filter 226 coupled in series between the fourth port 82 of the first hybrid coupler 18' and the sixth port 86 of the second hybrid coupler 20', a switch 228, and a switch 230.

The switchable bypass path 220 is configured such that the third RF filter 222 is bypassed when the switchable bypass path 220 is closed and is configured such that the third RF filter 222 is not bypassed when the switchable bypass path 220 is open. Thus, the third RF filter 222 does not provide filtering when the switchable bypass path 220 is closed, and does provide filtering when the switchable bypass path 220 is open. The switch 228 is connected between the line 173A and the first RF filter 106, and the switch 228 is connected in series with respect to the first RF filter 106. Thus, the first RF filter 106 does not provide filtering when the switch 228 is open and does provide filtering when the switch 228 is closed.

Additionally, the switchable bypass path 224 is configured such that the fourth RF filter 226 is bypassed when the switchable bypass path 224 is closed and is configured such that the fourth RF filter 226 is not bypassed when the switchable bypass path 224 is open. Thus, the fourth RF filter 226 does not provide filtering when the switchable bypass path 224 is closed, and does provide filtering when the switchable bypass path 224 is open. The switch 230 is connected between the line 173B and the second RF filter 108, and the switch 230 is connected in series with respect to the second RF filter 108. Thus, the second RF filter 108 does not provide filtering when the switch 230 is open and does provide filtering when the switch 230 is closed.

When the switchable bypass path 220, the switchable bypass path 224, the switch 228, and the switch 230 are all closed, the tunable RF duplexer 10D operates in the same manner as the tunable RF duplexer 10B described above with respect to FIGS. 6A and 6B. However, when the switchable bypass path 220, the switchable bypass path 224, the switch 228, and the switch 230 are all open, the third RF filter 222 and the fourth RF filter 226 provide filtering, instead of the first RF filter 106 and the second RF filter 108. The third RF filter 222 has a frequency response that defines a passband and a stopband. However, unlike the first RF filter 106 and the second RF filter 108, the passband of the third RF filter 222 is at a lower frequency range than the stopband of the third RF filter 222. Since the RF receive band is at a lower frequency range than the RF transmission band, the third RF filter 222 is tunable so as to set the stopband within the RF transmission band and so as to set the passband within the RF receive band. The fourth RF filter 226 also has a frequency response that defines a passband and a stopband. However, unlike the first RF filter 106 and the second RF filter 108, the passband of the fourth RF filter 226 is at a lower frequency range than the stopband of the fourth RF filter 226. Since the RF receive band is at the lower frequency range in comparison to the RF transmission band, the fourth RF filter 226 is tunable so as to set the stopband within the RF transmission band and so as to set the passband within the RF receive band. When the switchable bypass path 220, the switchable bypass path 224, the switch 228, and the switch 230 are all open, the tunable RF duplexer 10D is allowed to handle RF communication channels with RF receive bands at lower frequency ranges than RF transmission bands.

Referring now to FIG. 12C, the tunable RF duplexer 10E is like the tunable RF duplexer 10B in FIGS. 6A and 6B, except that the tunable RF duplexer 10D includes a single-pole multiple-throw switch 232, and a single-pole multiple-throw switch 234. The single-pole multiple-throw switch 232 is coupled to the antenna 12. The single-pole multiple-throw switch 232 is switchable between a first switch state and a second switch state. In the first switch state, the single-pole multiple-throw switch 232 couples the antenna 12 to the first port 76 of the first hybrid coupler 18' and does not couple the antenna 12 to the seventh port 88 of the second hybrid coupler 20'. On the other hand, in the second switch state, the single-pole multiple-throw switch 232 couples the antenna 12 to the seventh port 88 of the second hybrid coupler 20' and does not couple the antenna 12 to the first port 76 of the first hybrid coupler 18'.

With regard to the single-pole multiple-throw switch 234, the single-pole multiple-throw switch 234 is coupled to the impedance load 100. The single-pole multiple-throw switch 234 is also switchable between the first switch state and the second switch state. In the first switch state, the single-pole multiple-throw switch 234 couples the impedance load 100 to the seventh port 88 of the second hybrid coupler 20' and does not couple the impedance load 100 to the first port 76 of the first hybrid coupler 18'. On the other hand, in the second switch state, the single-pole multiple-throw switch 234 couples the impedance load 100 to the first port 76 of the first hybrid coupler 18' and does not couple the impedance load 100 to the seventh port 88 of the second hybrid coupler 20'.

When the single-pole multiple-throw switch 232 and the single-pole multiple-throw switch 234 are both in the first switch state, the tunable RF duplexer 10E operates in the same manner as the tunable RF duplexer 10B described above with respect to FIGS. 6A and 6B. However, when the single-pole multiple-throw switch 232 and the single-pole multiple-throw switch 234 are both in the second switch state, the transmission signal flow and the receive signal flow are different and allow the tunable RF duplexer 10E to provide duplexing when the RF receive band is in a lower frequency range than the RF transmission band. Since the RF receive band is at the lower frequency range in comparison to the RF transmission band when both the single-pole multiple-throw switches 232, 234 are in the second switch state, the tuning circuit 24B is configured to adjust the series resonant frequency of the first RF filter 106 into the RF receive band and to adjust the frequency offset so that the parallel resonant frequency is within the RF transmission band. Accordingly, the tuning circuit 24B is configured to tune the stopband of the first RF filter 106 within the RF receive band and to tune the passband of the first RF filter 106 within the RF transmission band.

Also, when both the single-pole multiple-throw switches 232, 234 are in the second switch state, the tuning circuit 24B is configured to adjust the series resonant frequency of the second RF filter 108 into the RF receive band and to adjust the frequency offset so that the parallel resonant frequency is within the RF transmission band. Accordingly, the tuning circuit 24B is configured to tune the stopband of the second RF filter 108 within the RF receive band and to tune the passband of the second RF filter 108 within the RF transmission band. As such, the tuning circuit 24B is configured to tune the stopband of the RF filter circuit 22B within the RF receive band and to tune the passband of the RF filter circuit 22B within the RF transmission band when both the single-pole multiple-throw switches 232, 234 are in the second switch state.

Figure 13A:
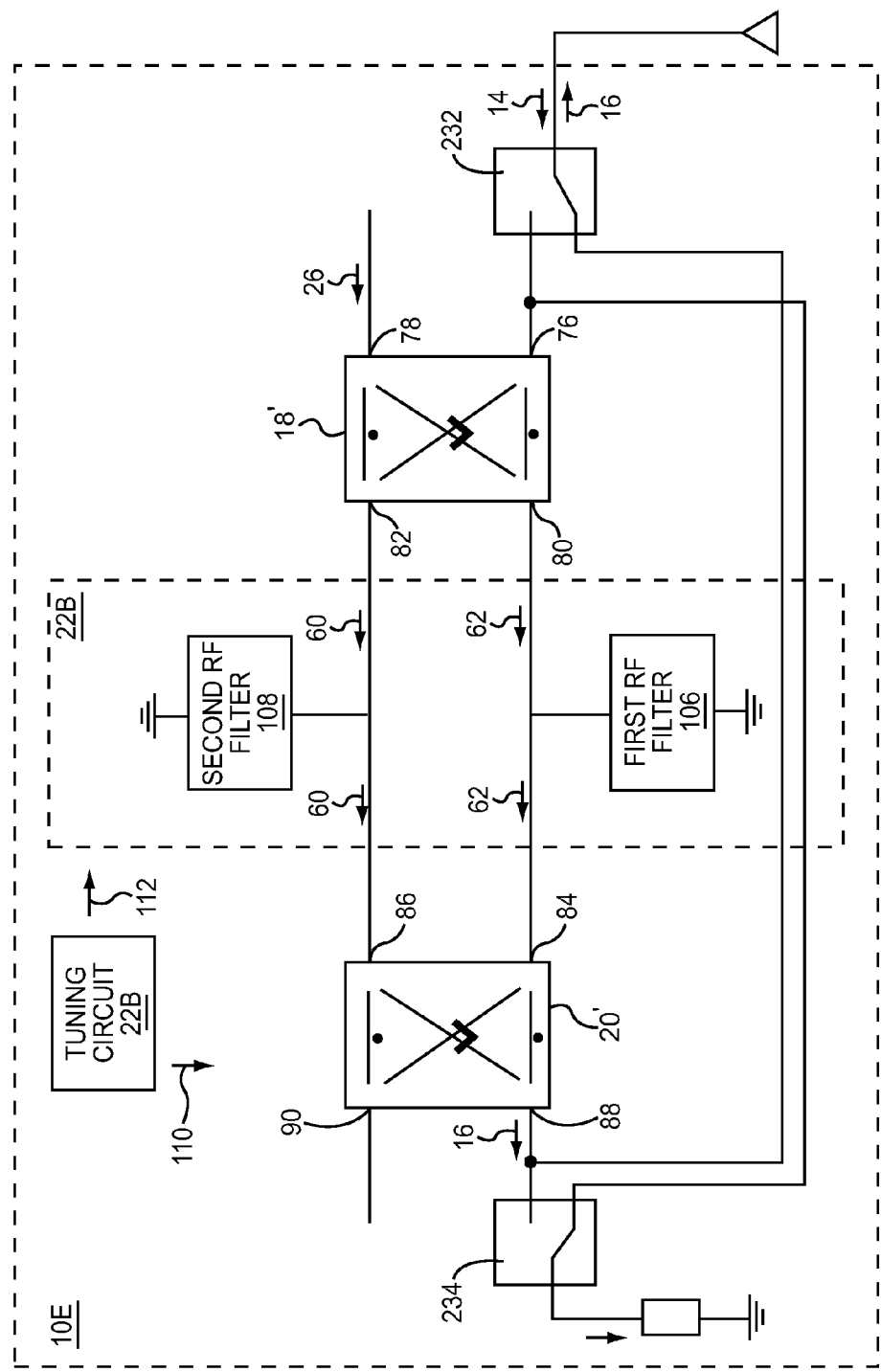
FIG. 13A illustrates a transmission signal flow of the tunable RF duplexer shown in FIG. 12C.

FIG. 13A illustrates the transmission signal flow of the tunable RF duplexer 10E when the single-pole multiple-throw switch 232 and the single-pole multiple-throw switch 234 are both in the second switch state. When both the single-pole multiple-throw switches are in the second switch state, the tuning circuit 24B is configured to tune the frequency response of the RF filter circuit 22B so that the stopband is within the RF receive band and the passband is within the RF transmission band. When the single-pole multiple-throw switch 232 is in the second switch state, the RF transmission output signal 16 is output from the seventh port 88 to the antenna 12. The first hybrid coupler 18' is configured to receive the RF transmission input signal 26 at the second port 78. Since the single-pole multiple-throw switch 234 is in the second switch state, the first port 76 is coupled to the impedance load 100. The first port 76 of the first hybrid coupler 18' thus isolated from the second port 78. This means that the second port 78 is substantially unresponsive to signals incident at the first port 76, and the first port 76 is substantially unresponsive to signals incident at the second port 78 when the single-pole multiple-throw switch 234 is in the second switch state. As a result, the first port 76 is substantially unresponsive to the RF transmission input signal 26 incident at the second port 78.

The first hybrid coupler 18' is operable to split the RF transmission input signal 26 into the first RF QHTS 60 and the second RF QHTS 62. In this manner, the first RF QHTS 60 and the second RF QHTS 62 have approximately the same power ratio with respect to the RF transmission input signal 26, but have a quadrature phase difference of approximately 90 degrees or $\pi/2$ radians. In the embodiment shown in FIG. 13A, the second port 78 is phase-aligned with the fourth port 82, while the third port 80 has a quadrature phase shift with respect to the second port 78. Thus, the first RF QHTS 60 is approximately phase-aligned with the RF transmission input signal 26, but there is a quadrature phase difference between the RF transmission input signal 26 and the second RF QHTS 62.

Note that in alternative embodiments, this may or may not be the case. For example, there may be a phase shift between the second port 78 and the fourth port 82. The phase shift between the second port 78 and the third port 80 may then be equal to this phase shift plus 90 degrees or $\pi/2$ radians. Accordingly, so long as the phase difference between the first RF QHTS 60 and the second RF QHTS 62 is about 90 degrees or $\pi/2$ radians, phase alignment between the fourth port 82 and the second port 78, and between the third port 80 and the second port 78, can vary.

The first RF QHTS 60 is output at the fourth port 82 to the RF filter circuit 22B. Additionally, the second RF QHTS 62 is output at the third port 80 to the RF filter circuit 22B. In this embodiment, the RF filter circuit 22B has the second RF filter 108 and the first RF filter 106. The second RF filter 108 is coupled to the fourth port 82 so as to receive the first RF QHTS 60 from the first hybrid coupler 18'. The first RF filter 106 is coupled to the third port 80 so as to receive the second RF QHTS 62 from the first hybrid coupler 18'. The second RF filter 108 and the first RF filter 106 each have a frequency response. The frequency response of the RF filter circuit 22B is thus determined in accordance with the combined effect of the independent frequency responses provided by the second RF filter 108 and the first RF filter 106. However, in this embodiment, the second RF filter 108 and the first RF filter 106 are identical to one another. Furthermore, each is tuned in accordance with a transmission tuning control output 112 from the tuning circuit 24B. As such, the overall frequency response of the RF filter circuit 22B is the same as the independent frequency responses provided by the second RF filter 108 and the first RF filter 106. Alternatively, in other embodiments, the second RF filter 108 and the first RF filter 106 may be different and/or may be tuned independently by the tuning circuit 24B. As such, the different independent frequency responses from the second RF filter 108 and the first RF filter 106 may combine to determine the overall frequency response of the RF filter circuit 22B.

Referring again to FIG. 13A, the tuning circuit 24B is configured to tune the frequency response of the RF filter circuit 22B so that the passband includes the RF transmission band when both the single-pole multiple-throw switches 232, 234 are in the second switch state. The tuning circuit 24B thus shifts the passband of the RF filter circuit 22B to include the RF transmission band. In this manner, the RF filter circuit 22B is operable to pass the first RF QHTS 60 and the second RF QHTS 62 to the second hybrid coupler 20'. The manner of tuning the frequency response may depend on the topology of the RF filter circuit 22B. For example, the second RF filter 108 and the first RF filter 106 shown in FIG. 13A are each passive filters. Accordingly, one or more reactive impedance components (inductive, capacitive, or both) in each of the first and second RF filters 106, 108 may have a variable reactive impedance level. By varying these variable reactive impedance levels, the poles and zeros of the individual frequency responses provided by each of the first and second RF filters 106, 108 are adjusted. This thereby shifts the passband and/or the stopband of the RF filter circuit 22B.

As mentioned above, the tuning circuit 24B illustrated in FIG. 13A generates the transmission tuning control output 112 and a receive tuning control signal 110. The variable reactive impedance components in both the second RF filter 108 and the first RF filter 106 are set in accordance with a signal level of the transmission tuning control output 112. In this manner, the stopband is shifted to include the RF receive band. Similarly, reactive impedance levels of variable reactive components in the second RF filter 108 and the first RF filter 106 are set in accordance to a signal level of the receive tuning control signal 110. In this manner, the stopband is set to include the RF receive band. In alternative embodiments, the RF filter circuit 22B may include active RF filters, SAW filters, or any other type of RF filter or combination of RF filters that are suitable to provide a desired frequency response. As such, the tuning circuit 24B may employ alternative types of tuning topologies that are different from the particular filtering topology being employed by the RF filter circuit 22B.

By placing the passband in the RF transmission band, the RF filter circuit 22B passes the first RF QHTS 60 and the second RF QHTS 62 to the second hybrid coupler 20'. In this particular embodiment, the second RF filter 108 passes the first RF QHTS 60 to the second hybrid coupler 20', while the first RF filter 106 passes the second RF QHTS 62 to the second hybrid coupler 20'. As mentioned above, the stopband (for example, the notch) is set in the RF receive band.

Referring again to FIG. 13A, the second hybrid coupler 20' receives the first RF QHTS 60 from the second RF filter 108 at the sixth port 86. The second RF QHTS 62 is received by the second hybrid coupler 20' from the first RF filter 106 at the fifth port 84. As discussed above, the first RF QHTS 60 and the second RF QHTS 62 have a quadrature phase difference of about 90 degrees or π/2 radians. Thus, for example, if the first RF QHTS 60 has a phase of zero degrees, the second RF QHTS 62 would have a phase of approximately 90 degrees (or π/2 radians). From the sixth port 86 to the eighth port 90, the second hybrid coupler 20' provides no phase shift. Alternatively, the second hybrid coupler 20' may be configured to provide a phase shift of Δ from the sixth port 86 to the eighth port 90.

The second hybrid coupler 20' shown in FIG. 13A is configured to provide a quadrature phase shift from the fifth port 84 to the eighth port 90. In this example, the phase shift is 90 degrees (or π/2 radians), and thus the second RF QHTS 62 has a phase, as seen from the eighth port 90, of 180 degrees (note that the second RF QHTS 62 was received with a phase of 90 degrees in this example, and thus is seen with a phase of 180 degrees with another phase shift of 90 degrees). Alternatively, the phase shift from the fifth port 84 to the eighth port 90 may be Δ+90 degrees (or π/2 radians). In any case, the phase difference between the first RF QHTS 60 and the second RF QHTS 62 as seen from the eighth port 90 is about 180 degrees (note that the first RF QHTS 60 was received with a phase of zero (0) degrees and thus is seen with a phase of zero (0) degrees at the eighth port 90). Accordingly, the quadrature phase shift at the eighth port 90 from the fifth port 84 results in destructive interference between the first RF QHTS 60 and the second RF QHTS 62 at the eighth port 90. As a result, the first RF QHTS 60 and the second RF QHTS 62 are substantially cancelled at the eighth port 90. In this manner, the eighth port 90 is substantially isolated from transmission signal flow.

The second hybrid coupler 20' is configured to output the RF transmission output signal 16 from the seventh port 88 in response to the first RF QHTS 60 being received from the RF filter circuit 22B at the sixth port 86 and the second RF QHTS 62 being received from the RF filter circuit 22B at the fifth port 84. In this particular embodiment, the second hybrid coupler 20' is configured to pass the second RF QHTS 62 from the fifth port 84 to the seventh port 88. The second hybrid coupler 20' provides no phase shift to the second RF QHTS 62 from the fifth port 84 to the seventh port 88. The second RF QHTS 62 is thus passed with a phase of 90 degrees to the seventh port 88. Alternatively, the second hybrid coupler 20' may provide a phase shift of Δ to the second RF QHTS 62 when passed from the fifth port 84 to the seventh port 88. The second hybrid coupler 20' is configured to pass the first RF QHTS 60 from the sixth port 86 to the seventh port 88. The second hybrid coupler 20' provides a quadrature phase shift to the first RF QHTS 60 at the seventh port 88. In this embodiment, the quadrature phase shift is 90 degrees or π/2 radians. Alternatively, if a phase shift of Δ was provided to the second RF QHTS 62 from the fifth port 84 to the seventh port 88, the quadrature phase shift would be Δ+90 degrees (or π/2 radians).

Accordingly, the first RF QHTS 60 is provided substantially as a duplicate of the second RF QHTS 62 at the seventh port 88. This is a result of the quadrature phase shift provided to the first RF QHTS 60 when passed from the sixth port 86 to the seventh port 88 (now, at the seventh port 88, the first RF QHTS 60 is shifted to have a phase of 90 degrees, just like the second RF QHTS 62). Referring again to the example discussed previously, if the first RF QHTS 60 has a phase of zero (0) degrees at the sixth port 86, then the first RF QHTS 60 has a phase of 90 degrees at the seventh port 88. If the phase of the second RF QHTS 62 at the fifth port 84 is 90 degrees, then the phase of the second RF QHTS 62 is also 90 degrees at the seventh port 88. Accordingly, the first RF QHTS 60 is substantially a duplicate of the second RF QHTS 62 at the seventh port 88 because the first RF QHTS 60 and the second RF QHTS 62 become phase-aligned at the seventh port 88. As a result, the first RF QHTS 60 and the second RF QHTS 62 constructively interfere at the seventh port 88 to output the RF transmission output signal 16 from the seventh port 88. Note that since the first RF QHTS 60 and the second RF QHTS 62 substantially cancel at the eighth port 90 due to destructive interference, very little or no power is transferred from the first RF QHTS 60 and the second RF QHTS 62 to the eighth port 90. Instead most, if not all, of the power in the first RF QHTS 60 and the second RF QHTS 62 is transferred to the seventh port 88 and provided in the RF transmission output signal 16. The antenna 12 is operably associated with the seventh port 88. In this manner, the antenna 12 can radiate the RF transmission output signal 16 to transmit data and information to external communication systems.

The first hybrid coupler 18' is thus configured to output the first RF QHTS 60 from the fourth port 82 and the second RF QHTS 62 from the third port 80 in response to the RF transmission input signal 26 being received at the second port 78. The RF filter circuit 22B, however, provides isolation to the second port 78 from the second hybrid coupler 20' and, as explained in further detail below, from the receive signal flow. Once the first RF QHTS 60 and the second RF QHTS 62 pass through and are filtered by the RF filter circuit 22B, the second hybrid coupler 20' is configured to output the RF transmission output signal 16 from the seventh port 88 in response to the first RF QHTS 60 being received from the RF filter circuit 22B at the sixth port 86 and the second RF QHTS 62 being received from the RF filter circuit 22B at the fifth port 84.

Figure 13B:
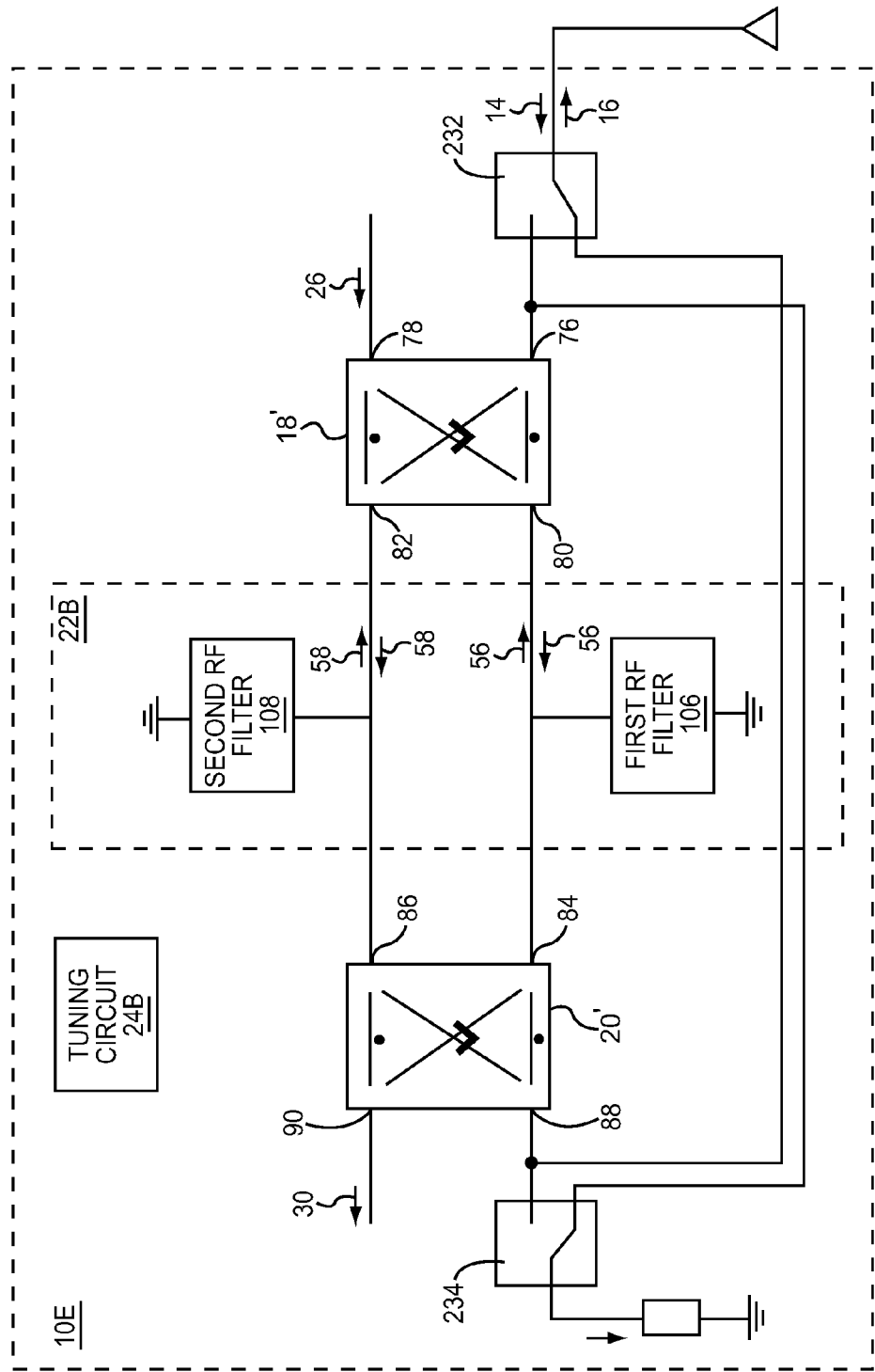
FIG. 13B illustrates a receive signal flow of the tunable RF duplexer shown in FIG. 12C.

FIG. 13B illustrates the tunable RF duplexer 10E along with the receive signal flow. The antenna 12 intercepts the RF receive input signal 14 as electromagnetic waves in free space. These electromagnetic waves result in excitations within the antenna 12, thereby converting the electromagnetic waves into the RF receive input signal 14. The second hybrid coupler 20' is configured to receive the RF receive input signal 14 at the seventh port 88. The RF receive input signal 14 operates in the RF receive band within the same RF communication band as the RF transmission input signal 26 (shown in FIG. 13A). The second hybrid coupler 20' is operable to split the RF receive input signal 14 into the first RF QHRS 56 and the second RF QHRS 58. Since the first RF QHRS 56 and the second RF QHRS 58 are quadrature hybrids, the first RF QHRS 56 and the second RF QHRS 58 are approximately equal in power, but have a quadrature phase difference of 90 degrees or π/2 radians. The second hybrid coupler 20' outputs the first RF QHRS 56 from the fifth port 84 and outputs the second RF QHRS 58 from the sixth port 86 in response to receiving the RF receive input signal 14 at the seventh port 88.

In the embodiment illustrated in FIG. 13B, the first RF QHRS 56 is phase-aligned with the RF receive input signal 14, while the second RF QHRS 58 has a phase difference of about 90 degrees with respect to the RF receive input signal 14. It should be noted that this may or may not be the case. For example, in alternative embodiments, a phase shift of Δ may be provided between the seventh port 88 and the fifth port 84, and thus, a phase shift of Δ+90 degrees (or π/2 radians) would be provided between the seventh port 88 and the sixth port 86.

The RF filter circuit 22B is operable to reflect the first RF QHRS 56 and the second RF QHRS 58. As discussed above, the frequency response of the RF filter circuit 22B defines the stopband and the RF filter circuit 22B is tunable so as to shift the stopband. For example, the stopband may be a notch that is shiftable. The tuning circuit 24B is configured to tune the frequency response of the RF filter circuit 22B so that the signal bandwidth of the first RF QHRS 56 and the signal bandwidth of the second RF QHRS 58 are each within the stopband. For instance, the tuning circuit 24B may be configured to place the notch within the RF receive band so that the notch is centered at the RF receive signal frequency. In this embodiment, the tuning circuit 24B generates the receive tuning control signal 110. Variable reactive impedance components in both the second RF filter 108 and the first RF filter 106 are responsive to the signal level of the receive tuning control signal 110 so as to adjust the variable impedance levels based on the signal level of the receive tuning control signal 110. As a result, the notch defined by the individual frequency response of the second RF filter 108 is shifted to include the signal bandwidth of the second RF QHRS 58. Also, the notch defined by the individual frequency response of the first RF filter 106 is shifted to include the signal bandwidth of the first RF QHRS 56. In other words, the notches defined by the individual frequency responses of the second RF filter 108 and the first RF filter 106 are placed in the RF receive band.

Since the tuning circuit 24B has tuned the frequency response of the RF filter circuit 22B so that the stopband includes the RF receive signal band, the RF filter circuit 22B blocks the first RF QHRS 56 and the second RF QHRS 58. Accordingly, the second port 78 is substantially isolated from the receive signal flow. The RF filter circuit 22B then reflects the first RF QHRS 56 and the second RF QHRS 58 back to the second hybrid coupler 20'. In the embodiment illustrated in FIG. 13B, the second RF filter 108 reflects the second RF QHRS 58 back to the second hybrid coupler 20' at the sixth port 86. The first RF filter 106 reflects the first RF QHRS 56 back to the second hybrid coupler 20' at the fifth port 84.

The second hybrid coupler 20' is configured to combine the first RF QHRS 56 and the second RF QHRS 58 into the RF receive output signal 30. To combine the first RF QHRS 56 and the second RF QHRS 58 into the RF receive output signal 30, the second hybrid coupler 20' is configured to pass the second RF QHRS 58 from the sixth port 86 to the eighth port 90. Additionally, the second hybrid coupler is configured to pass the first RF QHRS 56 from the fifth port 84 to the eighth port 90. However, the second hybrid coupler 20' provides a quadrature phase shift to the first RF QHRS 56 at the eighth port 90. Thus, the first RF QHRS 56 is provided substantially as a duplicate of the second RF QHRS 58 at the eighth port 90. For example, if the phase of the second RF QHRS 58 is 90 degrees at the sixth port 86, the second RF QHRS 58 has a phase of 90 degrees at the eighth port 90. As such, the phase of the first RF QHRS 56 at the fifth port 84 is approximately zero (0) degrees. However, due to the quadrature phase shift between the fifth port 84 and the eighth port 90, the first RF QHRS 56 has a phase of about 90 degrees at the eighth port 90. Accordingly, the first RF QHRS 56 and the second RF QHRS 58 constructively interfere at the eighth port 90 to output the RF receive output signal 30 from the eighth port 90.

Also, note that the second hybrid coupler 20' is configured such that the quadrature phase shift at the seventh port 88 results in destructive interference between the first RF QHRS 56 and the second RF QHRS 58. Referring again to the previous example provided, at the seventh port 88, the first RF QHRS 56 appears to have a phase of zero (0) degrees, but the second RF QHRS 58 appears to have a phase of 180 degrees. As a result, the first RF QHRS 56 and the second RF QHRS 58 are substantially cancelled at the seventh port 88. Consequently, most, if not all, of the power of the first RF QHRS 56 and the second RF QHRS 58 is transferred to the eighth port 90 and provided in the RF receive output signal 30. The second hybrid coupler 20' is thus configured to output the RF receive output signal 30 from the eighth port 90 in response to the first RF QHRS 56 being reflected back by the RF filter circuit 22B to the fifth port 84 and the second RF QHRS 58 being reflected back by the RF filter circuit 22B to the sixth port 86. The configuration of the second hybrid coupler 20' and the RF filter circuit 22B thus provides substantial isolation between the eighth port 90 and the seventh port 88.

As shown in FIGS. 13A and 13B, the seventh port 88 of the second hybrid coupler 20' is configured to simultaneously receive the RF receive input signal 14 and output the RF transmission output signal 16. Accordingly, the RF transmission output signal 16 is output from the seventh port 88 while the RF receive input signal 14 is being received at the seventh port 88. The tunable RF duplexer 10E can provide this functionality because the eighth port 90 is substantially isolated from the second port 78. Accordingly, the transmission signal flow is substantially isolated from the receive signal flow.

Figure 14:
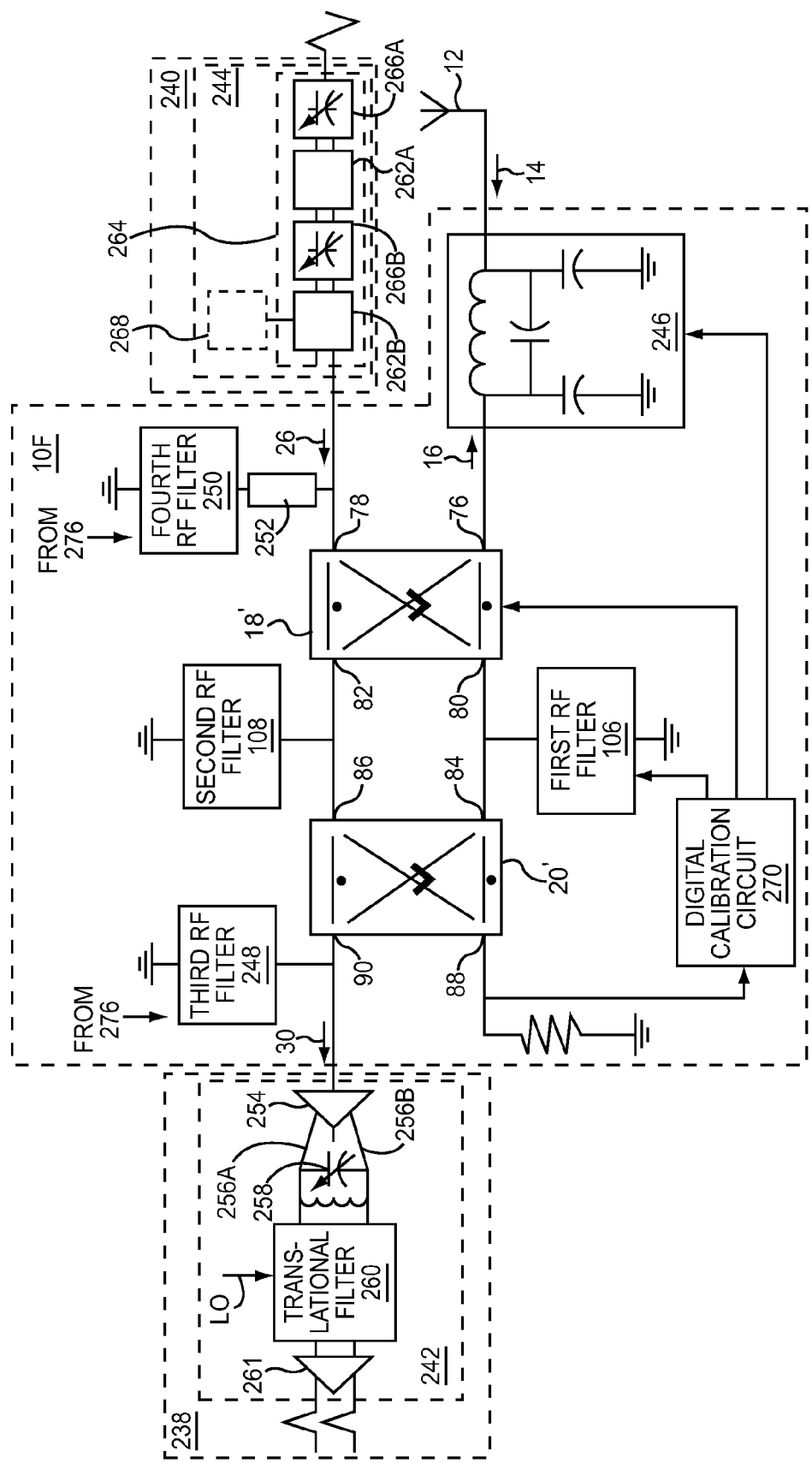
FIG. 14 illustrates one embodiment of an RF transceiver having a distributed duplex filtering topology.

FIG. 14 illustrates one embodiment of a portion of an RF transceiver 236 having a distributed duplex filtering topology. The RF transceiver 236 includes another embodiment of a tunable RF duplexer 10F, an RF receive chain 238, and an RF transmission chain 240. In FIG. 14, the RF receive chain 238 and the RF transmission chain 240 are only partially illustrated for the sake of clarity. In particular, the RF receive chain 238 includes a low noise amplifier (LNA) 242, which is illustrated as being within the RF receive chain 238 in FIG. 14. Furthermore, the RF transmission chain 240 includes an RF power amplifier 244, which is illustrated as being within the RF transmission chain 240 in FIG. 14. The tunable RF duplexer 10F illustrated in FIG. 14 is similar to the tunable RF duplexer 10B described above, except that the tunable RF duplexer 10F of FIG. 14 further includes an antenna impedance tuner 246, a third RF filter 248, a fourth RF filter 250, and a quarter-wave phase-shifting transmission line element 252. The first RF filter 106, the second RF filter 108, the third RF filter 248, and the fourth RF filter 250 may each be identical to one another. The RF transceiver 236 has a distributed duplex filtering topology, which allows each of the first RF filter 106, second the RF filter 108, the third RF filter 248, and the fourth RF filter 250 in the tunable RF duplexer 10F shallow, but low loss.

For example, spurious emissions received at the second port 78, particularly spurious emissions within the RF receive band, can degrade isolation performance. To help reduce spurious emissions, the third RF filter 248 is connected in shunt with respect to the eighth port 90 of the second hybrid coupler 20'. Just like the first RF filter 106 and the second RF filter 108, the third RF filter 248 is tunable and has a frequency response that defines a passband and a stopband. The tuning circuit 24B is configured to tune the third RF filter 248 as a slave of the first RF filter 106 and the second RF filter 108. Accordingly, the tuning circuit 24B is operable to tune the third RF filter 248 such that the stopband is within the RF transmission band and the passband is within the RF receive band. In this manner, spurious emissions within the RF transmission band at the eighth port 90 are filtered from the RF receive output signal 30. The third RF filter 248 is shallow, but is configured to reduce out of band emissions enough to operate the LNA 242 linearly and reduce intermodulation products that can impact receive sensitivity.

The LNA 242 in the RF receive chain 238 includes a linear amplification stage 254. The linear amplification stage 254 is operable to receive the RF receive output signal 30 from the eighth port 90 of the second hybrid coupler 20'. The linear amplification stage 254 is configured to amplify the RF receive output signal 30 in accordance with a linear amplification gain. Note that in FIG. 14, the RF receive output signal 30 is received by the linear amplification stage 254 as a single-ended signal. The linear amplification stage 254 is configured to output the RF receive output signal 30 after amplification as a differential signal from differential lines 256A and 256B.

The LNA 242 further includes a tunable high-selectivity bandpass filter 258. In this embodiment, the tunable high-selectivity bandpass filter 258 has an inductive element with a fix inductance and a variable capacitive element with a variable capacitance. The inductive element and the variable capacitive element are coupled between the differential lines 256A and 256B. The tunable high-selectivity bandpass filter 258 is tunable by adjusting the variable capacitance of the variable capacitive element. As a result, a passband of the tunable high-selectivity bandpass filter 258 may be set within the RF receive band. Despite providing greater selectivity, the tunable high-selectivity bandpass filter 258 has a higher quality factor than the first RF filter 106, the second RF filter 108, the third RF filter 248, and the fourth RF filter 250, and thus may be more lossy. However, the tunable high-selectivity bandpass filter 258 is coupled to the differential lines 256A and 256B from the linear amplification stage 254. Accordingly, the lossiness is not a significant performance issue due to the amplification provided by the linear amplification stage 254.

The LNA 242 also includes a translational filter 260 coupled to receive the RF receive output signal 30 that is output from the tunable high-selectivity bandpass filter 258. The translational filter 260 is configured to translate a frequency response of an intermediate frequency (IF) filter having a passband at an IF into an RF frequency response with a translated passband within the RF receive band. The translational filter 260 is self-aligned by a local oscillator (LO) signal from an RF local oscillator. The translational filter 260 may include an RF passive mixer along with the IF filter. The RF passive mixer translates the frequency response of the IF filter by mixing the RF receive output signal 30 with the LO signal, which determines an RF center frequency. The tunable high-selectivity bandpass filter 258 significantly increases the performance of the translational filter 260. In essence, the RF passive mixer can create intermodulation distortion due to mixing effects with spurious emissions at an LO frequency of the LO signal. Since the RF passive mixer is not infinitely linear, selectivity is added by the tunable high-selectivity bandpass filter 258. In this manner, selectivity does not have to be increased within the tunable RF duplexer 10F, which may result in unacceptable insertion losses. After filtering by the translational filter 260, the RF receive output signal 30 is output by the translational filter 260 to a linear amplification stage 261. The linear amplification stage 261 is configured to amplify the RF receive output signal 30 in accordance with a linear amplification gain, and then output the RF receive output signal 30 to the remainder of the RF receive chain 238 for further processing.

Small reflections at the seventh port 88 due to an impedance mismatch with the impedance load 100 can also result in distortion at both the second port 78 and the eighth port 90. Additionally, small reflections at the first port 76 due to an impedance mismatch with the antenna 12 at the first port 76 can result in distortion at both the second port 78 and the eighth port 90. To help reduce spurious emissions, the fourth RF filter 250 and the quarter-wave phase-shifting transmission line element 252 are connected in shunt with respect to the second port 78 of the first hybrid coupler 18' and in series with respect to one another. Just like the first RF filter 106 and the second RF filter 108, the fourth RF filter 250 is tunable and has a frequency response that defines a passband and a stopband. The tuning circuit 24B is configured to tune the fourth RF filter 250 as a slave of the first RF filter 106 and the second RF filter 108. However, the quarter-wave phase-shifting transmission line element 252 provides a frequency response inversion to a frequency response of the fourth RF filter 250. As such, the stopband of the quarter-wave phase-shifting transmission line element 252 in combination with the fourth RF filter 250 is provided within the RF receive band, while the passband is provided within the RF transmission band. Accordingly, the tuning circuit 24B is operable to tune the fourth RF filter 250 such that the stopband is within the RF receive band and the passband is within the RF transmission band. In this manner, spurious emissions within the RF receive band are filtered by the fourth RF filter 250 prior to the RF transmission input signal 26 being received at the second port 78. Furthermore, spurious emissions that are reflected to the second port 78 are also filtered by the quarter-wave phase-shifting transmission line element 252 in combination with the fourth RF filter 250.

The RF transmission input signal 26 is received at the second port 78 from the RF power amplifier 244, which is in the RF transmission chain 240. The RF power amplifier 244 includes a plurality of RF amplifier stages (referred to generically as element 262, and specifically as elements 262A-262B) coupled in cascode. Accordingly, each of the plurality of RF amplifier stages 262 is operable to provide amplification to the RF transmission input signal 26. In other words, by being coupled in cascode, the RF amplifier stages 262 provide amplification to the RF transmission input signal 26 in sequence.

The RF power amplifier 244 shown in FIG. 14 has a power amplification circuit 264. The power amplification circuit 264 has an initial RF amplifier stage 262A and a final RF amplifier stage 262B. However, other embodiments of the RF power amplifier 244 may include any number of RF amplifier stages 262 greater than or equal to two (2). The initial RF amplifier stage 262A is the RF amplifier stage 262 at a beginning of the sequence. The final RF amplifier stage 262B is the RF amplifier stage 262 at an end of the sequence. Since at least two RF amplifier stages 262 are needed to provide cascoded RF amplifier stages 262, the RF power amplifier 244 includes at least the initial RF amplifier stage 262A and the final RF amplifier stage 262B. However, the number of RF amplifier stages 262 may be any integer greater than or equal to two (2). As such, there may be any number of intermediate RF amplifier stages, coupled in cascode between the initial RF amplifier stage 262A and the final RF amplifier stage 262B. Since the RF amplifier stages 262 are coupled in cascode, the RF amplifier stages 262 provide amplification to the RF transmission input signal 26 in sequence. Accordingly, the initial RF amplifier stage 262 initially provides amplification to the RF transmission input signal 26 in accordance with an amplifier gain $G_{initial}$. Once the RF transmission input signal 26 is amplified by the initial RF amplifier stage 262A in accordance with the amplifier gain $G_{initial}$, the final RF amplifier stage 262B amplifies the RF transmission input signal 26 in accordance to an amplifier gain $G_{final}$. As such, an aggregated amplifier gain of the plurality of RF amplifier stages 262 as a whole may be described as $G_{initial}*G_{final}$.

The RF power amplifier 244 shown in FIG. 14 is operable to receive the RF transmission input signal 26 from upstream RF circuitry, prior to amplification. As shown in FIG. 14, an RF filter 266A is coupled to receive the RF transmission input signal 26. The RF filter 266A has a frequency response that defines a stopband, such as a notch. The RF filter 266A is tunable so as to provide the stopband within the RF receive band. In this manner, spurious emissions within the RF receive band from the upstream RF circuitry are reduced. Once the RF filter 266A has filtered the RF transmission input signal 26, the initial RF amplifier stage 262A receives the RF transmission input signal 26 and provides amplification to the RF transmission input signal 26 in accordance with the amplifier gain $G_{initial}$.

The RF power amplifier 244 also includes an RF filter 266B coupled in series between the initial RF amplifier stage 262A and the final RF amplifier stage 262B. In other embodiments where the number of RF amplifier stages is greater than two (2), there may be other RF filters, like the RF filter 266B, coupled in series between the RF amplifier stages. The RF filter 266B has a frequency response that defines a stopband, such as a notch. The RF filter 266B is tunable so as to provide the stopband within the RF receive band. In this manner, spurious emissions within the RF receive band from the initial RF amplifier stage 262A are reduced. Thus, by distributing filtering of spurious emissions within the RF receive band throughout the power amplification circuit 264, the tunable RF duplexer 10F can have less selectivity and lower insertion losses. This is important, since the power amplification circuit 264 may be connected to an RF power converter 268. The RF power converter 268 is configured to generate a supply voltage from a power source voltage in order to power amplification by one or more of the RF amplifier stages 262. The RF power converter 268 may include a switching circuit in order to generate a pulsed output voltage from the power source voltage and an RF filter that converts the power source voltage into the supply voltage. While such systems are power efficient, switching circuits can generate high levels of spurious emissions. Distributing duplex filtering throughout the power amplification circuit 264 allows the tunable RF duplexer 10F to have lower insertion losses while maintaining adequate isolation between the receive and transmission signal flows.

As mentioned above, small reflections at the first port 76 due to an impedance mismatch with the antenna 12 at the first port 76 can result in distortion at both the second port 78 and the eighth port 90. Thus, the antenna impedance tuner 246 is coupled between the antenna 12 and the first port 76. Since the RF transmission output signal 16 is in the RF transmission band, the impedance of the antenna 12 may result in a portion of the RF transmission output signal 16 being reflected back to the first port 76. This not only would degrade the RF transmission output signal 16, but would also degrade the isolation between the receive signal flow and the eighth port 90. The antenna impedance tuner 246 is tunable so as to reduce reflections from the antenna 12 to the first port 76. More specifically, an impedance of the antenna 12 may be tuned so as to provide impedance matching between the first port 76 and the antenna 12.

As shown in FIG. 14, a digital calibration circuit 270 is coupled to the tunable RF duplexer 10F. The digital calibration circuit 270 is configured to calibrate the tunable RF duplexer 10F. With regard to the first hybrid coupler 18' and the second hybrid coupler 20', the digital calibration circuit 270 performs a hybrid calibration routine for each of the RF communication bands. During the hybrid calibration routine, the first RF filter 106, the second RF filter 108, the third RF filter 248, and the fourth RF filter 250 are set in a neutral state so as to be fully transparent within both the RF transmission band and the RF receive band. An RF tuning signal operating within the RF transmission band is then injected into the second port 78. Power for the RF tuning signal is set to be at least 20 dB less than maximum power so that a detector in the digital calibration circuit 270 is not burned. The power at the seventh port 88 is then measured and the digital calibration circuit runs a gradient search for maximum power at the seventh port 88 by tuning the first hybrid coupler 18' and the second hybrid coupler 20'. Calibration data for the transmission frequency band is then stored and a correction for the receive frequency band is calculated for both the first hybrid coupler 18' and the second hybrid coupler 20'. In receive noise critical scenarios, the first hybrid coupler 18' and the second hybrid coupler 20' are tuned in accordance with the correction. In case of transmission insertion loss or transmission leakage issues, the first hybrid coupler 18' and the second hybrid coupler 20' use the calibration for the RF transmission band.

Once the hybrid calibration routine is completed, a filter calibration routine is performed. Initially, the variable capacitance of the variable capacitive element 176 (see FIGS. 10A-10E) is adjusted until minimum power is detected at the seventh port 88. Alternatively the forward power between the first port 76 and the antenna impedance tuner 246 or between the antenna impedance tuner 246 and the antenna 12 is used to determine a notch frequency for the RF transmission band. In that case, the goal is max power at the forward coupled output. Once the appropriate values are determined, the optimal tuning setting is copied to the RF receive band (λ/4 inverted RF transmission band notch) at the transmission side and the RF transmission band notch at the receive band side in front of the LNA 242.

Those skilled in the art will recognize improvements and modifications to the embodiments of the present disclosure. All such improvements and modifications are considered within the scope of the concepts disclosed herein and the claims that follow.

What is claimed is:
1. A tunable radio frequency (RF) duplexer comprising:
a first hybrid coupler operable to:
split an RF transmission input signal into a first RF quadrature hybrid transmission signal (QHTS) and a second RF QHTS;
split an RF receive input signal into a first RF quadrature hybrid receive signal (QHRS) and a second RF QHRS; and
combine the first RF QHTS and the second RF QHTS into an RF transmission output signal when reflected back to the first hybrid coupler;
a second hybrid coupler configured to combine the first RF QHRS and the second RF QHRS into an RF receive output signal; and
an RF filter circuit that is tunable so as to pass the first RF QHRS and the second RF QHRS to the second hybrid coupler and to reflect the first RF QHTS and the second RF QHTS back to the first hybrid coupler.
2. The tunable RF duplexer of claim 1 further comprising a tuning circuit wherein:
the RF filter circuit has a frequency response that defines a passband;
the RF filter circuit is tunable to shift the passband; and
the tuning circuit is configured to tune the frequency response so that a signal bandwidth of the first RF QHRS and a signal bandwidth of the second RF QHRS are each within the passband.
3. The tunable RF duplexer of claim 1 further comprising a tuning circuit wherein:
the RF filter circuit has a frequency response that defines a stopband;
the RF filter circuit is tunable to shift the stopband; and
the tuning circuit is configured to tune the frequency response so that a signal bandwidth of the first RF QHTS and a signal bandwidth of the second RF QHTS are each within the stopband.
4. The tunable RF duplexer of claim 1 further comprising a tuning circuit wherein:
the RF filter circuit has a frequency response that defines a passband and a stopband;
the RF filter circuit is tunable to shift the passband and shift the stopband; and
the tuning circuit is configured to tune the frequency response so as to shift the passband so that a signal bandwidth of the first RF QHRS and a signal bandwidth of the second RF QHRS are each within the passband, and to shift the stopband so that a signal bandwidth of the first RF QHTS and a signal bandwidth of the second RF QHTS are each within the stopband.
5. The tunable RF duplexer of claim 4 wherein the frequency response defines the stopband as a notch.
6. The tunable RF duplexer of claim 4 further comprising a second RF filter circuit having a second frequency response that defines a second stopband, wherein:
the second RF filter circuit is operably associated with the second hybrid coupler so as to receive the RF receive output signal;
the second RF filter circuit is tunable to shift the second stopband; and
the tuning circuit is configured to tune the second frequency response so that a signal bandwidth of the RF transmission input signal is within the second stopband.
7. The tunable RF duplexer of claim 1 further comprising a tuning circuit wherein:
the first hybrid coupler is configured to receive the RF transmission input signal operating in an RF communication band, whereby the first RF QHTS, the second RF QHTS, and the RF transmission output signal each operate in the RF communication band;
the first hybrid coupler is configured to receive the RF receive input signal operating within the RF communication band, whereby the first RF QHRS, the second RF QHRS, and the RF receive output signal each operate in the RF communication band;
the RF filter circuit has a frequency response that defines a passband and a stopband, wherein the RF filter circuit is tunable so as to shift the passband and to shift the stopband; and
the tuning circuit is configured to tune the frequency response so as to shift the passband within the RF communication band such that the first RF QHRS and the second RF QHRS operating in the RF communication band are passed to the second hybrid coupler, and to shift the stopband in the RF communication band such that the first RF QHTS and the second RF QHTS operating in the RF communication band are reflected back to the first hybrid coupler.
8. The tunable RF duplexer of claim 7 wherein:
the RF communication band has an RF transmission band and an RF receive band;

the RF transmission input signal, the first RF QHTS, the second RF QHTS, and the RF transmission output signal each operate in the RF transmission band;

the RF receive input signal, the first RF QHRS, the second RF QHRS, and the RF receive output signal each operate in the RF receive band; and the tuning circuit is configured to shift the passband into the RF receive band and to shift the stopband into the RF transmission band.

9. The tunable RF duplexer of claim 7 wherein:

the RF filter circuit is tunable so that the RF communication band can be switched to be any one of a plurality of different RF communication bands; and the tuning circuit is operable to tune the frequency response of the RF filter circuit such that the passband is shifted to pass the first RF QHRS and the second RF QHRS in response to the RF communication band being switched to a different one of the plurality of different RF communication bands, and the stopband is shifted to reflect the first RF QHTS and the second RF QHTS in response to the RF communication band being switched to the different one of the plurality of different RF communication bands.

10. The tunable RF duplexer of claim 1 wherein the RF filter circuit comprises a first RF filter and a second RF filter and wherein:

the first RF filter is connected between the first hybrid coupler and the second hybrid coupler and is operable to reflect the first RF QHTS back to the first hybrid coupler and to pass the second RF QHRS to the second hybrid coupler; and the second RF filter is connected between the first hybrid coupler and the second hybrid coupler and is operable to reflect the second RF QHTS back to the first hybrid coupler and pass the first RF QHRS to the second hybrid coupler.

11. The tunable RF duplexer of claim 10 wherein the first RF filter comprises:

a series LC resonator coupled in shunt between the first hybrid coupler and the second hybrid coupler, the series LC resonator having a series resonant frequency; and a variable capacitive element having a variable capacitance, the variable capacitive element being coupled in shunt between the first hybrid coupler and the second hybrid coupler such that the series LC resonator and the variable capacitive element have a parallel resonant frequency.

12. The tunable RF duplexer of claim 11 wherein the second RF filter is identical to the first RF filter.

13. The tunable RF duplexer of claim 10 wherein the first RF filter comprises a plurality of Surface Acoustic Wave (SAW) resonators, wherein one of the SAW resonators is configured to reflect the second RF QHTS back to the first hybrid coupler and to pass the first RF QHRS to the second hybrid coupler.

14. The tunable RF duplexer of claim 13 wherein the second RF filter comprises a second plurality of SAW resonators, wherein a second one of the SAW resonators is configured to reflect the second RF QHTS back to the first hybrid coupler and to pass the first RF QHRS to the second hybrid coupler.

15. The tunable RF duplexer of claim 10 further comprising:

a quarter-wave phase-shifting transmission line element coupled in series with the first RF filter; and a switchable bypass path coupled such that the quarter-wave phase-shifting transmission line element is bypassed when the switchable bypass path is closed and is not bypassed when the switchable bypass path is open.

16. The tunable RF duplexer of claim 15 further comprising:

a second quarter-wave phase-shifting transmission line element coupled in series with the second RF filter; and a second switchable bypass path coupled such that the second quarter-wave phase-shifting transmission line element is bypassed when the second switchable bypass path is closed and is not bypassed when the second switchable bypass path is open.

17. The tunable RF duplexer of claim 10 further comprising:

a third RF filter coupled in series between the first hybrid coupler and the second hybrid coupler;

a switchable bypass path coupled such that the third RF filter is bypassed when the switchable bypass path is closed and is not bypassed when the switchable bypass path is open; and a switch connected in series with the first RF filter.

18. The tunable RF duplexer of claim 17 further comprising:

a fourth RF filter coupled in series between the first hybrid coupler and the second hybrid coupler;

a second switchable bypass path coupled such that the fourth RF filter is bypassed when the second switchable bypass path is closed and is not bypassed when the second switchable bypass path is open; and a second switch connected in series with the second RF filter.

19. The tunable RF duplexer of claim 1 wherein the first hybrid coupler has a port, the port being configured to simultaneously output the RF transmission input signal and input the RF receive output signal.

20. The tunable RF duplexer of claim 1 wherein:

the first hybrid coupler comprises a first port configured to input the RF receive input signal and output the RF transmission output signal, a second port, a third port, and a fourth port, wherein the first hybrid coupler is configured to:

output the first RF QHRS from the third port in response to the RF receive input signal being received at the first port; and output the second RF QHRS from the fourth port in response to the RF receive input signal being received at the first port; and the second hybrid coupler comprises a fifth port, a sixth port, a seventh port, and an eighth port, wherein the second hybrid coupler is configured to:

input the first RF QHRS at the fifth port;

input the second RF QHRS at the sixth port;

output the RF receive output signal from the eighth port; and substantially isolate the eighth port from the seventh port.

21. The tunable RF duplexer of claim 20 further comprising:

an antenna; and an antenna impedance tuner coupled between the antenna and the first port, wherein the antenna impedance tuner is tunable so as to reduce reflections from the antenna to the first port.

22. The tunable RF duplexer of claim 20 wherein the RF filter circuit comprises:

a first RF filter connected in shunt between the third port and the fifth port; and a second RF filter connected in shunt between the fourth port and the sixth port.

23. A method of providing radio frequency (RF) duplexing comprising:
- splitting an RF receive input signal into a first RF quadrature hybrid receive signal (QHRS) and a second RF QHRS;
- splitting an RF transmission input signal into a first RF quadrature hybrid transmission signal (QHTS) and a second RF QHTS;
- filtering the first RF QHRS and the second RF QHRS to pass the first RF QHRS and the second RF QHRS within a passband;
- filtering the first RF QHTS and the second RF QHTS to reflect the first RF QHTS and the second RF QHRS within a stopband;
- combining the first RF QHRS and the second RF QHRS within the passband into an RF receive output signal; and
- combining the first RF QHTS and the second RF QHTS within the stopband into an RF transmission output signal.

24. The method of claim 23 further comprising:
receiving the RF transmission input signal at a port; and
while the RF transmission input signal is being received at the port, outputting the RF receive output signal from the port.

25. The method of claim 23 further comprising:
tuning the passband to pass the first RF QHRS and the second RF QHRS within the passband; and
tuning the stopband to reflect the first RF QHTS and the second RF QHTS within the stopband.

* * * * *